United States Patent
Kimura et al.

(10) Patent No.: US 8,253,446 B2
(45) Date of Patent: Aug. 28, 2012

(54) SEMICONDUCTOR DEVICE AND ELECTRONIC APPARATUS USING THE SAME

(75) Inventors: Hajime Kimura, Atsugi (JP); Yasuko Watanabe, Atsugi (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

(21) Appl. No.: 13/369,637

(22) Filed: Feb. 9, 2012

(65) Prior Publication Data
US 2012/0139440 A1    Jun. 7, 2012

Related U.S. Application Data

(60) Continuation of application No. 12/722,786, filed on Mar. 12, 2010, now Pat. No. 8,149,043, which is a continuation of application No. 11/513,060, filed on Aug. 31, 2006, now Pat. No. 7,710,166, and a division of application No. 10/345,178, filed on Jan. 16, 2003, now Pat. No. 7,123,250.

(30) Foreign Application Priority Data

Jan. 17, 2002  (JP) .................................. 2002-009221
Oct. 21, 2002  (JP) .................................. 2002-305552

(51) Int. Cl.
*H03B 1/00*    (2006.01)
(52) U.S. Cl. ........................... 327/108; 327/112; 327/408
(58) Field of Classification Search .................. 327/108, 327/109, 112, 170, 389, 427; 326/23, 27, 326/82, 83
See application file for complete search history.

(56) References Cited

U.S. PATENT DOCUMENTS

| | | |
|---|---|---|
| 3,836,862 A | 9/1974 | Seely et al. |
| 4,577,162 A | 3/1986 | Peterson |
| 4,626,794 A | 12/1986 | Sugimoto |
| 4,628,274 A | 12/1986 | Vittoz et al. |
| 4,694,341 A | 9/1987 | Soneda et al. |
| 4,877,979 A | 10/1989 | Sempel |
| 5,099,205 A | 3/1992 | Lewyn |
| 5,280,511 A | 1/1994 | Fujii et al. |
| 5,400,273 A | 3/1995 | Hughes et al. |

(Continued)

FOREIGN PATENT DOCUMENTS

EP      0 190 973      8/1986

(Continued)

OTHER PUBLICATIONS

Search Report, Intellectual Property Office of Singapore, Application No. 200207890-5 dated Aug. 23, 2004.

(Continued)

*Primary Examiner* — Long Nguyen
(74) *Attorney, Agent, or Firm* — Eric J. Robinson; Robinson Intellectual Property Law Office, P.C.

(57) ABSTRACT

The transistor suffers the variation caused in threshold voltage or mobility due to gathering of the factors of the variation in gate insulator film resulting from a difference in manufacture process or substrate used and of the variation in channel-region crystal state. The present invention provides an electric circuit having an arrangement such that both electrodes of a capacitance element can hold a gate-to-source voltage of a particular transistor. The invention provides an electric circuit having a function capable of setting a potential difference at between the both electrodes of the capacitance element by the use of a constant-current source.

20 Claims, 42 Drawing Sheets

U.S. PATENT DOCUMENTS

| | | | |
|---|---|---|---|
| 5,689,205 A | 11/1997 | Hughes et al. | |
| 5,783,952 A | 7/1998 | Kazazian | |
| 6,114,872 A | 9/2000 | Takahashi | |
| 6,127,857 A | 10/2000 | Ogawa et al. | |
| 6,127,997 A | 10/2000 | Tsuchi | |
| 6,181,314 B1 | 1/2001 | Nakajima et al. | |
| 6,222,357 B1 | 4/2001 | Sakuragi | |
| 6,229,506 B1 | 5/2001 | Dawson et al. | |
| 6,313,819 B1 | 11/2001 | Maekawa et al. | |
| 6,445,371 B1 | 9/2002 | Miyazawa et al. | |
| 6,577,302 B2 | 6/2003 | Hunter et al. | |
| 6,707,336 B2 | 3/2004 | Reber | |
| 6,784,865 B2 | 8/2004 | Akimoto et al. | |
| 6,801,186 B2 | 10/2004 | Han et al. | |
| 6,862,041 B2 | 3/2005 | Haraguchi | |
| 6,876,235 B2 * | 4/2005 | Li et al. | 327/112 |
| 6,891,356 B2 | 5/2005 | Kimura et al. | |
| 6,927,618 B2 * | 8/2005 | Kimura et al. | 327/427 |
| 6,958,651 B2 | 10/2005 | Kimura | |
| 7,123,250 B2 * | 10/2006 | Kimura et al. | 345/211 |
| 7,248,031 B2 | 7/2007 | Kimura et al. | |
| 7,348,825 B2 * | 3/2008 | Kimura et al. | 327/427 |
| 7,456,625 B2 | 11/2008 | Kimura et al. | |
| 7,710,166 B2 * | 5/2010 | Kimura et al. | 327/108 |
| 8,149,043 B2 * | 4/2012 | Kimura et al. | 327/427 |
| 2006/0238251 A1 | 10/2006 | Kimura | |
| 2010/0321088 A1 | 12/2010 | Kimura et al. | |

FOREIGN PATENT DOCUMENTS

| | | |
|---|---|---|
| EP | 0 274 784 | 7/1988 |
| EP | 0 608 936 | 8/1994 |
| EP | 0 899 712 | 3/1999 |
| EP | 0 899 714 | 3/1999 |
| JP | 61-131171 | 8/1986 |
| JP | 62-122488 | 8/1987 |
| JP | 62-151223 | 9/1987 |
| JP | 03-139908 | 6/1991 |
| JP | 06-236697 | 8/1994 |
| JP | 09-330060 A | 12/1997 |
| JP | 10-065461 A | 3/1998 |
| JP | 10-289993 | 10/1998 |
| JP | 11-027065 A | 1/1999 |
| JP | 11-073165 | 3/1999 |
| JP | 11-330874 | 11/1999 |
| JP | 2000-013153 | 1/2000 |
| JP | 2000-081920 | 3/2000 |
| JP | 2000-194327 | 7/2000 |
| JP | 2001-083924 A | 3/2001 |
| JP | 2001-085989 | 3/2001 |
| KR | 2000-0036128 | 6/2000 |
| WO | 98/11554 | 3/1998 |

OTHER PUBLICATIONS

Chung et al., *Poly-Si TFT Push-Pull Analogue Buffer for Integrated Data Drivers of Poly-Si TFT-LCDs*, Electronics Letters, vol. 37, No. 17, Aug. 16, 2001, 2 pages.

European Search Report dated Mar. 28, 2006 for Application No. 03000098.8.

Sekine et al., "Amplifier Compensation Method for a Poly-Si TFT LCLV with an Integrated Data-Driver," Conference Record of the 1997 IDRC (International Display Research Conference), Sep. 15, 1997, pp. 45-48.

Kida et al., "LN-4: A 3.8 inch Half-VGA Transflective Color TFT-LCD with Completely Integrated 6-bit RGB Parallel Interface Drivers," Eurodisplay 2002, pp. 831-834.

Goh et al., "A New Poly-Si TFT Pixel Circuit Scheme for an Active-Matrix Organic Light Emitting Diode Displays," Asia Display / IDW '01, 2001, pp. 319-322.

* cited by examiner

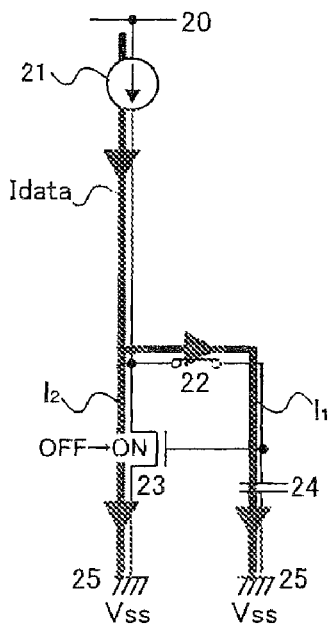 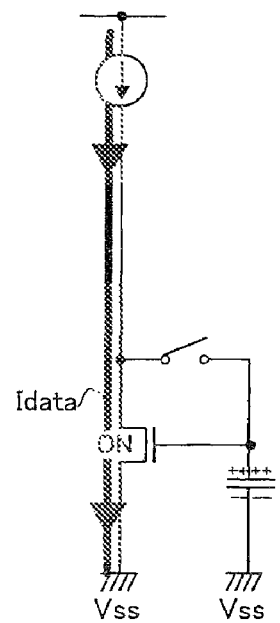
Fig. 3A       Fig. 3B
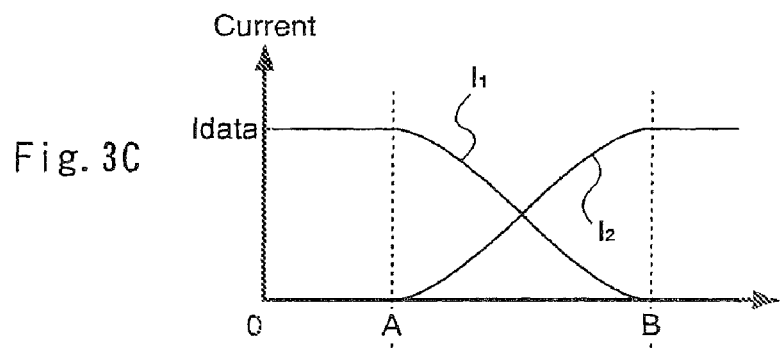
Fig. 3C
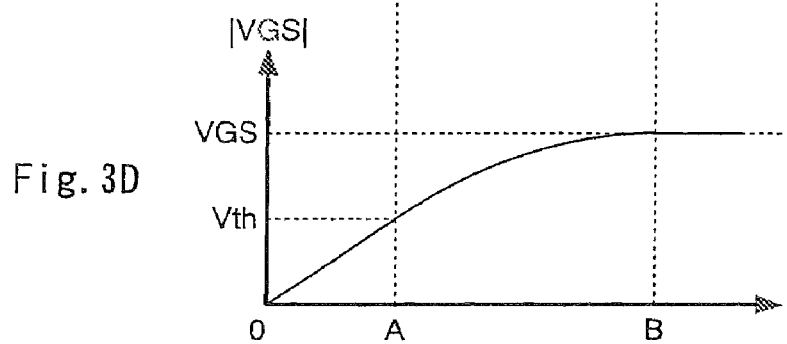
Fig. 3D

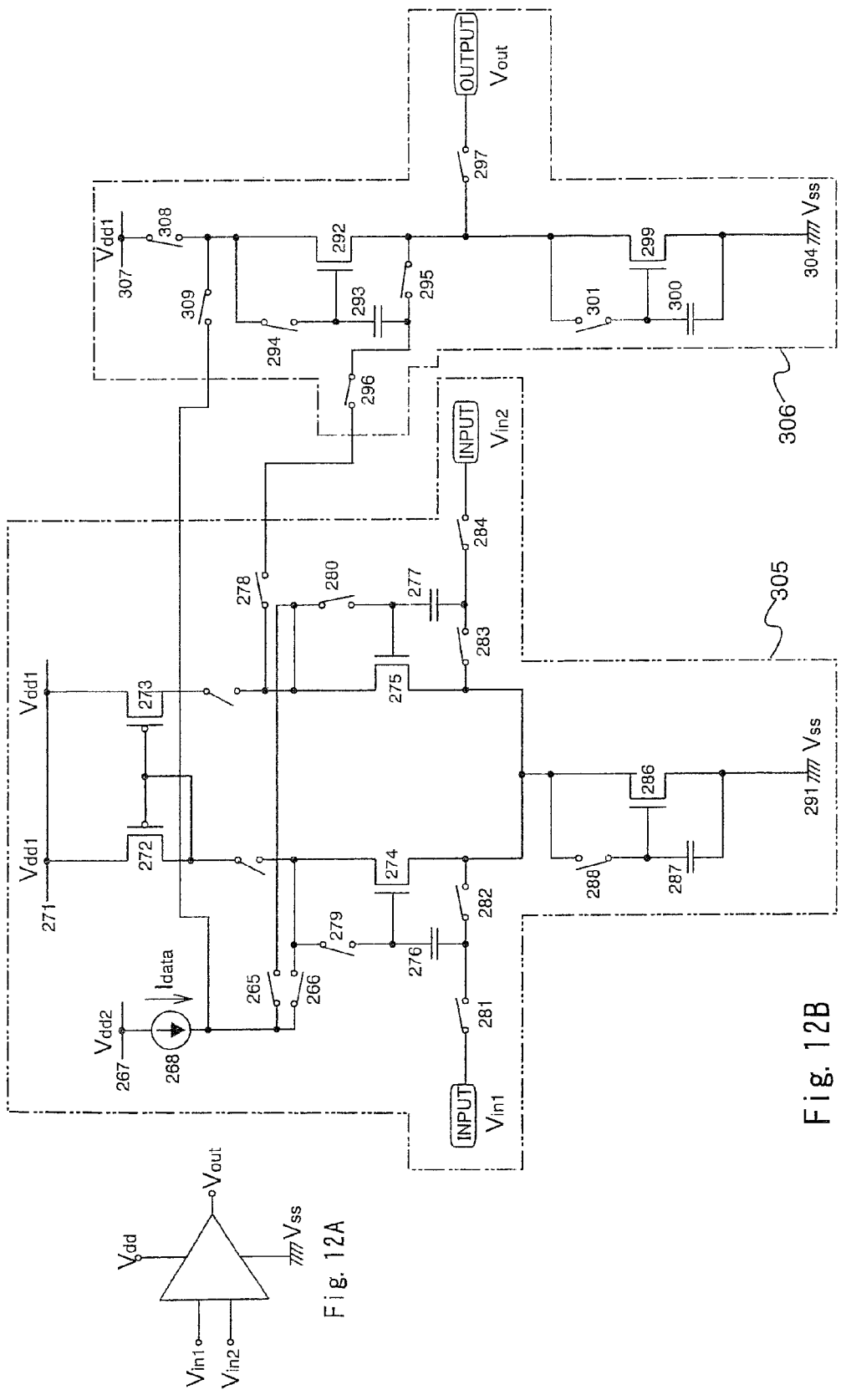

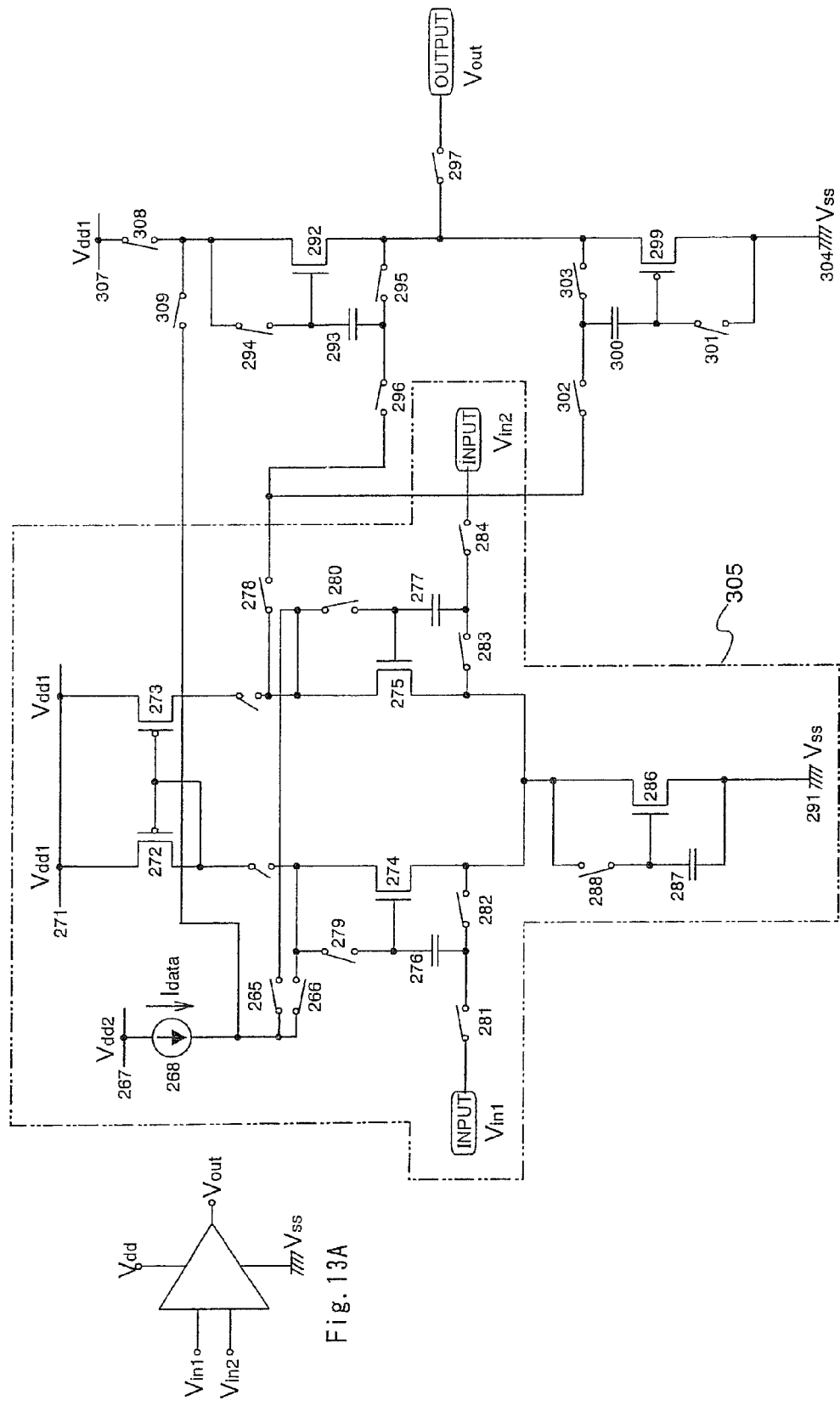

SEMICONDUCTOR DEVICE AND ELECTRONIC APPARATUS USING THE SAME

BACKGROUND OF THE INVENTION

1. Field of the Invention

The present invention relates to the art of electric circuits. Meanwhile, the invention belongs to a technical field of a semiconductor device having an electric circuit as represented by a source-follower circuit, a differential amplifier circuit, a sense amplifier and an operational amplifier, a signal-line drive circuit and a photoelectric converter element.

2. Description of the Related Art

The integrated circuit (IC), for broad use recently on a cellular phone or personal digital assistant, is formed with transistors or resistors as many as several hundreds of thousands to several millions on a silicon substrate in a size of nearly a 5-mm square. This plays an important role in device miniaturization and reliability improvement, and device mass production.

In designing an electric circuit for use on an integrated circuit (IC) or the like, it is frequent cases to design an amplifier circuit having a function to amplify a voltage or current of a signal small in amplitude. The amplifier circuit is broadly used because of a circuit requisite for eliminating strain occurrence to stably operate an electric circuit.

Herein, explained is the configuration and operation of a source-follower circuit, as one example of amplifier circuit. At first, a configuration example of source-follower circuit will be shown in FIG. 5A to explain an operation in a steady state. Next, an operating point of the source-follower circuit will be explained, by using FIGS. 5B and 5C. Finally, an example of source-follower circuit different in configuration from FIG. 5A will be shown in FIGS. 6A and 6B, to explain an operation in a transient state.

At first, a steady state operation is explained by using a source-follower circuit in FIG. 5A.

In FIG. 5A, 11 is an n-channel amplifier transistor while 12 is an n-channel bias transistor. Note that, although the amplifier transistor 11 and bias transistor 12 in FIG. 5A is of an n-channel type, configuration may be by the use of p-channel transistors. Herein, the amplifier transistor 11 and the bias transistor 12 are assumably the same in characteristic and size, for simplification sake. It is further assumed that the current characteristic of them is ideal. Namely, it is supposed that, even if the amplifier transistor 11 or bias transistor 12 is changed in its source-to-drain voltage, there is no change in saturation-region current value.

Meanwhile, the amplifier transistor 11 has a drain region connected to a power line 13 and a source region connected to a drain region of the bias transistor 12. The bias transistor 12 has a source region connected to a power line 14.

The gate electrode of the bias transistor 12 is applied by a bias potential $V_b$. A power-source potential (high potential power) $V_{dd}$ is applied onto the power line 13 while a ground potential (low potential power) $V_{ss}$ (=0V) is applied onto the power line 14.

In the source-follower circuit of FIG. 5A, the gate electrode of the amplifier transistor 11 is made as an input terminal so that an input potential $V_{in}$ can be inputted to the gate electrode of the amplifier transistor 11. Also, the source region of the amplifier transistor 11 is made as an output terminal so that the potential on the source region of the amplifier transistor 11 provides an output potential $V_{out}$. The gate electrode of the bias transistor 12 is applied by a bias voltage $V_b$. When the bias transistor 12 operates in a saturation region, a current denoted by Ib assumably flows. At this time, because the amplifier transistor 11 and the bias transistor 12 are in a series connection, the same amount of current flows through the both transistors. Namely, when a current Ib flows through the bias transistor 12, a current Ib flows also through the amplifier transistor 11.

Herein, determined is an output potential $V_{out}$ in the source-follower circuit. The output potential $V_{out}$ is lower in value than the input potential $V_{in}$, by an amount of the gate-to-source voltage $V_{gs1}$ of the amplifier transistor 11. At this time, the input potential $V_{in}$, the output potential $V_{out}$ and the gate-to-source voltage $V_{gs1}$ have a relationship satisfying the following Equation (1).

$$V_{out} = V_{in} - V_{gs1} \tag{1}$$

In the case the amplifier transistor 11 is operating in the saturation region, in order to flow a current Ib through the amplifier transistor 11 there is a necessity that the gate-to-source voltage $V_{gs1}$ of the amplifier transistor 11 is equal to a bias potential $V_b$ (gate-to-source voltage of the bias transistor 12). If so, the following Equation (2) is held. However, Equation (2) is held only when the amplifier transistor 11 and the bias transistor 12 operate in the saturation region.

$$V_{out} = V_{in} - V_b \tag{2}$$

Next explained is an operating point of the source-follower circuit by using FIGS. 5B and 5C showing a relationship of between a voltage and a current of the amplifier transistor 11 and bias transistor 12. More specifically, explanation is made on a case that the gate-to-source voltage $V_{gs1}$ of the amplifier transistor 11 is same in value as the gate-to-source voltage $V_{gs2}$ of the bias transistor 12, by using FIG. 5B. Next explained is a case that the gate-to-source voltage $V_{gs1}$ of the amplifier transistor 11 is different in value from the gate-to-source voltage $V_{gs2}$ of the bias transistor 12 wherein, for example, the bias transistor 12 is operating in a linear region, by using FIG. 5C.

In FIG. 5B, the dotted line 21 shows a relationship between a voltage and a current when the amplifier transistor 11 has a gate-to-source voltage $V_{gs1}$ of $V_b$. The solid line 22 shows a relationship between a voltage and a current when the bias transistor 12 has a gate-to-source voltage $V_{gs2}$ of $V_b$. Meanwhile, in FIG. 5C, the dotted line 21 shows a relationship between a voltage and a current when the amplifier transistor 11 has a gate-to-source voltage $V_{gs1}$ of $V_b$. The solid line 22 shows a relationship between a voltage and a current when the bias transistor 12 has a gate-to-source voltage $V_{gs2}$ of $V_b'$.

In FIG. 5B, the gate-to-source voltage $V_{gs1}$ of the amplifier transistor 11 and the gate-to-source voltage $V_{gs2}$ of the bias transistor 12 are in the same value, and further the bias potential $V_b$ and the gate-to-source voltage $V_{gs2}$ of bias transistor 12 are in the same value. Consequently, the gate-to-source voltage $V_{gs1}$ of the amplifier transistor 11 is in the same value as the bias potential $V_b$. Namely, this results in $V_{gs1} = V_{gs2} = V_b$. The amplifier transistor 11 and the bias transistor 12 are operating in the saturation region, as shown in FIG. 5B. At this time, the input potential $V_{in}$ and the output potential $V_{out}$ have a relationship in a linear form.

On the other hand, in FIG. 5C, the gate-to-source voltage $V_{gs1}$ of the amplifier transistor 11 is in a value different from the gate-to-source voltage $V_{gs2}$ of bias transistor 12. Furthermore, the gate-to-source voltage $V_{gs2}$ of bias transistor 12 is in a same value as the bias voltage $V_b$. Meanwhile, it is assumed that the gate-to-source voltage $V_{gs1}$ of the amplifier transistor 11 is at the bias voltage $V_b'$. Namely, this results in $V_{gs2} = V_b$ and $V_{gs1} = V_b'$. As shown n FIG. 5C, the amplifier transistor 11 is operating in the saturation region while the bias transistor 12 is operating in the linear region. At this time, the input potential $V_{in}$, the output potential $V_{out}$ and the bias potential $V_b'$ have a relationship satisfying the following Equation (3).

$$V_{out}=V_{in}-V_b' \qquad (3)$$

Provided that the current flowing upon operating of the bias transistor 12 in the linear region is taken Ib', Ib'<Ib is given. Namely, by having $V_b'<V_b$, the both values of the input potential $V_{in}$ and current Ib' decrease. Thereupon, the bias potential $V_b'$ also decreases. At this time, the input potential $V_{in}$ and the output potential $V_{out}$ have a non-linear relationship.

Summarizing the above, in order to increase the amplitude of the output potential $V_{out}$ in the source-follower circuit in a steady state, it is preferred to decrease the bias potential $V_b$. This is because of the following two reasons.

The first reason is that the output potential $V_{out}$ can be increased at a small bias potential $V_b$, as shown in Equation (2). The second reason is that, in the case of a great bias potential $V_b$ value, the bias transistor 12 readily operate in the linear region at a decreased input potential $V_{in}$. In case the bias transistor 12 operates in the linear region, the input potential $V_{in}$ and the output potential $V_{out}$ are ready to have a non-linear relationship.

Incidentally, because the bias transistor 12 is required in a conduction state, there is a need to provide a greater value of bias potential $V_b$ than a threshold voltage of the bias transistor 12.

So far explained was the operation in a steady state of the source-follower circuit. Subsequently, explanation is made on the operation of the source-follower circuit in a transient state, by using FIGS. 6A and 6B.

The source-follower circuit shown in FIGS. 6A and 6B has a configuration designed by adding a capacitance element 15 to the circuit of FIG. 5A. The capacitance element 15 has one terminal connected to the source region of the amplifier transistor 11 and the other terminal connected to the power line 16. A ground potential $V_{ss}$ is applied onto the power line 16.

The capacitance element 15 has a same potential difference at between its both electrodes as the output potential $V_{out}$ of the source-follower circuit. Herein, explained is the operation in a case of $V_{out}<V_{in}-V_b$, by using FIG. 6A. Next explained is the operation in a case of $V_{out}>V_{in}-V_b$, by using FIG. 6B.

At first, explanation is made on the operation in a transient state of the source-follower circuit in the case of $V_{out}<V_{in}-V_b$, by using FIG. 6A.

In FIG. 6A, when t=0, the gate-to-source voltage $V_{gs1}$ of the amplifier transistor 11 has a greater value than the gate-to-source voltage $V_{gs2}$ of the bias transistor 12. Consequently, a great current flows through the amplifier transistor 11 to promptly hold charge on the capacitance element 15. Thereupon, the output potential $V_{out}$ increases to decrease the gate-to-source voltage $V_{gs1}$ value of the amplifier transistor 11.

As time elapses (t=$t_1$, $t_1$>0), the amplifier transistor 11 goes into a steady state when its gate-to-source voltage $V_{gs1}$ becomes equal to the bias potential V. At this time, the output potential $V_{out}$, the input potential $V_{in}$ and the bias potential $V_b$ have a relationship satisfying the foregoing Equation (2).

Summarizing the above, in the case of $V_{out}<V_{in}-V_b$, the gate-to-source voltage $V_{gs1}$ of the amplifier transistor 11 is greater in value than the bias potential $V_b$. Accordingly, a great current flows through the amplifier transistor 11, to promptly hold charge on the capacitance element 15. Hence, the time may be short that is required for the capacitance element 15 to hold predetermined charge, in other words the time required in writing a signal to the capacitance element 15.

Next, explanation is made on the operation in a transient state of the source-follower circuit in the case of $V_{out}>V_{in}-V_b$, by using FIG. 6B.

In FIG. 6B, when t=0, the gate-to-source voltage $V_{gs1}$ of the amplifier transistor 11 has a smaller value than the threshold voltage of the amplifier transistor 11. Consequently, the amplifier transistor 11 is in a non-conduction state. The charge stored on the capacitance element 15 flows in a direction toward the ground potential $V_{ss}$ through the bias transistor 12, finally being discharged. At this time, because the gate-to-source voltage $V_{gs2}$ of the bias transistor 12 is in the same value as the bias potential $V_b$, the current flowing through the bias transistor 12 is Ib.

As time elapses (t=$t_1$, $t_1$>0), the output potential $V_{out}$ decreases while the gate-to-source voltage $V_{gs1}$ of the amplifier transistor 11 increases. When the gate-to-source voltage $V_{gs1}$ of the amplifier transistor 11 becomes equal to the bias potential $V_b$, a steady state is entered. At this time, the output potential $V_{out}$, the input potential $V_{in}$ and the bias potential $V_b$ have a relationship satisfying the foregoing Equation (2). Note that, in the steady state, the output potential $V_{out}$ is kept at a constant value, and charge does not flow to the capacitance element 15. Thus, a current Ib flows through the amplifier transistor 11 and bias transistor 12.

Summarizing the above, in the case of $V_{out}>V_{in}-V_b$, the time for the capacitance element 15 to hold predetermined charge, in other words the write time of a signal to the capacitance element 15, relies upon the current Ib flowing through the bias transistor 12. The current Ib relies upon a magnitude of the bias potential $V_b$. Accordingly, in order to increase the current Ib and shorten the write time of a signal to the capacitance element 15, a necessity is raised to increase the bias potential $V_b$.

Incidentally, as a method of correcting for threshold-voltage variation of a transistor, there is a method that variation is observed by an output of a circuit a signal has been inputted and thereafter the variation is inputted and fed back thereby carrying out a correction (e.g. see Non-Patent Document 1).
[Non-Patent Document] H. Sekine et al, "Amplifier Compensation Method for a Poly-Si TFT LCLV with an Integrated Data-Driver", IDRC '97, p. 45-48.

The foregoing operation of the source-follower circuit is to be carried out on an assumption the amplifier transistor 11 and the bias transistor 12 have the same characteristic. However, for the both transistors, variation occurs in the threshold voltage or mobility due to gathering of the factors, such as of variation in gate length (L), gate width (W) and gate insulating film thickness or variation in channel-region crystal state caused due to the difference in fabrication process or substrate used.

For example, it is assumed, in FIG. 5A, that there is variation of 1 V provided that the amplifier transistor 11 has a threshold of 3 V and the bias transistor 12 has a threshold of 4 V. If so, in order to flow a current Ib, there is a need to apply a voltage for the gate-to-source voltage $V_{gs1}$ of the amplifier transistor 11 lower by 1 V than the gate-to-source voltage $V_{gs2}$ of the bias transistor 12. Namely, $V_{gs1}=V_b-1$ results. If so, $V_{out}=V_{in}-V_{gs1}=-V_b+1$ results. Namely, in case variation occurs even by 1 V in the threshold voltage of the amplifier transistor 11 and bias transistor 12, variation is also caused in the output potential $V_{out}$.

The present invention has been made in view of the above problems. It is a problem to provide an electric circuit suppressing against the affection of transistor characteristic variation. More specifically, it is a problem, in an electric circuit having a function of current amplification, to provide an electric circuit capable of supplying a desired voltage while suppressing against the affection of transistor characteristic variation.

SUMMARY OF THE INVENTION

The present invention uses an electric circuit configured as in the following, in order to solve the foregoing problems.

An electric circuit shown in FIG. 3A is configured with a reference constant-current source 21, a switching element 22 having a switching function (hereinafter, denoted as SW 22), an n-channel transistor 23 and a capacitance element 24. The transistor 23 has a source region connected to a power line 25 and a drain region connected to the reference constant-current source 21. The transistor 23 has a gate electrode connected to one terminal of the capacitance element 24. The other terminal of the capacitance element 24 is connected to the power line 25. The capacitance element 24 has a role to hold a gate-to-source voltage $V_{gs}$ of the transistor 23. Meanwhile, the power line 25 is applied with a ground potential $V_{ss}$.

In FIGS. 3A-3C, the transistor 23 is assumably of an n-channel type. This, however, is not limitative, i.e. configuration is possible with a p-channel type.

The electric circuit of FIG. 3A sets with a potential difference at between the both electrodes of the capacitance element, i.e. a gate-to-source voltage of a transistor, such that a current flowing between the source and the drain of the transistor is equal to a signal current $I_{data}$ (referred also to as a reference current) caused to flow by the reference constant-current source.

In FIG. 3A, the sw 22 is on. At this time, the signal current $I_{data}$, set by the reference constant-current source 21, flows in a direction toward the power line 25. At this time, the current $I_{data}$ is branched into $I_1$ and $I_2$ to flow. Incidentally, the current $I_{data}$ satisfies $I_{data}=I_1+I_2$.

In an instant a current begins to flow from the reference constant-current source 21, no charge is held on the capacitance element 24. Consequently, the transistor 23 is off. Accordingly, this results in $I_2=0$ and $I_{data}=I_1$.

Then, charge gradually builds up on the capacitance element 24, to begin causing a potential difference at between the both electrodes of the capacitance elements 24. When the potential difference at between the both electrodes becomes a threshold voltage of the transistor 23, the transistor 23 turns on to give $I_2>0$. Because of $I_{data}=I_1+I_2$ as in the foregoing, the current remains flowing despite $I_1$ gradually decreases (point A, FIGS. 3C and 3D).

The potential difference at between the both electrodes of the capacitance element 24 provides a gate-to-source voltage for the transistor 23. Consequently, charge storage is continued to the capacitance element 24 until the transistor 23 reaches a voltage (VGS) capable of flowing a signal current as a desired current. Completing the charge storage (point B, FIGS. 3C and 3D), the current $I_1$ ceases to flow. Furthermore, because the transistor 23 is on, $I_{data}=I_2$ results.

Subsequently, the sw 22 is turned off as shown in FIG. 3B. Because the VGS written in the foregoing operation is held on the capacitance element 24, the transistor 23 is on. Furthermore, a current equal to the signal current $I_{data}$ flows through the drain region of the transistor 23. At this time, by allowing the transistor 23 to operate in a saturation region, even if there is a change in the source-to-drain voltage of the transistor 23, the drain current of the transistor 23 can flow without a change in the value thereof.

As in the foregoing, in order to cause a current same as a signal current in the reference constant-current source to flow to a particular transistor, a gate-to-source voltage may be set of that transistor. In the invention, setting is possible by holding the gate-to-source voltage of the transistor due to a capacitance element connected to that transistor. By utilizing the voltage held on the capacitance element, it is possible to suppress against the affection of transistor characteristic variation.

The method of utilizing a voltage held on a capacitance element can use the method shown in the below. The voltage held on a capacitance element is held as it is, and a signal voltage (e.g. video signal voltage) is inputted to one terminal of the capacitance element. If doing so, the gate electrode of the transistor is inputted by a voltage that the voltage held on the capacitance element is added to the signal voltage. As a result, the gate electrode of the transistor is inputted by a value having the voltage held on the capacitance element added to the signal voltage. Namely, in the invention, even where characteristic variation occurs between transistors, the transistor a signal voltage is to be inputted is inputted by a value that a voltage held on each capacitance element each transistor is connected is added to the signal voltage. Accordingly, an electric circuit can be provided that is suppressed against the affection of the characteristic variation between transistors.

Note that the mechanism for adding a voltage held on a capacitance element to a signal voltage is to be explained by the charge conservation law. The charge conservation law represents a fact that the arithmetic sum in amount of positive electricity and negative electricity is constant in total electricity amount.

The invention can use a transistor using any material or transistor processed by any means or manufacture method or transistor in any type. For example, a thin-film transistor (TFT) may be used. The TFT may use a semiconductor layer formed of any of amorphous, poly-crystal and single crystal ones. As another transistor, the transistor may be the one fabricated on a single-crystal substrate or transistor made on an SOI substrate. Besides, the transistor may be formed of an organic material or carbon nano tube. Furthermore, MOS transistors or bipolar transistors are also applicable.

BRIEF DESCRIPTION OF THE DRAWINGS

FIGS. 3A to 3D are diagrams explaining the configuration and operation of an electric circuit of the invention;

FIGS. 12A and 12B are diagrams showing an operational amplifier of the invention;

FIGS. 13A and 13B are diagrams showing an operational amplifier of the invention;

DETAILED DESCRIPTION OF THE PREFERRED EMBODIMENTS

Embodiment 1

This embodiment shows a source-follower circuit as an example of an electric circuit of the present invention, the configuration and operation of which will be explained using FIGS. 1, 2A and 2B.

Figure 1:
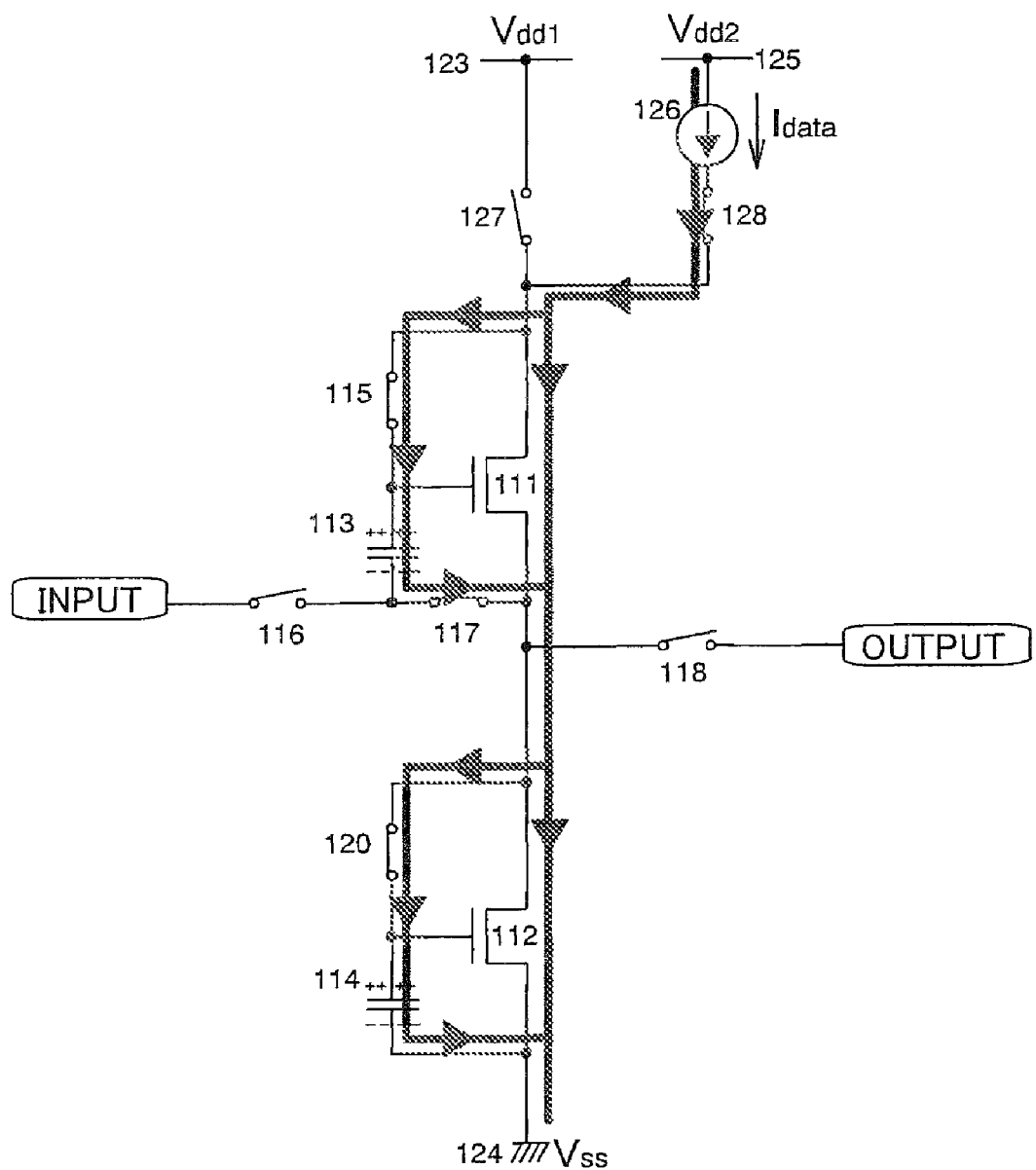
FIG. 1 is a diagram explaining the operation of a source-follower circuit of the present invention.
Figure 2A:
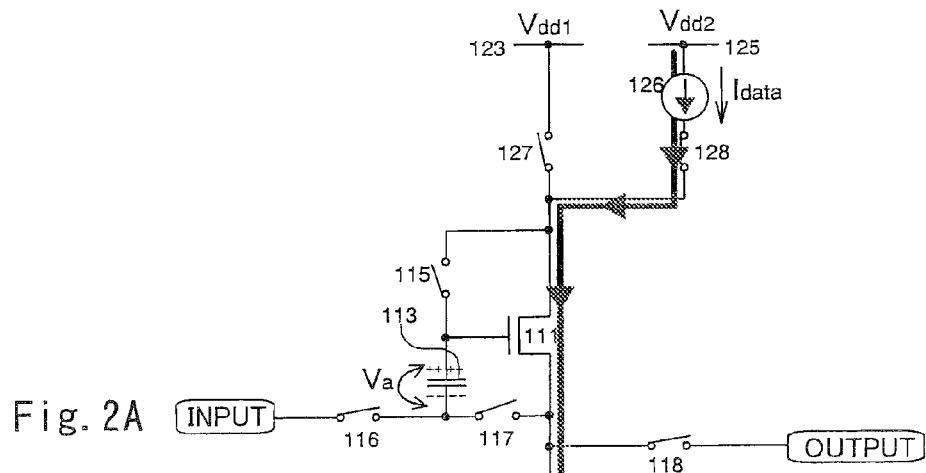
FIGS. 2A and 2B are diagrams explaining the operation of the source-follower circuit of the invention.
Figure 2B:
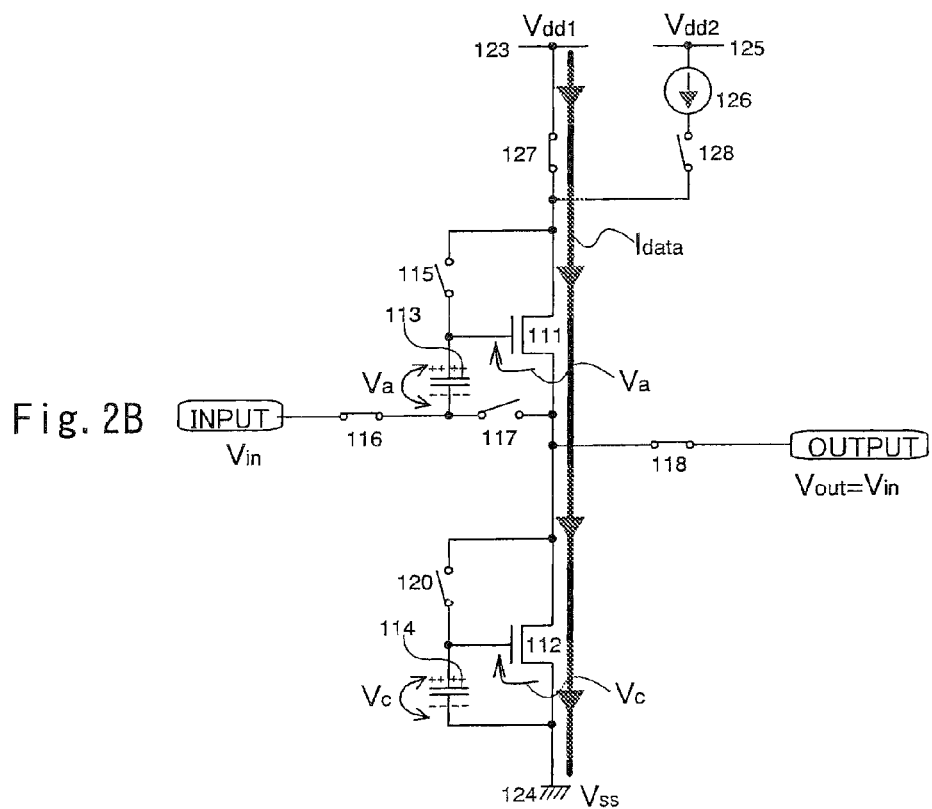

First explained is a configuration of the source-follower circuit of the invention, by using FIGS. 1, 2A and 2B.

In FIGS. 1, 2A and 2B, 111 is an n-channel amplifier transistor, and 112 is an n-channel bias transistor. 113 and 114 are capacitance elements. Meanwhile, 115-118, 120, 127, 128 are elements having switching functions, which preferably use semiconductor elements, such as analog switches, configured by transistors. In this case, the semiconductor devices are merely switches and hence not especially limited in their polarities.

126 is a reference constant-current source having a capability to flow a constant current. The reference constant-current source 126 is configured by a semiconductor element of a transistor or the like. In the present specification, a reference constant-current source 126 configured by transistor will be explained in its one example in Embodiment 6. This can be made reference to conveniently.

123-125 are power lines, i.e. the power line 123 is applied with a power source potential $V_{dd1}$ while the power line 124 is with a ground potential $V_{ss}$. The power line 125 is applied with a power source potential $V_{dd2}$. The power source potential $V_{dd1}$ applied to the power line 123 and the power source potential $V_{dd2}$ applied to the power line 125 may be the same or different in value. However, the power source potential $V_{dd2}$ applied to the power line 125 is required to be set at a value that the reference constant-current source 126 is allowed to normally operate as a constant-current source. For example, where the reference constant-current source 126 utilizes a saturation region of a transistor to configure the current source, there is a need to set at a value in a range the transistor is allowed to operate in the saturation region.

Figure 24:
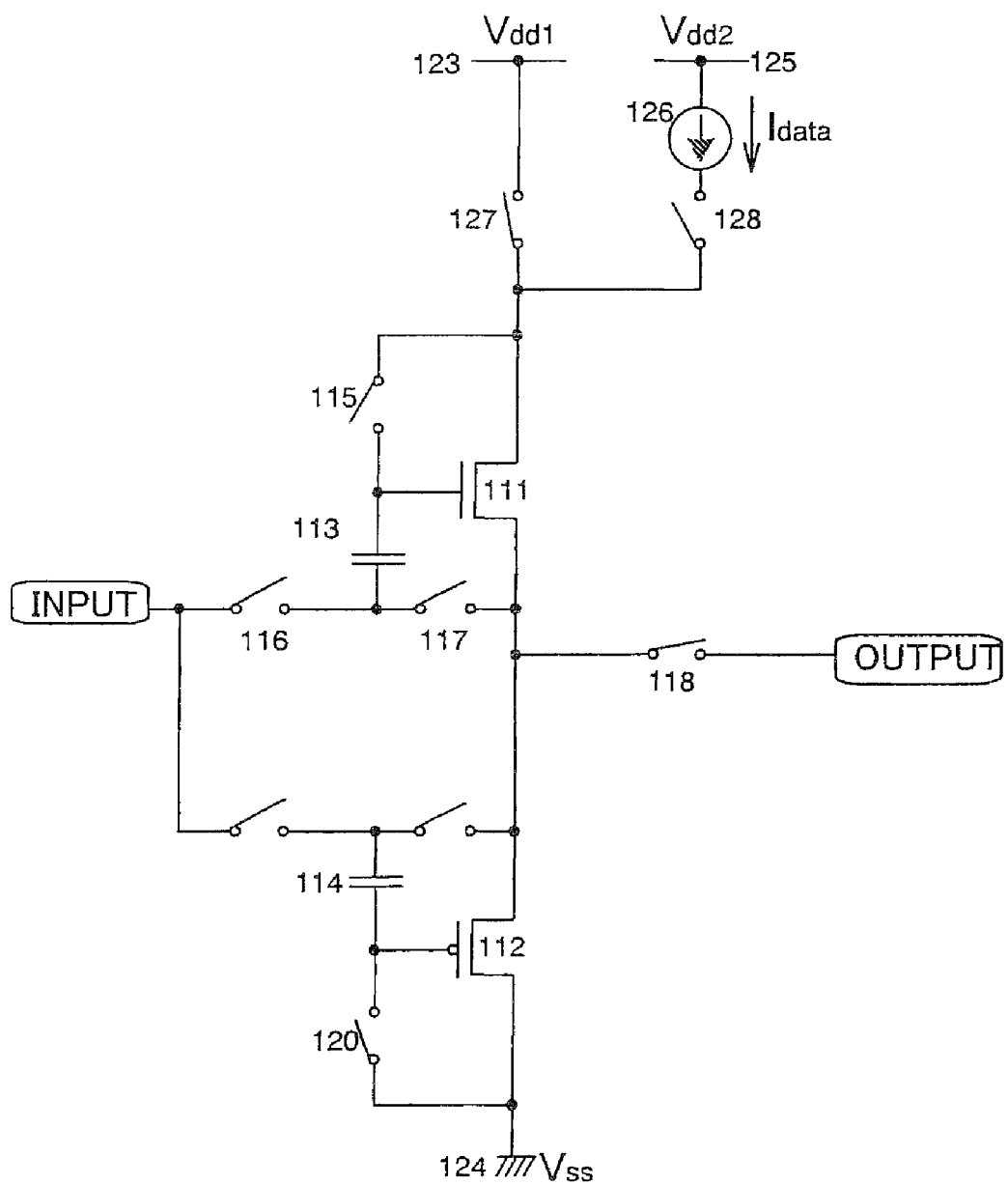
FIG. 24 is a diagram showing a source-follower circuit of the invention.

Although this embodiment shows the case the amplifier transistor 111 and bias transistor 112 are of the n-channel type, the invention is not limited to this, i.e. the both transistors may be of a p-channel type. Otherwise, the both transistors may be different in polarity to configure a push-pull circuit. It is noted that, where a push-pull circuit is configured, the both transistors function as amplifier transistors as shown in FIG. 24. Hence, signal input is to the both transistors.

The amplifier transistor 111 has a drain region connected to the power line 123 through the switch 127, and a source region connected to the switches 117, 118 and to a drain region of the transistor 112. The amplifier transistor 111 has a gate electrode connected to one terminal of the capacitance element 113. The other terminal of the capacitance element 113 is connected to the source region of the transistor 111 through the switch 117. The capacitance element 113 has a role to hold a gate-to-source voltage of the amplifier transistor 111. Note that, hereinafter, the amplifier transistor 111 is denoted as the transistor 111.

The bias transistor 112 has a source region connected to the power line 124 and a drain region connected to the switches 117, 118 and 120. The bias transistor 112 has a gate electrode connected to one terminal of the capacitance element 114. The other terminal of the capacitance element 114 is connected to the source region of the bias transistor 112. The capacitance element 114 has a role to hold a gate-to-source voltage of the bias transistor 112. Note that, hereinafter, the bias transistor 112 is denoted as the transistor 112.

The switches 115-118, 120, 127, 128 are controlled of conduction and non-conduction (on and off) depending upon an input signal. However, in FIGS. 1, 2A and 2B, the signal lines or the like for input signals to the switches 115-118, 120, 127, 128 are omittedly shown in order to simplify explanation.

In the source-follower circuit of FIGS. 1, 2A and 2B, the switch 116 has one terminal serving as an input terminal Through the input terminal, an input potential $V_{in}$ (signal voltage) is inputted to one terminal of the capacitance element 113. Meanwhile, the switch 118 has one terminal serving as an output terminal. The potential on the source region of the transistor 111 provides an output potential $V_{out}$.

Explanation is now made on the operation of the source-follower circuit of FIGS. 1, 2A and 2B.

In FIG. 1, the switches 115, 117, 120 and 128 are turned on. The other switches than the above are off. In this state, a signal current $I_{data}$ set in the reference constant-current source 126 flows toward the power line 124 through the capacitance elements 113, 114.

In an instant a current begins to flow from the reference constant-current source 126, no charge is being held on the capacitance elements 113, 114. Consequently, the transistors 111, 112 are off. The current flows in a direction from the reference constant-current source 126 toward the power line 124 through the switches 128, 115, 117 and further through the switch 120.

Charge are gradually built up on the capacitance elements 113, 114 to begin causing a potential difference at between the both electrodes of the capacitance 113, 114. When the potential difference at between the both electrodes of the capacitance element 113 reaches a threshold voltage $V_{th1}$ of the transistor 111, the transistor 111 turns on. Similarly, when the potential difference at between the both electrodes of the capacitance element 114 reaches a threshold voltage $V_{th2}$ of the transistor 112, the transistor 112 turns on.

Then, charge storage is continued onto the capacitance element 113 so that the gate-to-source voltage of the transistor 111 can flow a predetermined signal current $I_{data}$. Also, charge storage is continued onto the capacitance element 114 so that the gate-to-source voltage of the transistor 112 can flow a predetermined signal current $I_{data}$.

As shown in FIG. 2A, when the capacitance elements 113, 114 complete the electric-charge storage into a steady state, the switches 115, 117, 120 are turned from on to off while the other switches are maintained in the state of FIG. 1. At this time, the signal current $I_{data}$ set by the reference constant-current source 126 flow through the drain to source region of the transistor 111 and further the drain to source region of the transistor 112. Incidentally, it is assumed that the potential difference is $V_a$ at between the both electrodes of the capacitance element 113 while the potential difference is $V_c$ at between the both electrodes of the capacitance element 114.

Subsequently, the switches 116, 118, 127 are turned on, as shown in FIG. 2B. The other switches than the above are all turned off. At this time, an input potential $V_{in}$ is inputted from the input terminal to one terminal of the capacitance element 113 through the switch 116. By the charge conservation law, the gate electrode of the transistor 111 is applied by a value $(V_a+V_{in})$ that the input potential $V_{in}$ is added to the gate-to-source voltage $V_a$ of the transistor 111.

The output potential $V_{out}$ is at a potential on the source region of the transistor 111. Namely, this corresponds to a value that the gate-to-source voltage $V_{gs} (=V_a)$ is subtracted from the gate potential $(V_{in}+V_a)$ of the transistor 111.

Incidentally, after the switch 128 is turned off and the switch 127 turned on, the signal current $I_{data}$ also flows through the transistor 111. This is because that the gate-to-source voltage $V_{gs} (=V_c)$ of the transistor 112 is added with a voltage required to flow the signal current $I_{data}$. Accordingly, the gate-to-source voltage $V_{gs}$ of the transistor 111 is also added with a voltage required to flow the signal current $I_{data}$. The required voltage is the voltage denoted by $V_a$. Consequently, it can be seen that the gate-to-source voltage $V_{gs}$ of the transistor 111 has the same value as $V_a$. Summarizing, the following Equation (4) is held.

$$V_{out}=(V_{in}+V_a)-V_a=V_{in} \qquad (4)$$

As shown in Equation (4), the output potential $V_{out}$ is the same in value as the input potential $V_{in}$, and not dependent upon the transistor characteristic. Consequently, should characteristic variation occur in the transistor 111 and transistor 112, it can be suppressed from having an effect upon the output potential $V_{out}$.

Although the electric circuit of FIGS. 1, 2A and 2B is a source-follower circuit, there is no provision of an input terminal for inputting a bias potential. This is because, at between the gate-to-source of the transistor 112, predetermined charge is already held on the capacitance element 114 to flow the signal current $I_{data}$ set by the reference constant-current source 126.

Because the invention can suppress against the affection of characteristic variation of the transistors 111 and 112, there is no need to design the transistors 111 and 112 with the same value of gate length (L) and gate width (W). There is no problem if variation occurs.

In this specification, the operation to hold predetermined charge on a capacitance element is referred to as a setting operation. In this embodiment, the operation in FIGS. 1 and 2A corresponds to a setting operation. Also, the operation to input an input potential $V_{in}$ and take out an output potential $V_{out}$ is referred to as an output operation. In this embodiment, the operation of FIG. 2B corresponds to an output operation.

Incidentally, although the electric circuit of FIGS. 1, 2A and 2B has a connection in the order of the power line 125, the reference constant-current source 126 and the switch 128, the invention is not limited to this. For example, the connection may be in the order of the power line 125, the switch 128 and the reference constant-current source 126 by reversing the reference constant-current source 126 and the switch 128.

Figure 7A:
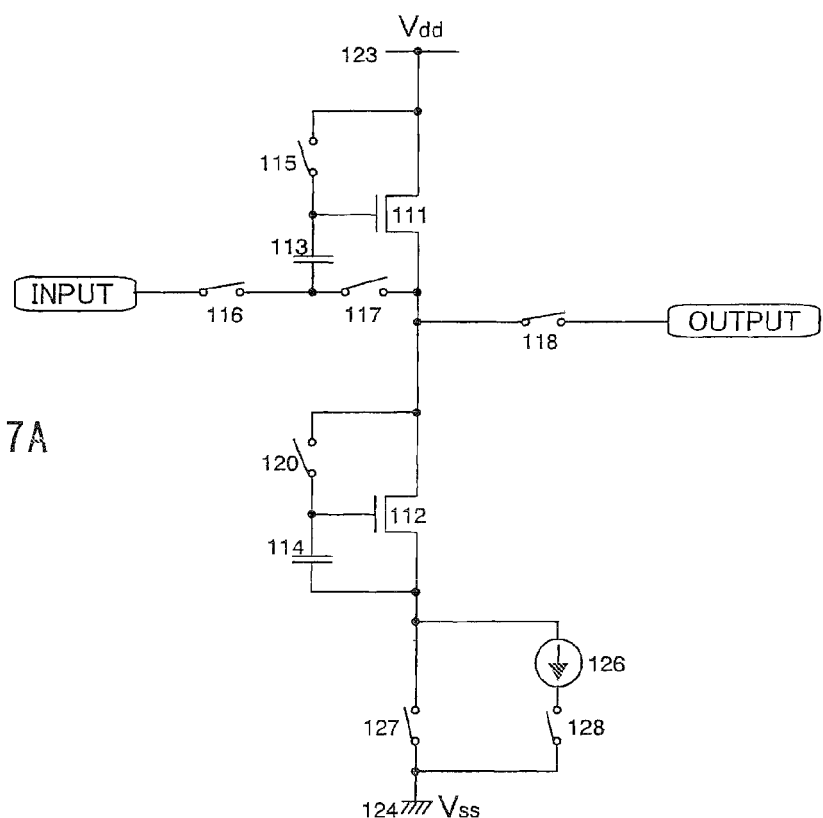
FIGS. 7A and 7B are diagrams showing a source-follower circuit of the invention.
Figure 7B:
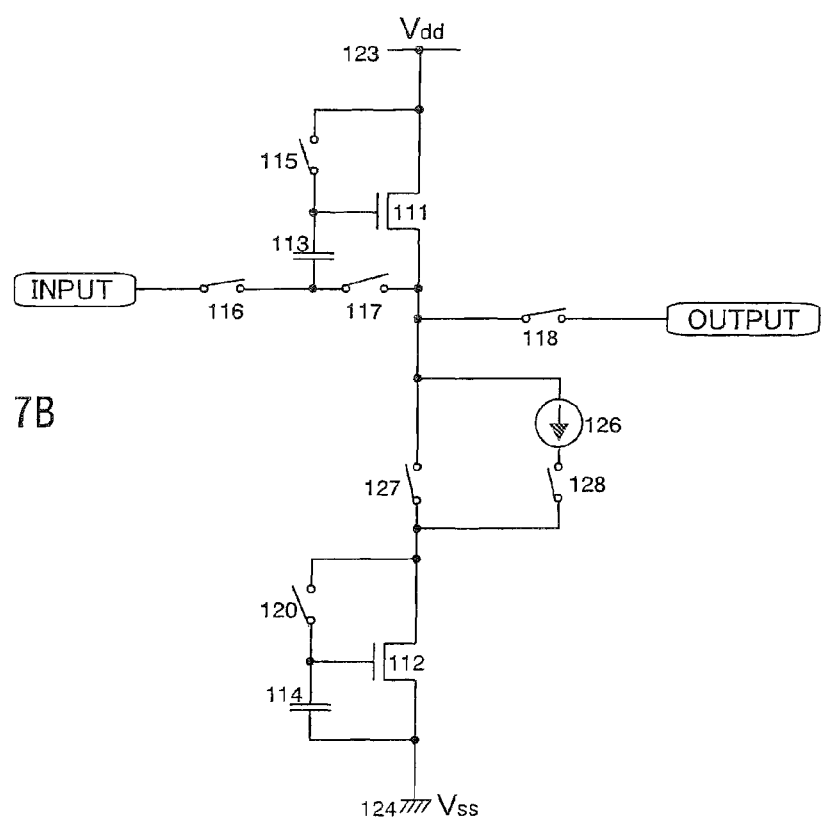

Meanwhile, the reference constant-current source 126 may be arranged as shown in FIG. 7A or 7B. Explanation will be made on the electric circuit configurations shown in FIGS. 7A and 7B. The electric circuit of FIG. 7A or 7B has the same circuit elements as those of the electric circuit of FIGS. 1, 2A and 2B, excepting that the power line 125 is not provided. The power line 123 is applied with a power-source potential $V_{dd}$ while the power line 124 is with a ground potential $V_{ss}$. The operation of the source-follower circuit of FIG. 7A or 7B is similar to the operation of the source-follower circuit of FIGS. 1, 2A and 2B, and hence omitted explained in this embodiment.

In FIG. 7A, the switch 127 is arranged between the drain region of the transistor 112 and the power line 124. The switch 128 is arranged, parallel with the switch 127, between the drain region of the transistor 112 and the power line 124. Finally, the reference constant-current source 126 is arranged between the drain region of the transistor 112 and the switch 128 or between the switch 128 and the power line 124. FIG. 7A shows a case of the arrangement at between the drain region of the transistor 112 and the switch 128.

In FIG. 7A, the switches 127 and 128 are both connected to the ground potential $V_{ss}$. However, the invention is not limited to this. These may be connected to different power lines in a manner such that, in FIG. 1, the switch 127 is connected to the power-source potential $V_{dd1}$ and the switch 128 is to the power-source potential $V_{dd2}$. For example, the switch 127 may be connected to the ground potential $V_{ss}$ as in FIG. 7A while the switch 128 be connected to a newly-arranged ground potential $V_{ss2}$. The ground potential $V_{ss}$ and the ground potential $V_{ss2}$ may be at the same value or different values.

In FIG. 7B, the switch 127 is arranged at between the source region of the transistor 111 and the drain region of the transistor 112. The switch 128 is arranged in parallel with the switch 127. Finally, the reference constant-current source 126 is arranged between the source region of the transistor 111 and the switch 128 or between the switch 128 and the drain region of the transistor 112. FIG. 7B shows a case of an arrangement at between the source region of the transistor 111 and the switch 128.

Although, in FIG. 7B, the switch 118 is connected to the source region of the transistor 111 and to the drain region of the transistor 112 through the switch 127, the invention is not limited to this. The switch 118 may be connected to the drain region of the transistor 112 and to the source region of the transistor 111 through the switch 127.

However, it is preferred that the switch 118 is connected to the source region of the transistor 111 and to the drain region of the transistor 112 through the switch 127. This is because that, in the case the switch 118 is connected to the drain region of the transistor 112 and to the source region of the transistor 111 through the switch 127, if there is an on-resistance through the switch 127, it has an effect upon the output potential $V_{out}$ to lower the output potential $V_{out}$.

Figure 8A:
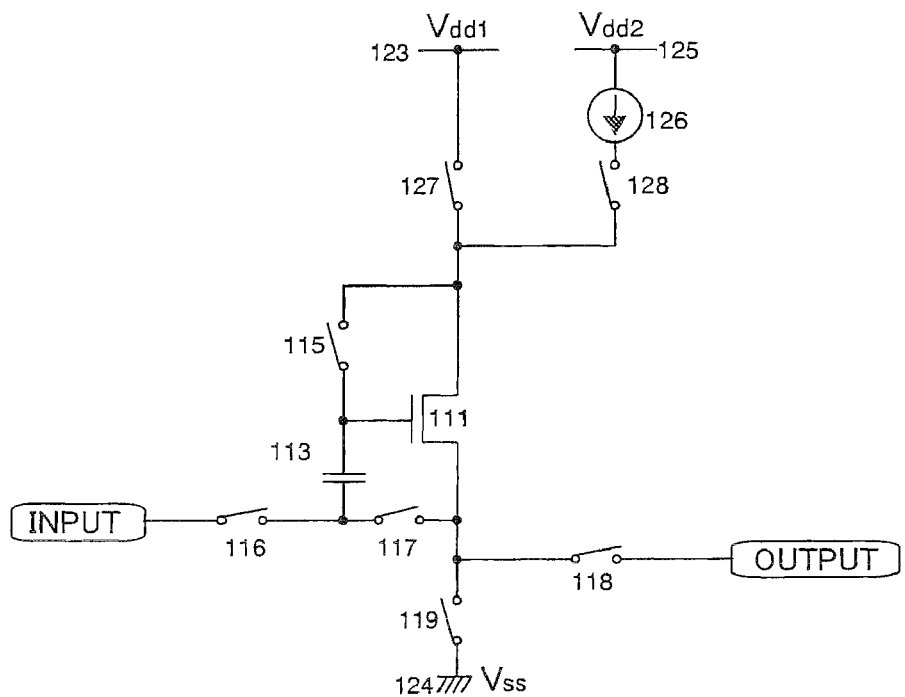
FIGS. 8A and 8B are diagrams showing a source-follower circuit of the invention.

Meanwhile, FIG. 8A shows a source-follower circuit that, in the electric circuit of FIGS. 1, 2A and 2B, a switch 119 is arranged between the drain region of the transistor 111 and the power line 124 without arranging a transistor 112, capacitance element 114 and switch 120. The operation of the source-follower circuit of FIG. 8A is similar to the foregoing operation of FIGS. 1, 2A and 2B excepting that the switch 119 is on during a setting operation and off during an output operation, hence omittedly explained in this embodiment.

Figure 25A:
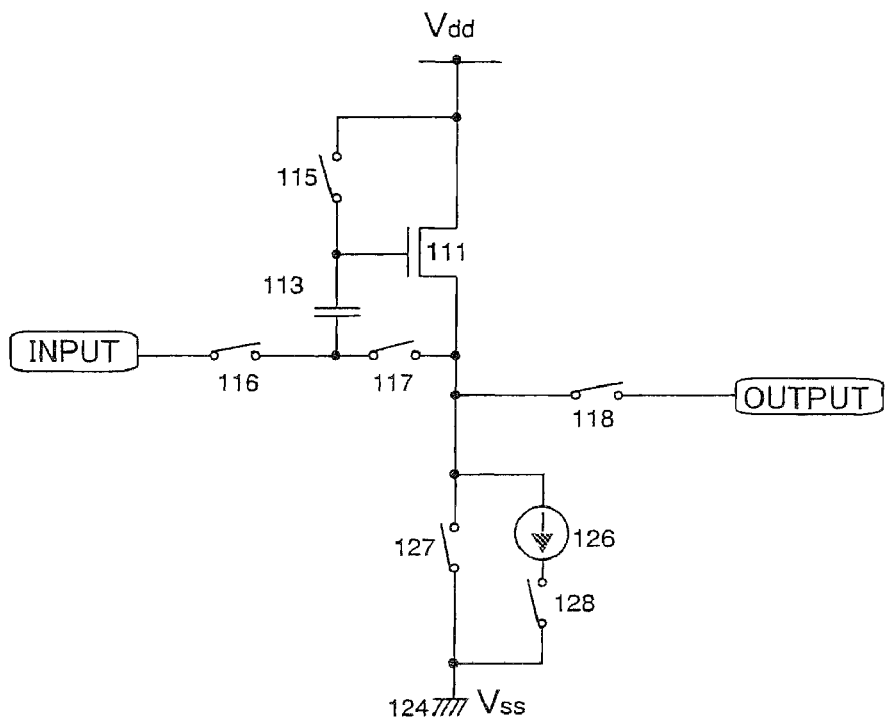
FIGS. 25A and 25B are diagrams showing a source-follower circuit of the invention.

In FIG. 8A, the switches 127, 128 and the current source 126 are connected to the power-source potential $V_{dd}$, similarly to FIG. 1. However, the switches 127, 128 and the current source 126 may be connected to another element, such as the ground potential $V_{ss}$, as shown in FIGS. 7A and 7B. FIG. 25A shows, as an example, a case that the switches 127, 128 and the current source 126 are connected to the ground potential $V_{ss}$.

Herein, FIG. 25A shows a source-follower circuit in a case not provided with the transistor 112. However, the transistor 112, in its nature, is a circuit to be operated as a current source for providing a bias in the source-follower circuit. Accordingly, the current source 126 in FIG. 25A may be operated as a current source to provide a bias in place of the transistor 112. Namely, the current source 126 may be used as a current source to set the transistor 111 during a setting operation and as a current source to supply a bias in the source-follower circuit during an output operation, instead of being used during a setting operation but not used during an output operation. In this case, there is no need for switching at between setting and output operations, thus eliminating the necessity of the switches 127, 128. The circuit diagram, in this case, is shown in FIG. 26A.

Figure 26A:
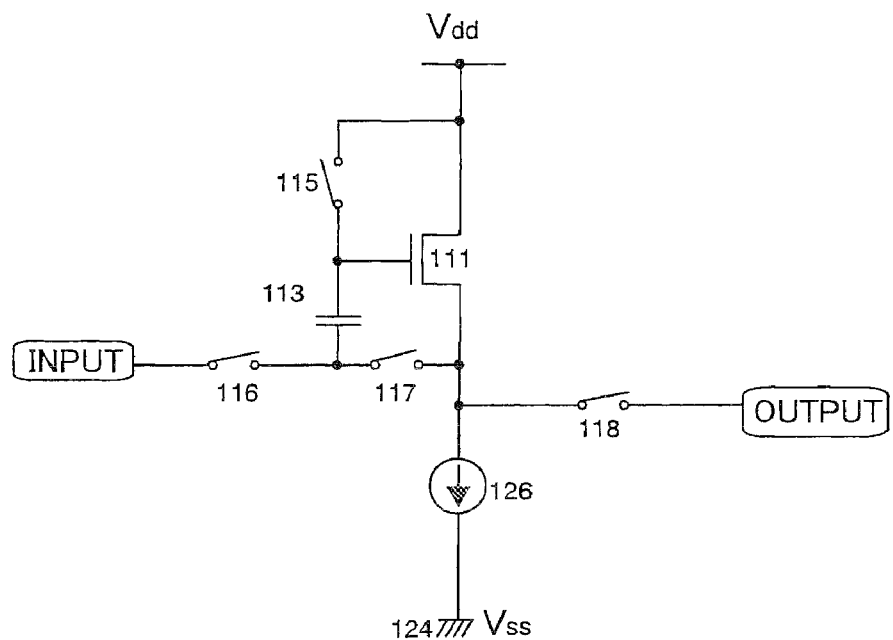
FIGS. 26A an 26B are diagrams showing a source-follower circuit of the invention.
Figure 27:
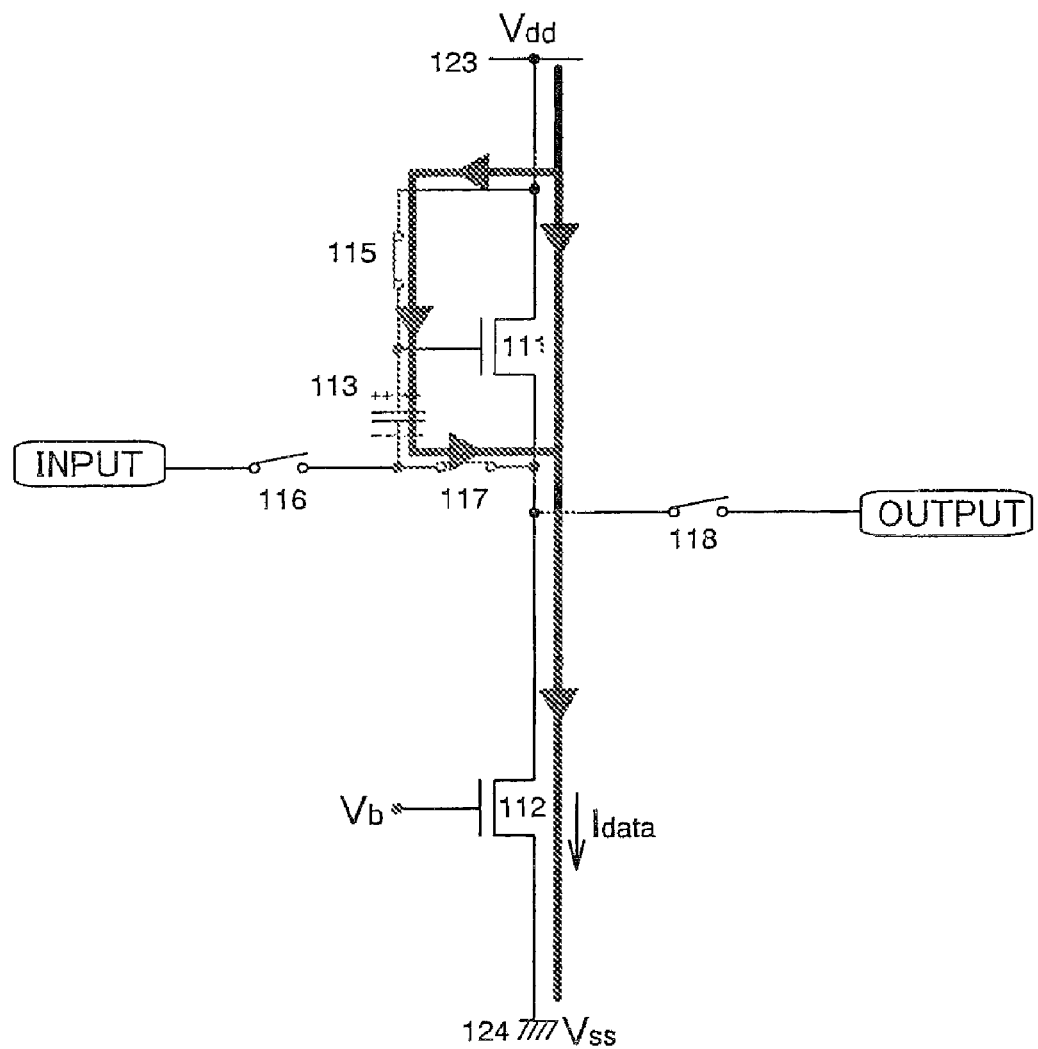
FIG. 27 is a diagram showing a source-follower circuit of the invention.

Meanwhile, there is shown, in FIG. 27, a circuit diagram that the current source of FIG. 26A is realized by a transistor. Next, the operation will be shown.

In FIG. 27, the switches 115, 117 are turned on. The other switches than the above are turned off. In this state, the signal current $I_{data}$ set in the transistor 112 flows in a direction toward the power line 124 through the capacitance element 113. The magnitude of the signal current $I_{data}$ is determined by a bias voltage Vb applied to the gate of the transistor 112 and a characteristic of the transistor 112. Accordingly, if there should be a plurality of circuits of FIG. 27, there is a possibility of variation in the characteristic of the transistor 112 in the plurality of circuits. In such a case, even if the same voltage Vb is applied to the gate of each transistor 112, the magnitude of signal current $I_{data}$ is different between the circuits.

At the instant of flowing current from the transistor 112, no charge is stored on the capacitance element 113. Consequently, the transistor 111 is off. The current flows in a direction toward the power line 124 from the transistor 112 through the switches 115, 117.

Charge is gradually built up on the capacitance element 113, and a potential difference begins to occur at between the both electrodes of the capacitance element 113. When the potential difference at between the electrodes of the capacitance element 113 becomes a threshold voltage $V_{th1}$ of the transistor 111, the transistor 111 turns on.

Then, charge storage is continued to the capacitance element 113 such that the gate-to-source voltage of the transistor 111 becomes a voltage capable of flowing a predetermined signal current $I_{data}$.

Figure 28A:
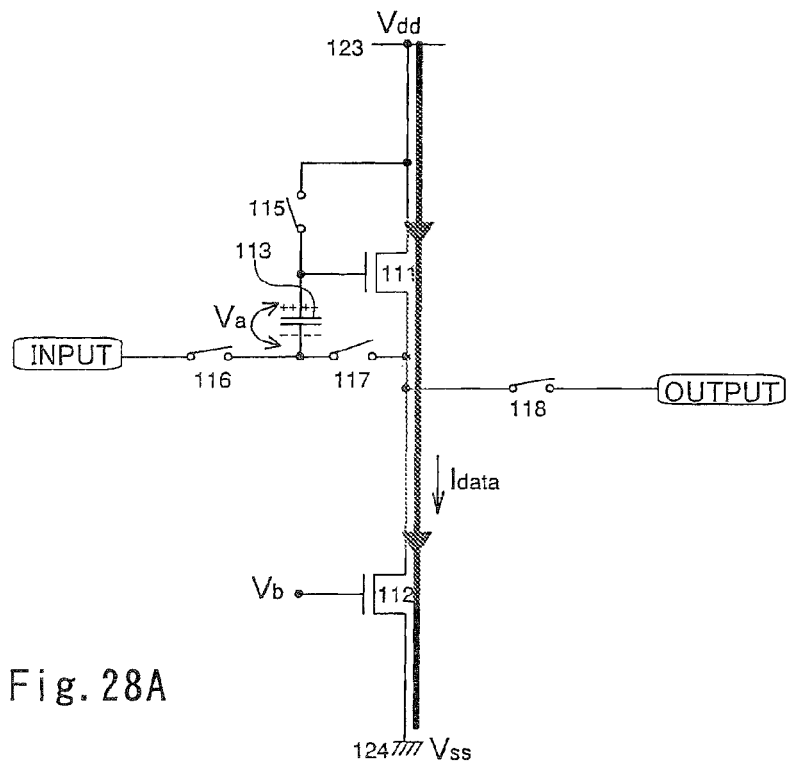
FIGS. 28A and 28B are diagrams showing a source-follower circuit of the invention.

As shown in FIG. 28A, when the capacitance element 113 is completed of charge storage into a steady state, the switches 115, 117 are turned from on to off while the other switches than these are kept in the state of FIG. 27. At this time, the signal current $I_{data}$ flowed from the transistor 112 flows from the drain to source region of the transistor 111. Incidentally, it is assumed that the potential difference at between the both electrodes of the capacitance element 113 is $V_a$.

If the circuit of FIG. 27 should exist in plurality, there is a possibility that the transistors 111, 112 have characteristic variation between the circuits. In this case, the magnitude of the signal current $I_{data}$ differs from circuit to circuit. Similarly, the potential difference $V_a$ at between the both electrodes of the capacitance element 113 is also differs from circuit to circuit.

Figure 28B:
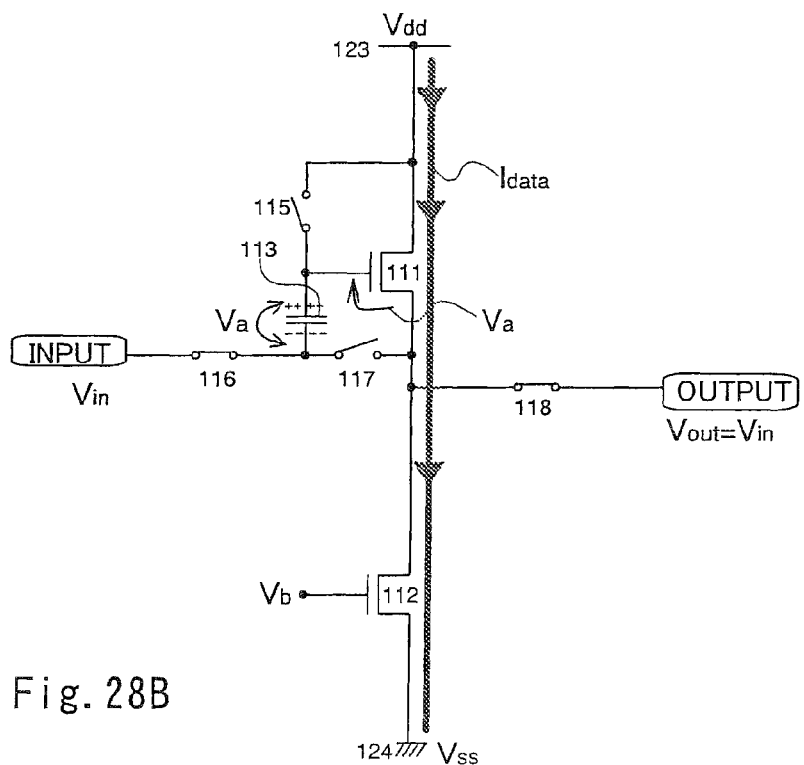

Subsequently, as shown in FIG. 28B, the switches 116, 118 are turned on. The other switches than the above are all turned off. At this time, an input potential $V_{in}$ is inputted from the input terminal through the switch 116 to one terminal of the capacitance element 113. By the charge conservation law, the gate electrode of the transistor 111 is applied by a value $(V_a+V_{in})$ that the input potential $V_{in}$ is added to the gate-to-source voltage $V_a$.

The output potential $V_{out}$ is at a potential on the source region of the transistor 111. Namely, the output potential $V_{out}$ corresponds to a value that the gate-to-source voltage $V_{gs}$ ($=V_a$) is subtracted from the gate potential $(V_{in}+V_a)$ of the transistor 111.

The signal current $I_{data}$ continues to flow through the transistor 111. This is because the gate voltage $V_b$ of the transistor 112 remains at the same value. Accordingly, the gate-to-source voltage $V_{gs}$ of the transistor 111 is also being applied by a voltage required for the transistor 111 to flow the signal current $I_{data}$. The required voltage is a voltage denoted by $V_a$. Accordingly, it can be seen that the gate-to-source voltage $V_{gs}$ of the transistor 111 is in the same value as $V_a$. Summarizing the above, Equation (4) is also held herein.

As shown in Equation (4), the output potential $V_{out}$ is in the same value as the input potential $V_{in}$, and not dependent upon the transistor characteristic. Consequently, if there is characteristic variation on the transistors 111 and 112, it is possible to suppress against an effect of characteristic variation upon the output potential $V_{out}$.

If the circuit of FIG. 27 should exist in plurality, there is a possibility that the characteristic of the transistor 112 or 111 varies between the circuits. In such a case, the magnitude of signal current $I_{data}$ and the electrode-to-electrode potential difference $V_a$ on capacitance element 113 are different between the circuits. However, as shown in Equation (4), the output potential $V_{out}$ is in the same value as the input potential $V_{in}$, and not dependent upon the magnitude of signal current $I_{data}$ and the electrode-to-electrode potential difference $V_a$ on the capacitance element 113. Namely, where the circuit of FIG. 27 is exists in plurality, even if the characteristic of the transistor 112 or 111 varies between the circuits, the affection thereof can be relaxed.

Because the invention can suppress the affection of characteristic variation of the transistors 111 and 112, there is no need to design the transistors 111 and 112 with the same value of gate length (L) and gate width (W). There is no problem if variation occurs.

Figure 26B:
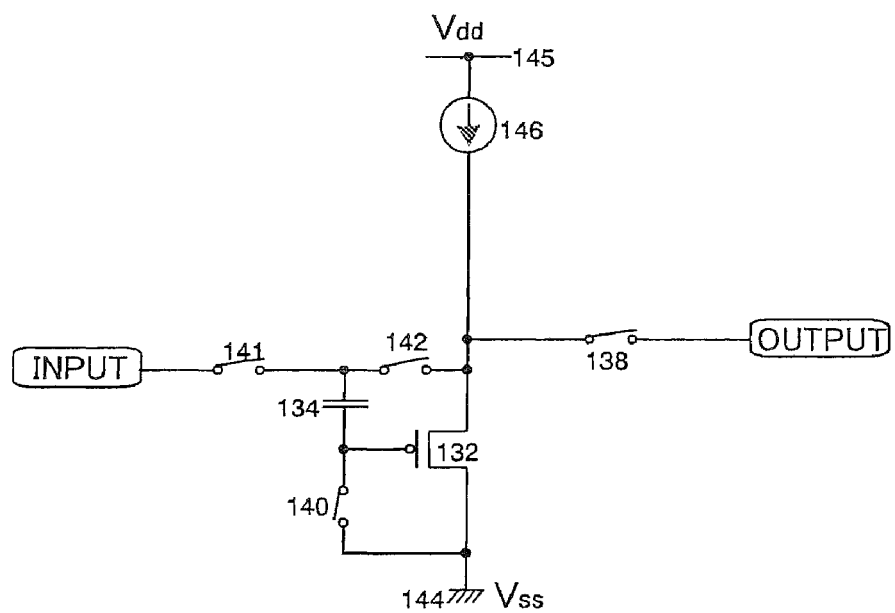

Next, comparison is made between a case to supply a current from an outside of the source-follower circuit as shown in FIG. 1 and a case to carry out also a setting operation by using a bias current source to the source-follower circuit as shown in FIGS. 26A and 26B.

Considering at first circuit configuration, the arrangement of FIGS. 26A and 26B is simpler and hence advantageous. Particularly, in the case of arranging a plurality of source-follower circuits, it is more advantageous. However, the arrangement of FIGS. 26A and 26B where there are a plurality of source-follower circuits, the current flowing through each circuit possibly differs in value due to the variation in the current source or the like. As a result, the input voltage and output voltage, when a steady state is reached, are equal on every source-follower circuit. However, there possibly occurs a case that transient characteristic is different between the source-follower circuits.

On the other hand, in the case of FIG. 1, circuit configuration is more complicated because of the necessity to supply a current from an outside of the source-follower circuit. Particularly, where a plurality of source-follower circuits are arranged, the circuit configuration thereof is further complicated. In the case that the current source 126 of FIG. 1 should be arranged one and the source-follower circuit is arranged in plurality, it is impossible to carry out setting operations simultaneously on all the source-follower circuits. Consequently, operation timing is complicated. Otherwise, in the case that the current source 126 of FIG. 1 is provided in the same number as the source-follower circuits, the current sources 126 desirably have no variations.

However, in the case there are a plurality of source-follower circuits, even if the source-follower circuits have variations in characteristic, there occurs no variation in the value of the current flowing through the source-follower circuit. This is because the current value is determined by the current source 126 provided outside the source-follower circuit. Therefore, there encounters no variation in transient characteristic, besides steady state characteristic, between the source-follower circuits.

In this manner, in the invention, even if there is a characteristic variation occurring between transistors, the transistor, to be inputted by a signal voltage of an input potential $V_{in}$ or the like, is inputted, without exception, by a value that the gate-to-source voltage of the transistor is added with the signal voltage. Accordingly, it is possible to provide an electric circuit suppressed against the affection of characteristic variation between transistors.

Embodiment 2

The source-follower circuit of FIGS. 1, 2A and 2B showed the configuration with the n-channel amplifier transistor 111 and the n-channel bias transistor 112. Next, this embodiment shows, in FIG. 9, a source-follower circuit configured with a p-channel amplifier circuit 132 and a p-channel bias transistor 131, the configuration of which will be explained. Note that the operation of the source-follower circuit of FIG. 9 is similarly to the operation of the source-follower circuit of FIGS. 1, 2A and 2B explained in Embodiment 1 and hence omittedly explained in this embodiment.

Figure 9:
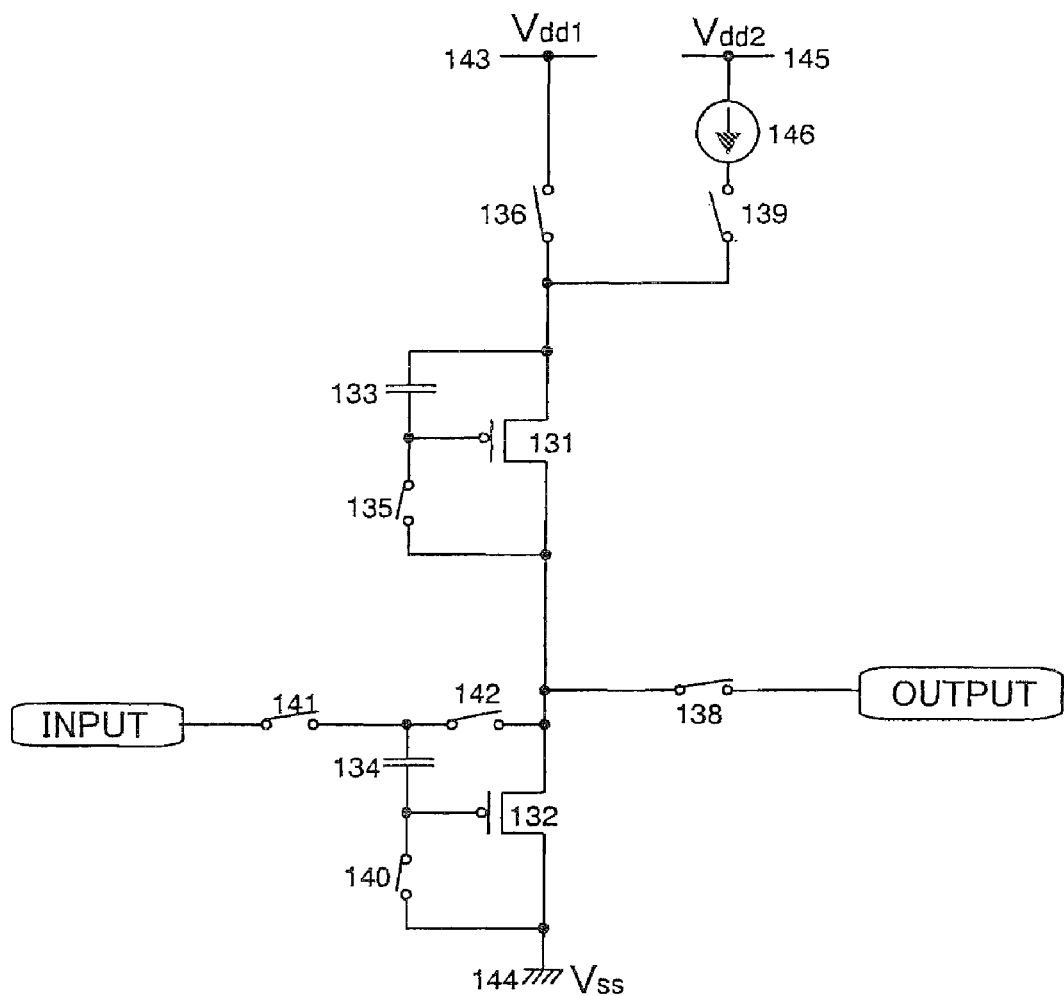
FIG. 9 is a diagram showing a source-follower circuit of the invention.

In FIG. 9, 131 is a p-channel bias transistor while 132 is a p-channel amplifier transistor. 133 and 134 are capacitance elements. Meanwhile, 135, 136, 138-142 are elements having switching functions, which preferably use semiconductor elements, such as analog switches, configured by transistors.

146 is a reference constant-current source having a capability to flow a constant current. The reference constant-current source 146 is configured by a semiconductor element, such as a transistor. In the present specification, the reference constant-current source 146 configured by a transistor will be explained in its one example in Embodiment 6. This can be made reference to conveniently.

143-145 are power lines. The power line 143 is applied with a power-source potential $V_{dd1}$ while the power line 144 is applied with a ground potential $V_{ss}$. The power line 145 is applied with a power source potential $V_{dd2}$. Incidentally, the power source potential $V_{dd1}$ applied to the power line 143 and the power source voltage $V_{dd2}$ applied to the power line 145 may be the same or different in value. However, the power source potential $V_{dd2}$ applied to the power line 145 is required to be set at a value that the reference constant-current source 146 is allowed to normally operate as a constant-current source. For example, where the reference constant-current source 146 utilizes a saturation region of a transistor to configure the current source, there is a need to set at a value that the transistor is allowed to operate in the saturation region.

Although this embodiment shows the case the amplifier transistor 132 and bias transistor 131 are of the p-channel type, the invention is not limited to this, i.e. the both transistors may be different in polarity to configure a push-pull circuit.

The bias transistor 131 has a source region connected to the power line 143 through the switch 136 and a drain region connected to the switches 135, 138, 142. The bias transistor 131 has a gate electrode connected to one terminal of the capacitance element 133. The other terminal of the capacitance element 133 is connected to the power line 143 through the switch 136. The capacitance element 133 has a role to hold a gate-to-source voltage of the bias transistor 131.

The amplifier transistor 132 has a drain region connected to the power line 144 and a source region connected to switches 138, 142. The amplifier transistor 132 has a gate electrode connected to one terminal of the capacitance element 134. The other terminal of the capacitance element 134 is connected to the source region of the amplifier transistor 132 through the switch 142. The capacitance element 134 has a role to hold a gate-to-source voltage of the amplifier transistor 132.

The switches 135, 136, 138-142 are controlled of conduction and non-conduction (on and off) according to an input signal. However, in FIG. 9, the signal lines or the like for inputting signals to the switches 135, 136, 138-142 are omittedly shown in order to simplify explanation.

In the source-follower circuit of FIG. 9, the switch 141 has one terminal serving as an input terminal. Through the input terminal, an input potential $V_{in}$ (signal voltage) is inputted to one terminal of the capacitance element 134. Meanwhile, the switch 138 has one terminal serving as an output terminal.

The potential on the source region of the amplifier transistor 132 provides an output potential $V_{out}$.

Although the electric circuit shown in FIGS. 1, 2A and 2B is a source-follower circuit, there is no provision of an input terminal for inputting a bias potential. This is because predetermined charge is already held on the capacitance element 114 to flow the signal current $I_{data}$ set by the reference constant-current source 126 through the gate to source of the transistor 131.

Because the invention can suppress against the affection of characteristic variation of the bias transistor 131 and amplifier transistor 132, there is no need to design the bias transistor 131 and amplifier transistor 132 with the same value of gate length (L) and gate width (W). There is no problem if variation occurs.

Although the connection in FIG. 9 is in the order of the power line 145, the reference constant-current source 146 and the switch 139, the invention is not limited to this. The connection may be in the order of the power line 145, the switch 139 and the reference constant-current source 146 by reversing the reference constant-current source 146 and the switch 139.

Meanwhile, by referring to the foregoing Embodiment 1 and FIGS. 7A and 7B, the reference constant-current source 146 may be arranged at between the switch 140 and the power line 144. Furthermore, the reference constant-current source 146 may be arranged at between the switch 138 and the switch 142.

Figure 8B:
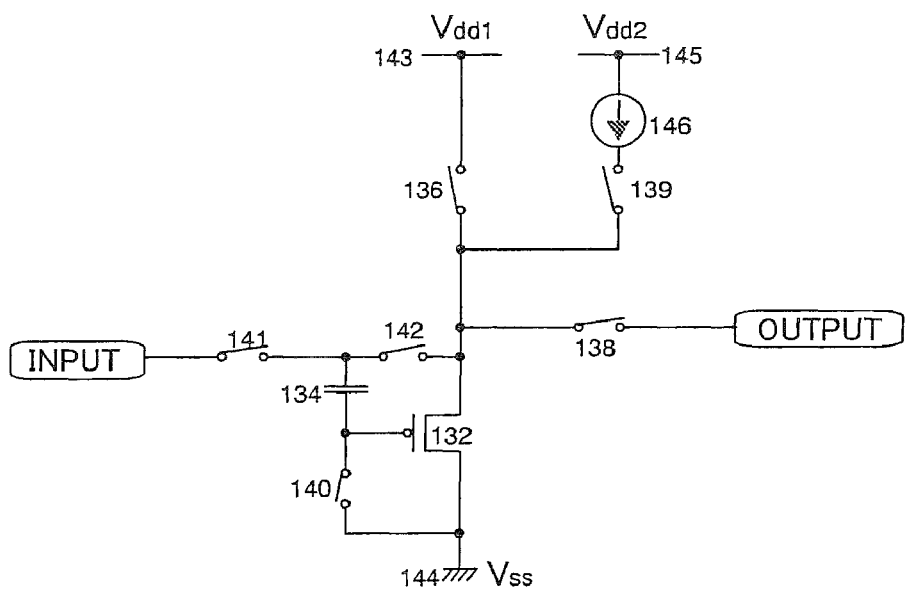

FIG. 8B shows a source-follower circuit in a case not provided with the bias transistor 131, the capacitance element 133 and the switch 135. The operation of the source-follower circuit of FIG. 8B is similar to the foregoing operation of FIGS. 1, 2A and 2B in Embodiment 1, and hence omittedly explained in this embodiment.

Figure 25B:
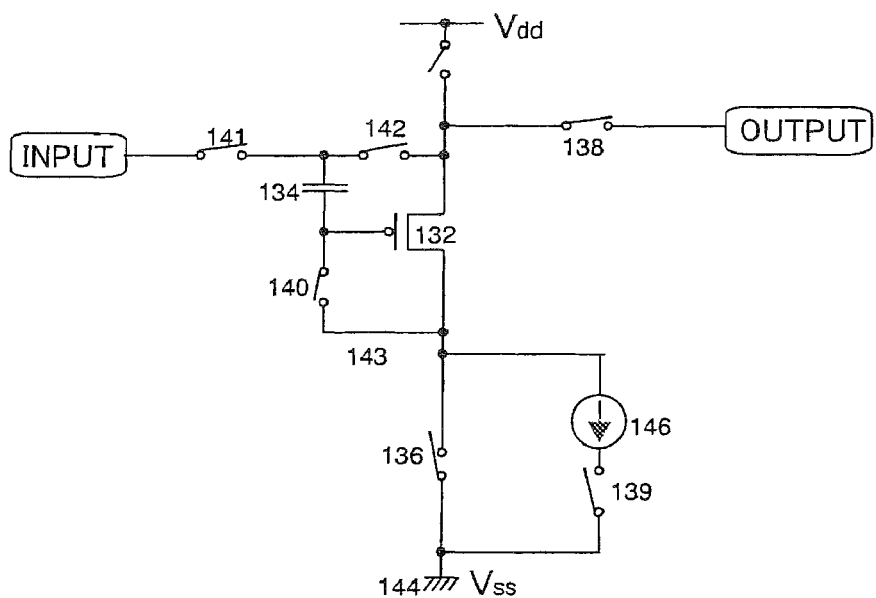

In FIG. 8B, the switch 136, the switch 139 and the current source 146 are connected to the power-source potential $V_{dd}$, similarly to FIG. 1. However, the switch 136, the switch 139 and the current source 146 may be connected to another power line or element, such as the ground potential $V_{ss}$, as in FIG. 7A or 7B. FIG. 25B shows, as an example, a case that the switch 136, the switch 139 and the current source 146 are connected to the ground potential $V_{ss}$.

Herein, FIG. 8B shows the source-follower circuit in the case the transistor 131 is not provided. However, the transistor 131, in its nature, is a circuit to be operated as a current source for providing a bias in the source-follower circuit. Accordingly, the current source 146 in FIG. 8B may be operated as a current source for providing a bias in place of the transistor 131. Namely, the current source 146 may be used as a current source to set the transistor 132 during a setting operation and as a current source to supply a bias in the source-follower circuit during an output operation, instead of being used during a setting operation but not used during an output operation. In such a case, there is no need for switching between a setting operation and an output operation, thus eliminating the necessity of the switches 136, 139. The circuit diagram, in this case, is shown in FIG. 26B.

Figure 29:
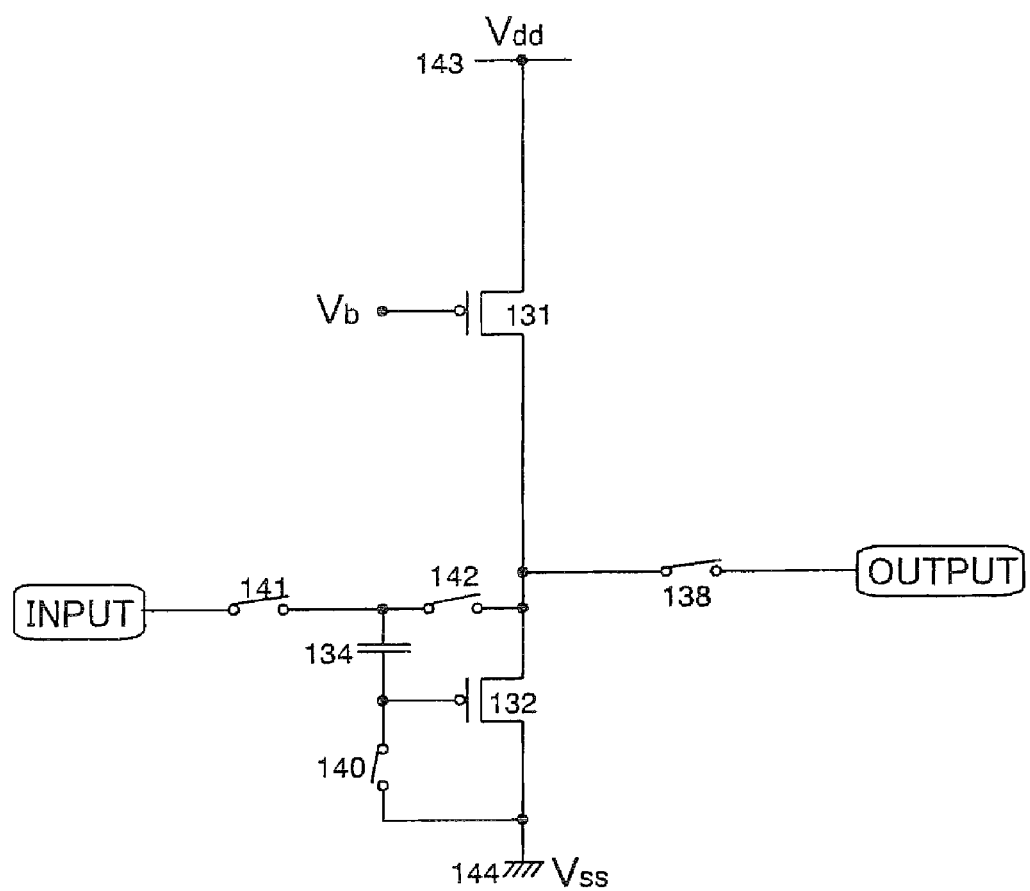
FIG. 29 is a diagram showing a source-follower circuit of the invention.

In FIG. 29 is shown a circuit diagram in a case that the current source 146 of FIG. 26B is realized by a transistor. The operation of the source-follower circuit of FIG. 29 is similar to the foregoing operation of FIG. 27 or 28 in Embodiment 1, and hence omittedly explained in this embodiment.

This embodiment can be desirably combined with Embodiment 1.

Embodiment 3

The foregoing Embodiments 1, 2A and 2B explained the source-follower circuits to which the invention is applied. However, the invention is applicable to various circuits, including a differential amplifier circuit, a sense amplifier and an operation amplifier. This embodiment explains an operating circuit the invention is applied, by using FIGS. 10 to 13.

Figure 10:
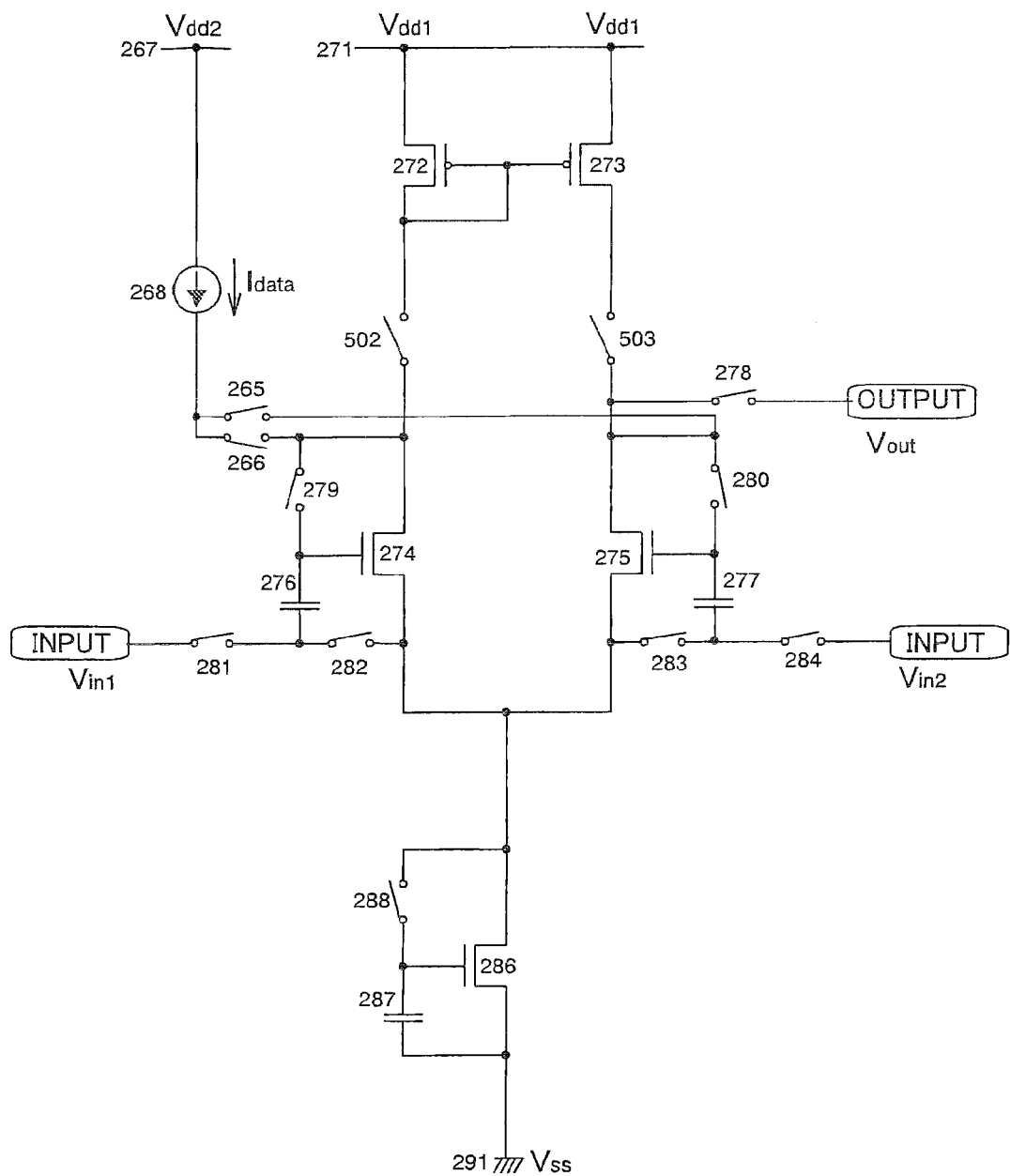
FIG. 10 is a diagram showing a differential amplifier circuit of the invention.

First explained is a differential amplifier circuit the invention is applied, by using FIG. 10. FIG. 10 corresponds to a case arranged with a reference constant-current source 268 besides the native circuit similarly to FIG. 1. The differential amplifier circuit carries out an operation on a difference between an input potential $V_{in1}$ and an input potential $V_{in2}$, to output an output potential $V_{out}$.

In the differential amplifier circuit of FIG. 10, 272, 273 are p-channel transistors while 274, 275 and 286 are n-channel transistors. 276, 277 and 278 are capacitance elements. Meanwhile, switches 265, 266, 278-284, 288, 502 and 503 are elements having switching functions, which preferably use semiconductor elements, such as transistors. The semiconductor elements are not especially limited in polarity.

268 is a reference constant-current source having a capability to flow a constant current. The reference constant-current source 268 is configured by a semiconductor element, such as a transistor. In the present specification, the reference constant-current source 268 configured by a transistor will be explained in its one example in Embodiment 6. This can be made reference to conveniently.

267, 271 and 291 are power lines. The power line 271 is applied with a power source potential $V_{dd1}$ while the power line 291 is with a ground potential $V_{ss}$. The power line 267 is applied with a power source potential $V_{dd2}$. The power source potential $V_{dd1}$ applied to the power line 271 and the power source potential $V_{dd2}$ applied to the power line 267 may be the same or different in value. However, the power source potential $V_{dd2}$ applied to the power line 267 is required to be set at a value that the reference constant-current source 268 is allowed to normally operate as a constant-current source. For example, where the reference constant-current source 268 utilizes a saturation region of a transistor to configure the current source, there is a need to set at a value that the transistor is allowed to operate in the saturation region.

In the differential amplifier circuit of FIG. 10, the switch 281 has one terminal serving as an input terminal. An input potential $V_{in1}$ is inputted to one terminal of the capacitance element 276. Meanwhile, the switch 284 has one terminal serving as an input terminal. An input potential $V_{in2}$ is inputted to one terminal of the capacitance element 277. Also, the transistor 275 has a drain region made as an output terminal so that the potential on the drain region of the transistor 275 provides an output potential $V_{out}$.

Figure 30:
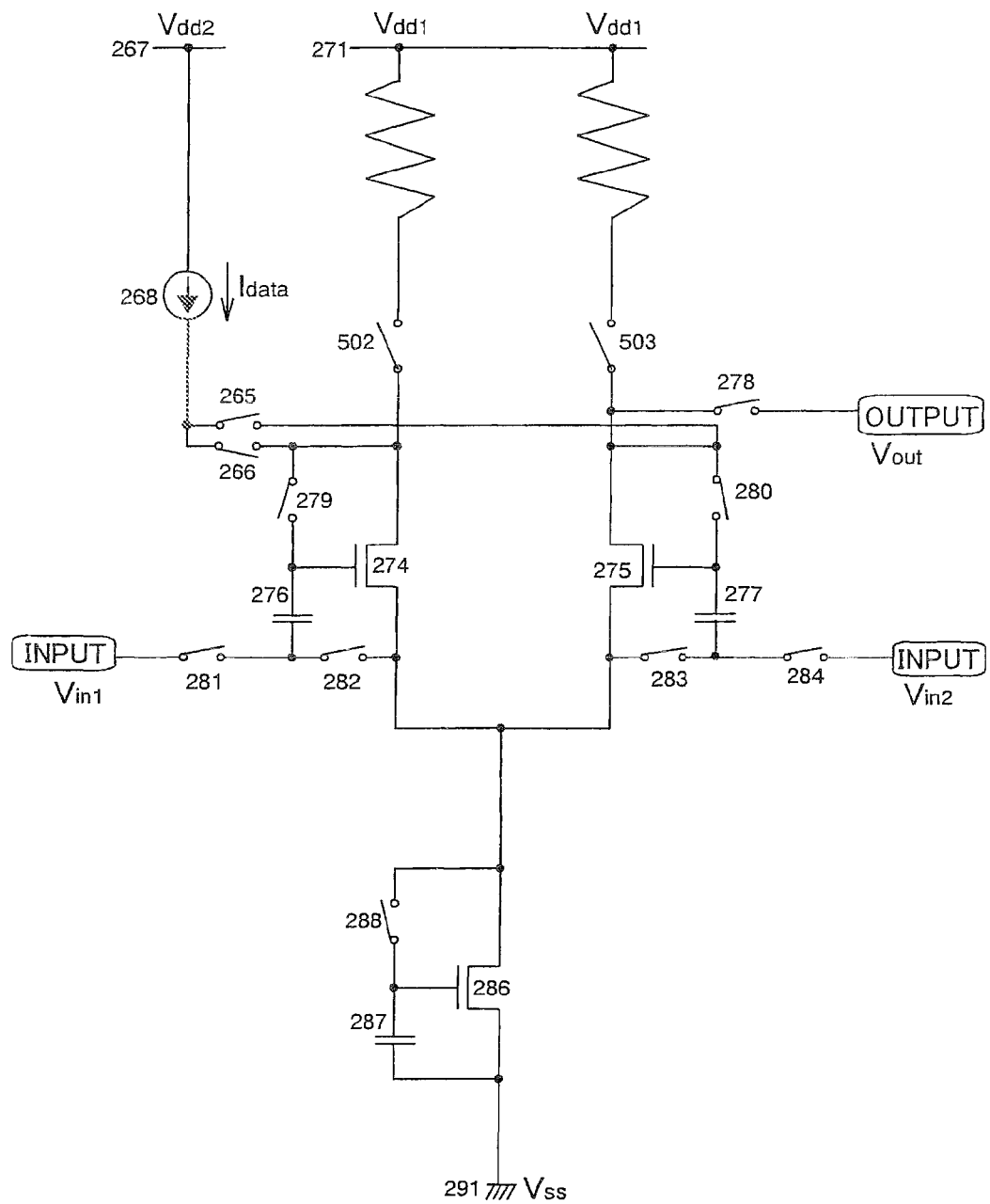
FIG. 30 is a diagram showing a differential amplifier circuit of the invention.

The transistor 272 has a drain region connected to the power line 271 and a source region connected to a drain region of the transistor 274 through the switch 502. The transistor 273 has a drain region connected to the power line 271 and a source region connected to a drain region of the transistor 275 through the switch 503. The gate electrode of the transistor 272 and the date electrode of the transistor 273 are connected together. Incidentally, resistances may be arranged in place of the transistors 272 and 273. This is because, in the differential amplifier circuit as in FIG. 10, 272, 273 are parts called active loads to be operated as resistances. Consequently, the parts of active loads in FIG. 10 may be configured by usual resistance elements as in FIG. 30.

The transistor 274 has a drain region connected to the power line 271 through the switch 502 and transistor 272, and a source region connected to one terminal of the capacitance element 276 through the switch 282. The transistor 274 has a gate electrode connected to the other terminal of the capacitance element 276. The capacitance element 276 plays a role to hold a gate-to-source voltage of the transistor 274 when carrying out a setting operation.

The transistor 275 has a drain region connected to the power line 272 through the switch 503 and transistor 273, and a source region connected to one terminal of the capacitance element 277 through the switch 283. The transistor 275 has a gate electrode connected to the other terminal of the capacitance element 277. The capacitance element 277 plays a role to hold a gate-to-source voltage of the transistor 275 when carrying out a setting operation.

The transistor 286 has a drain region connected to the source region of the transistor 274 and to the source region of the transistor 275. The transistor 286 has a source region connected to one terminal of the capacitance element 287. The gate electrode of the transistor 286 is connected to the other terminal of the capacitance element 287. The capacitance element 287 plays a role to hold a gate-to-source voltage of the transistor 286.

Predetermined charge is held onto the capacitance elements 276, 277 and 287 by the use of the reference constant-current source 268. However, predetermined charge cannot be held, at one time, onto the three capacitance elements 276, 277 and 287. For this reason, it is carried out under control such that one of the switches 265 and 266 is turned on. For example, when the switch 265 is turned on, the switch 266 is turned off. Then, predetermined charge is held onto the capacitance elements 277, 287. Similarly, the switch 265 is turned off and the switch 266 is turned on. Then, predetermined charge is held onto the capacitance elements 276, 287.

Incidentally, the explanation of the operation during holding predetermined charge on the capacitance elements 276, 277 and 287 by using the reference constant-current source 268 is similar to that of Embodiment 1, and hence omittedly explained in this embodiment.

After completing the holding of predetermined charge on the capacitance element 276, an input potential $V_{in1}$ is inputted to one terminal of the capacitance element 276. Also, after completing the holding of predetermined charge on the capacitance element 277, an input potential $V_{in2}$ is inputted to one terminal of the capacitance element 277 to carry out an output operation. The operation in this case is similar to that of Embodiment 1 and hence omittedly explained in this embodiment.

Figure 31:
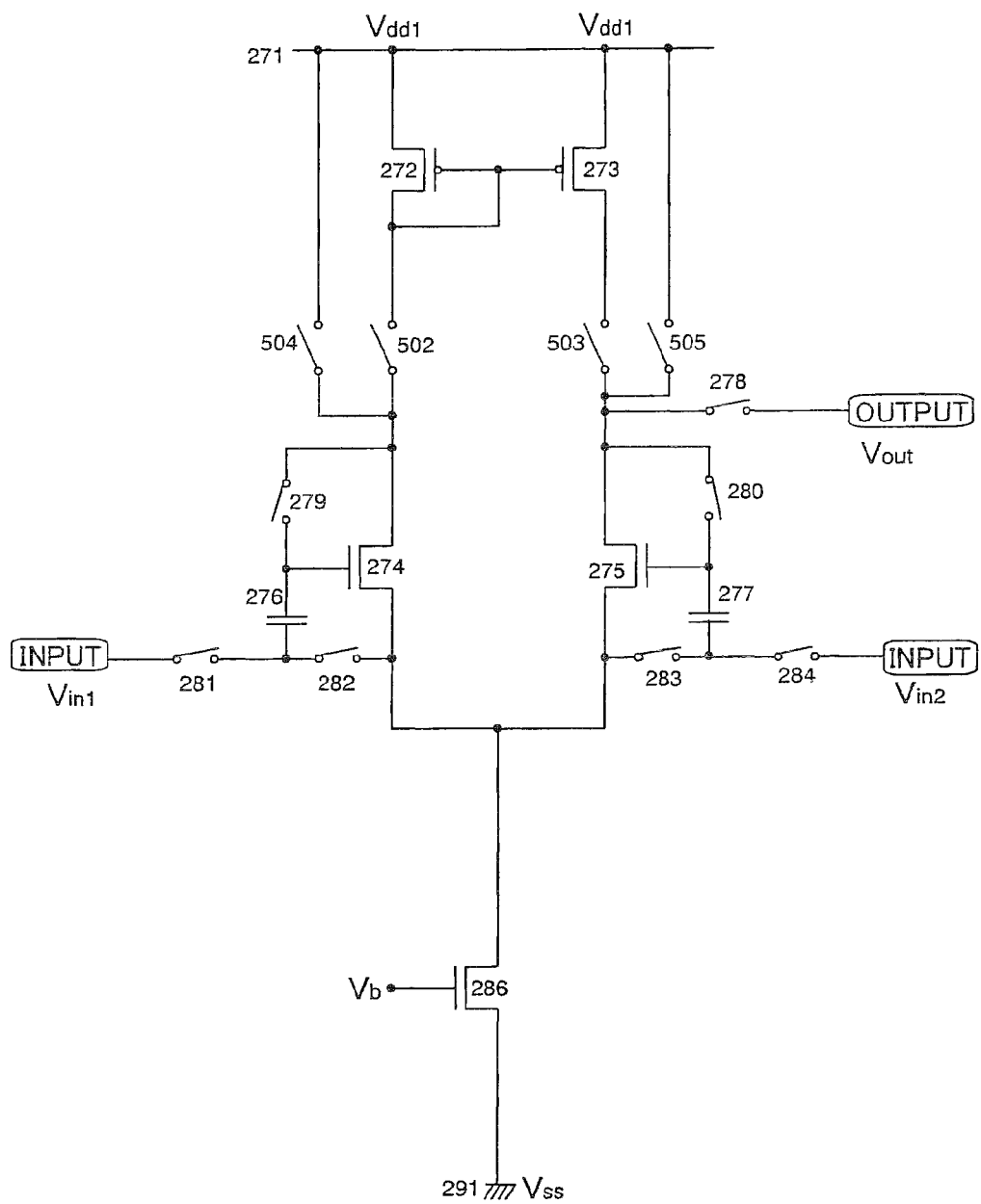
FIG. 31 is a diagram showing a differential amplifier circuit of the invention.

Next, explanation is made on a differential amplifier circuit to which is applied a circuit that a setting operation is carried out by utilizing a current source possessed by the native circuit as in FIGS. 26 and 27, by using FIG. 31.

FIG. 10 used a current supplied, as a current during a setting operation, from the current source 268. In FIG. 31, a setting operation is made by using the transistor 286. The transistor 286 operates as a current source, which determines a magnitude of current depending upon a bias voltage $V_b$ applied to the gate thereof.

Figure 32:
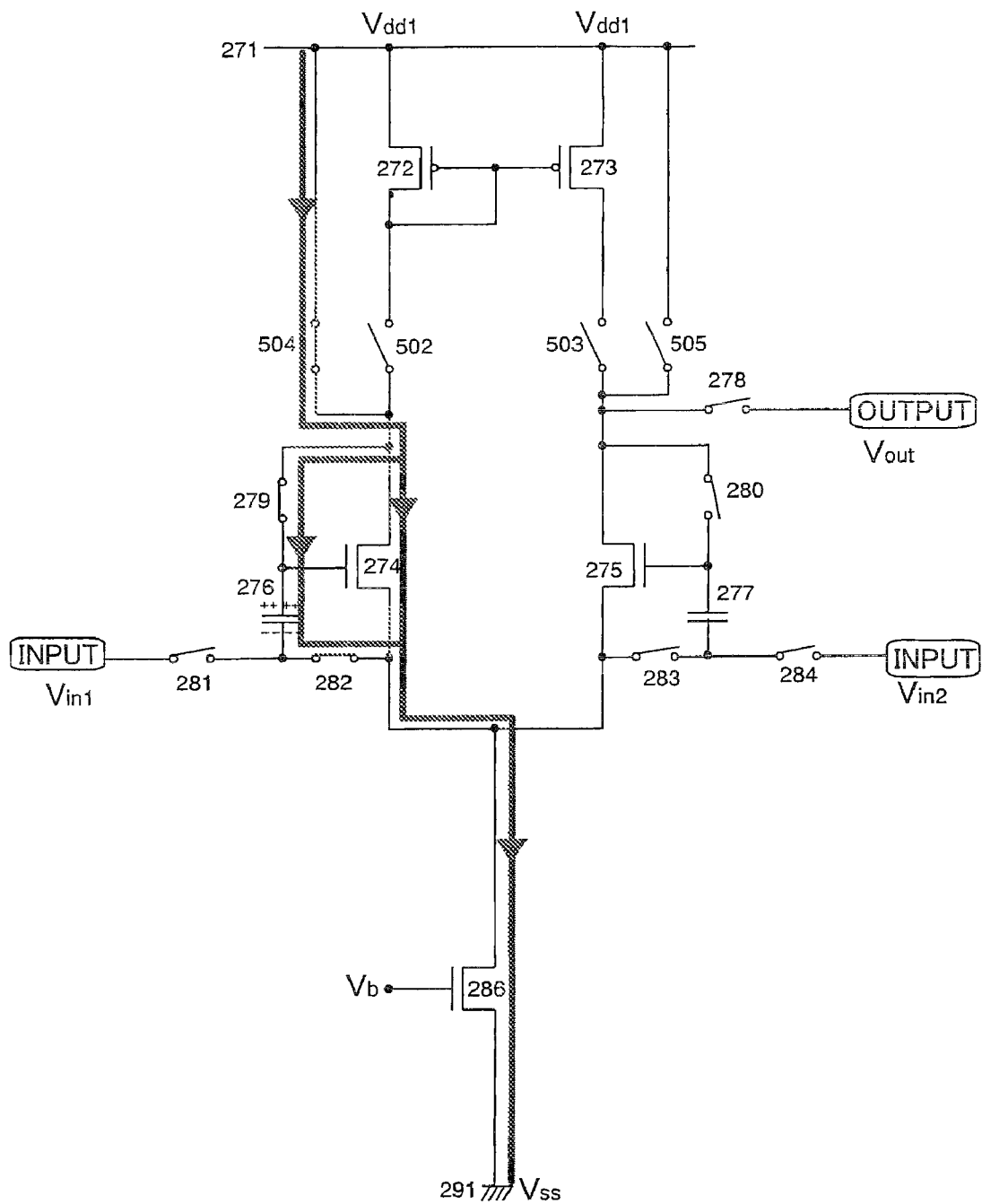
FIG. 32 is a diagram showing a differential amplifier circuit of the invention.
Figure 33:
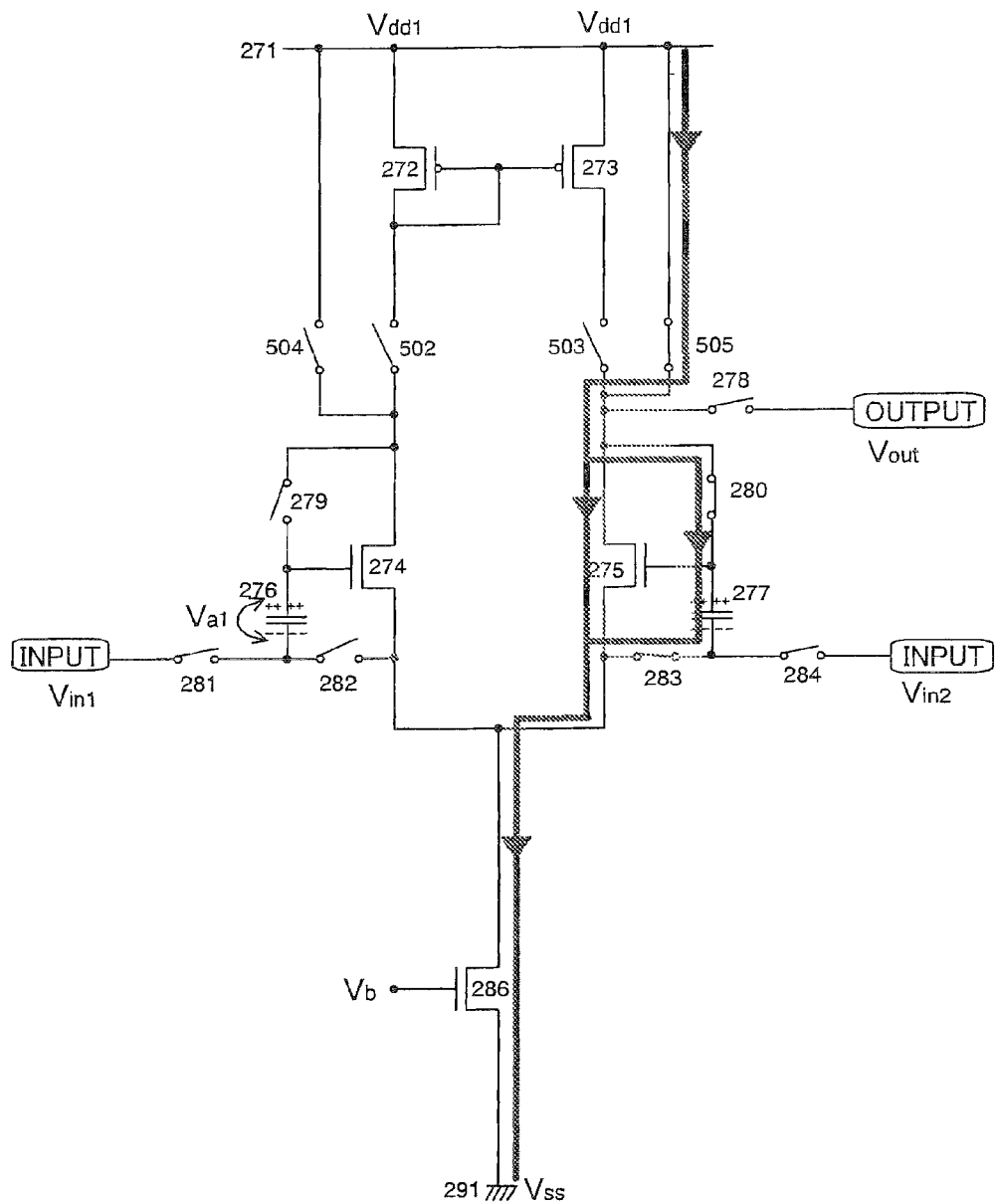
FIG. 33 is a diagram showing a differential amplifier circuit of the invention.
Figure 34:
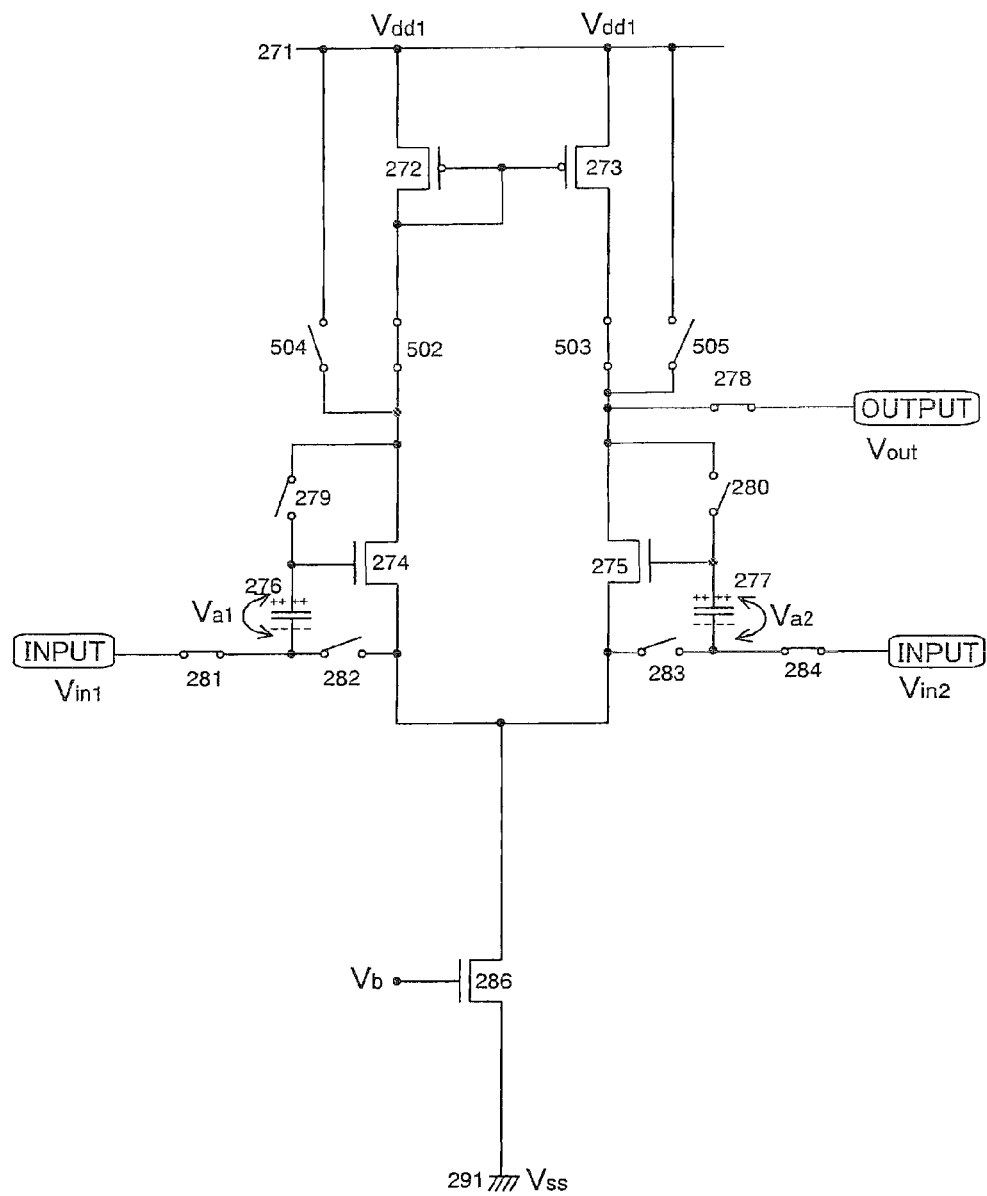
FIG. 34 is a diagram showing a differential amplifier circuit of the invention.

Next described is the operation. First, as shown in FIG. 32, the switches 504, 279, 282 are turned on while the other switches than those are turned off. Thereupon, a current flows toward the transistor 274, thus allowing a setting operation for the transistor 274. Next, as shown in FIG. 33, the switches 505, 280, 283 are turned on while the other switches than those are turned off. Thereupon, a current flows toward the transistor 275, thus allowing a setting operation for the transistor 275. This completes the setting operation. Consequently, as shown in FIG. 34, the switches 502, 503, 281, 284 are turned on while the other switches are turned off. Then, a normal operation is carried out.

Incidentally, it is possible to omit the switch 504 by turning on the switch 502 during a setting operation of the transistor 274.

Meanwhile, the voltage to be applied to the gate of the transistor 286 may be changed upon between a setting operation and a usual operation (output operation). Usually, the transistor 274 and the transistor 275, in many cases, have nearly the same amount of flowing current in the differential amplifier circuit. Accordingly, in the case of carrying out a setting operation, the setting operation is preferably done under the condition approximate to that of a usual operation (output operation). This provides for higher accuracy. Accordingly, by adjusting the voltage to be applied to the gate of the transistor 286, it is preferred to flow a current in a half amount of that of a usual operation (output operation) during a setting operation.

Figure 35:
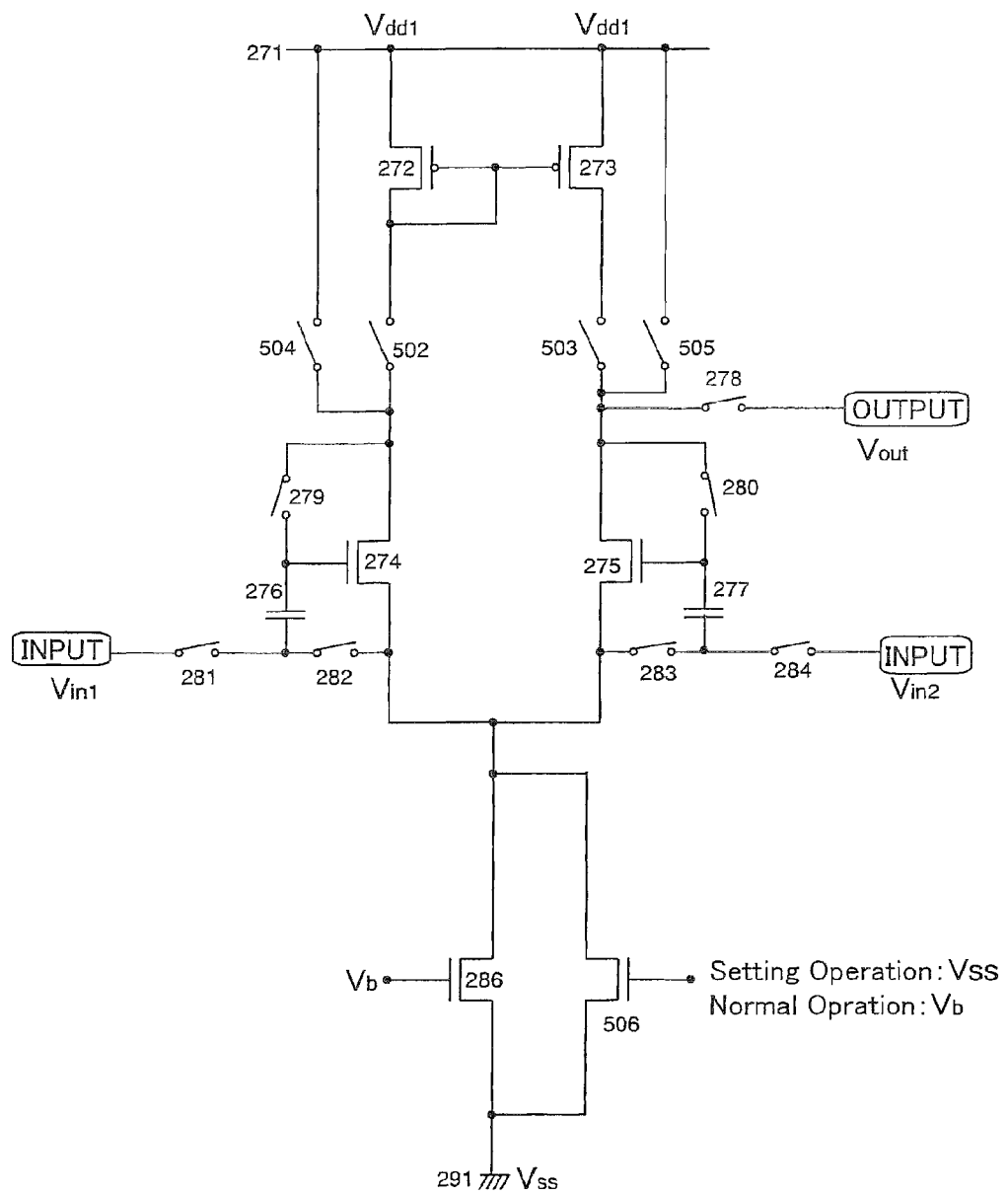
FIG. 35 is a diagram showing a differential amplifier circuit of the invention.

Consequently, FIG. 35 shows a diagram in a case that a transistor 506 is arranged parallel with the transistor 286 as another method for obtaining the similar effect. The transistor 506 is desirably in a size made the same as the transistor 286. During a usual operation, the gate of the transistor 506 is applied by a voltage same as that of the transistor 286. During a setting operation, a current is not allowed to flow through the transistor 506.

Figure 36:
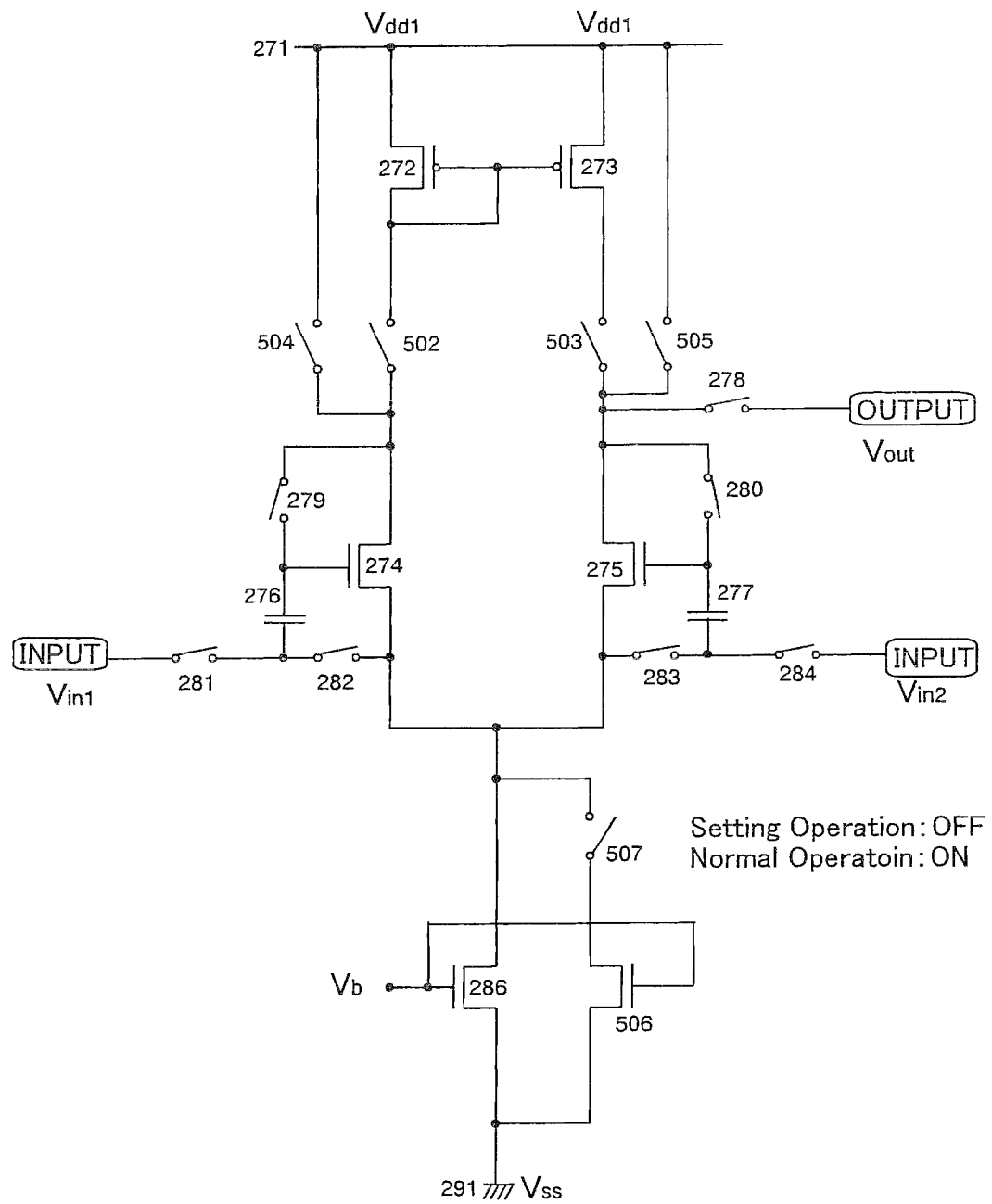
FIG. 36 is a diagram showing a differential amplifier circuit of the invention.

FIG. 36 shows a circuit diagram in a case the magnitude of a current is changed upon between a usual operation and a setting operation by the switch 507, as a circuit similar to that of FIG. 35. During a setting operation, the switch 507 is turned off thereby reducing the amount of current to a half. During a usual operation, the switch 507 is turned on. This can carry out a setting operation in a state approximate to a state of an actual operation, thus enhancing the effect of setting operation.

Subsequently, explanation is made on a case that the transistor constituting the differential amplifier circuit of FIG. 10 has an opposite conductivity type, by using FIG. 11.

Figure 11:
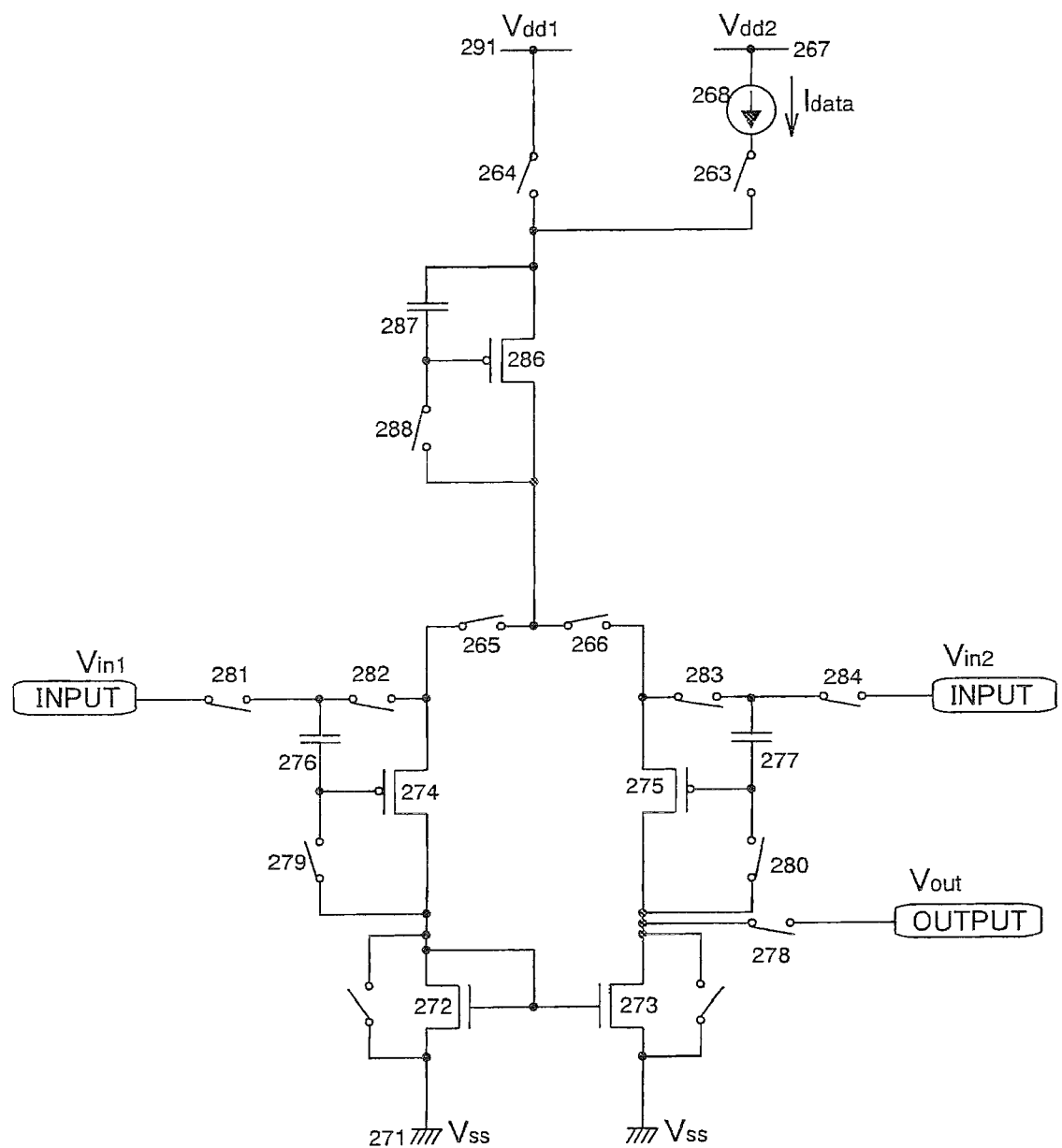
FIG. 11 is a diagram showing a differential amplifier circuit of the invention.

In the differential amplifier of FIG. 11, reference numerals 272, 273 are n-channel transistors while reference numerals 274, 275 and 286 are p-channel transistors. The switch 281 has one terminal as an input terminal to input an input potential $V_{in1}$ to one terminal of the capacitance element 276. Also, the switch 284 has one terminal as an input terminal to input an input potential $V_{in2}$ to one terminal of the capacitance element 277. The potential on the source region of the transistor 275 provides an output potential $V_{out}$.

Incidentally, the differential amplifier circuit of FIG. 11 is similar in configuration and operation to the differential amplifier circuit of FIG. 10 excepting that a power source potential $V_{dd1}$ is applied to the power line 291, a power source potential $V_{dd2}$ is applied to the power line 267 and a ground potential $V_{ss}$ is applied to the power line 271, and hence omittedly explained.

Incidentally, the differential amplifier circuit of FIG. 10 or 11 is different in position arranging the reference constant-current source 268. The invention is not limited in position arranging the reference constant-current source 268 but requires to satisfy the following condition.

It was mentioned in the foregoing that holding predetermined charge on the capacitance elements 276, 277, 287 by using the reference constant-current source 268 is under control of the switches 265 and 266. Namely, when the capacitance element 276 holds predetermined charge under control of the switches 265 and 266, there is a need not to flow a current to the capacitance element 277 and transistor 275. Similarly, when the capacitance element 277 holds predetermined charge, there is a need not to flow a current to the capacitance element 276 and transistor 274.

Namely, there is a need to arrange the reference constant-current source 268 and the switches 265, 266, in order for the two capacitance elements 276, 277 not to simultaneously hold predetermined charge. Also, there is a necessity to additionally arrange switches as required.

Considering the above, the arrangement position of the reference constant-current source 268 and switches 265, 266 is not limited to the point shown in FIG. 10 or 11. For example, in FIG. 11, the switch 265 may be arranged between the power line 271 and the source region of the transistor 272 while the switch 266 be between the power line 271 and the source region of the transistor 273. Also, the switch 265 may be arranged between the drain region of the transistor 272 and the switch 279 while the switch 266 be between the drain region of the transistor 273 and the switch 280.

Figure 37:
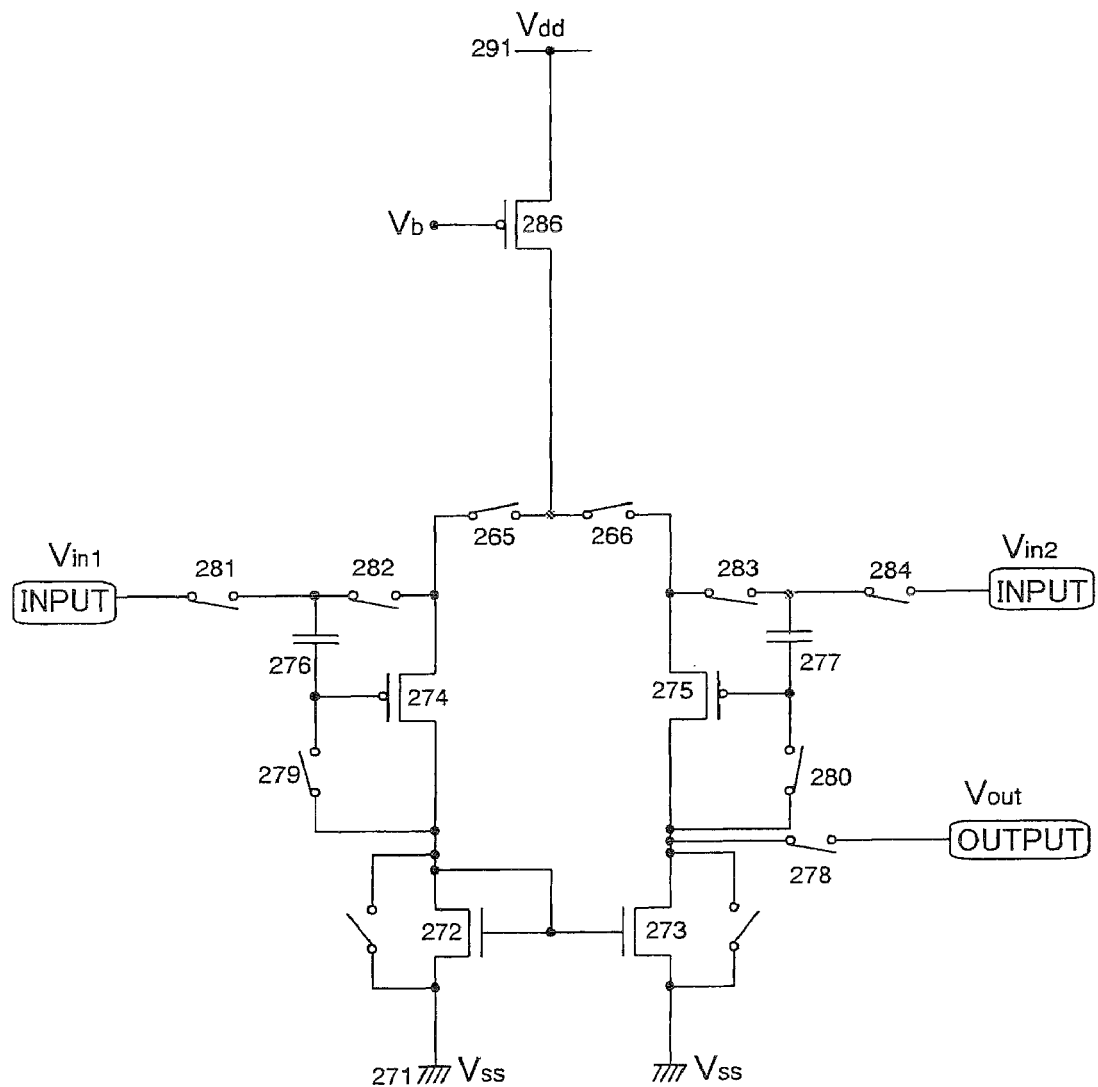
FIG. 37 is a diagram showing a differential amplifier circuit of the invention.

Next, FIG. 37 shows a case that the transistor configuring the differential amplifier circuit of FIG. 31 has an opposite conductivity type. This is also similar in configuration and operation to the differential amplifier circuit of FIG. 31, and hence omittedly explained herein.

Incidentally, the current value in the current-source part, in FIG. 37, can be similarly controlled by providing an arrangement as in FIG. 35 or 36.

Although this embodiment showed the electric circuit of FIG. 10 or 11 as a differential amplifier circuit, the invention is not limited to this. It is possible to use it as another operating circuit, such as a sense amplifier, by properly changing the voltage to be inputted as an input potential $V_{in1}$ and input potential $V_{in2}$.

Next, an operational amplifier the invention is applied is explained, by using FIGS. 12A, 12 B, 13A and 13B. FIG. 12A shows circuit symbols concerning an operational amplifier while FIG. 12B shows a circuit configuration of the operational amplifier.

It is noted that there are various operational-amplifier circuit configurations. Consequently, In FIGS. 12A and 12B, described is a case that a differential amplifier circuit is combined with a source-follower circuit, as the simplest case. Hence, the operational-amplifier circuit configuration is not limited to FIGS. 12A and 12B.

The operational amplifier is defined in its characteristic by a relationship between an input potential $V_{in1}$ and input potential $V_{in2}$ and an output potential $V_{out}$. More specifically, the operational amplifier has a function to multiply an amplification degree A on a difference between an input potential $V_{in1}$ and an input potential $V_{in2}$, to output an output potential $V_{out}$.

In the operational amplifier shown in FIG. 12B, a switch 281 has one terminal as an input terminal to input an input potential $V_{in1}$ to one terminal of a capacitance element 276. A switch 284 has one terminal as an input terminal to input an input potential $V_{in2}$ to one terminal of a capacitance element 277. The potential on a source region of a transistor 292 provides an output potential $V_{out}$.

In the circuit of FIG. 12B, the region surrounded by the dotted line shown at 305 has the same configuration as the differential amplifier circuit of FIG. 10. Furthermore, the region surrounded by the dotted line shown at 306 is the same as the source-follower circuit of FIGS. 1, 2A and 2B. Hence, the detailed configuration of the operational amplifier of FIG. 12B is omittedly explained.

In FIG. 12B, the current source 268 is commonly used by the differential amplifier circuit 305 and the source-follower circuit 306.

Figure 38:
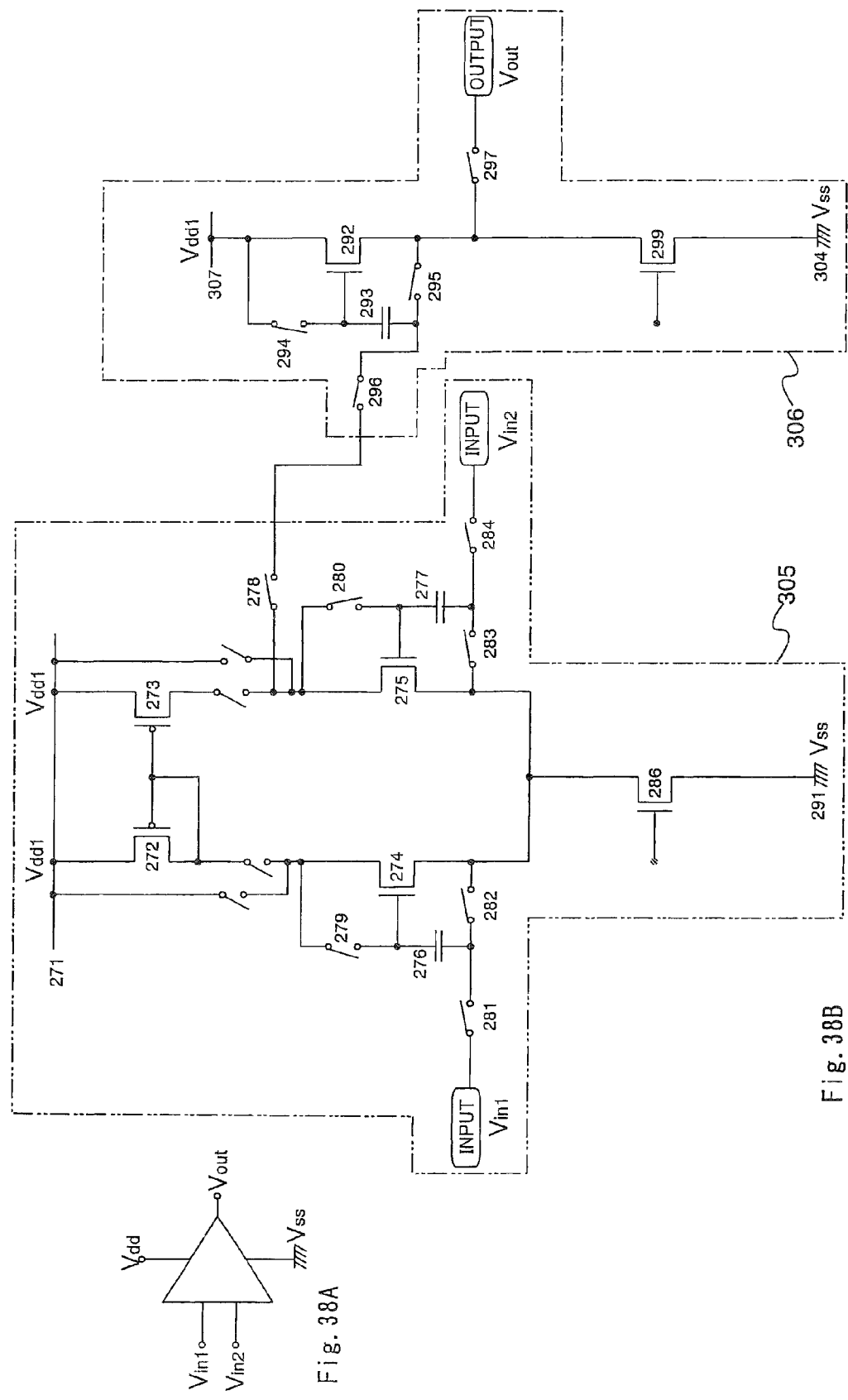
FIGS. 38A and 38B are diagrams showing an operational amplifier of the invention.

Accordingly, FIGS. 38A and 38B show an operational amplifier in a case that the region surrounded by the dotted line shown at 305 uses the same configuration as the differential amplifier circuit of FIG. 31 while the region surrounded by the dotted line shown at 306 uses the same configuration as the source-follower circuit of FIG. 27.

Meanwhile, FIGS. 13A and 13B show an operational amplifier in a case the transistor 299 is a p-channel transistor. Namely, this corresponds to a case using a push-pull circuit. FIG. 13B is the same in configuration as the operation amplifier of FIG. 12B excepting that a capacitance element 300, at one terminal, is connected to the drain region of the transistor 275 through the switches 302, 278. Hence, this embodiment omittedly explains a detailed configuration.

Figure 39:
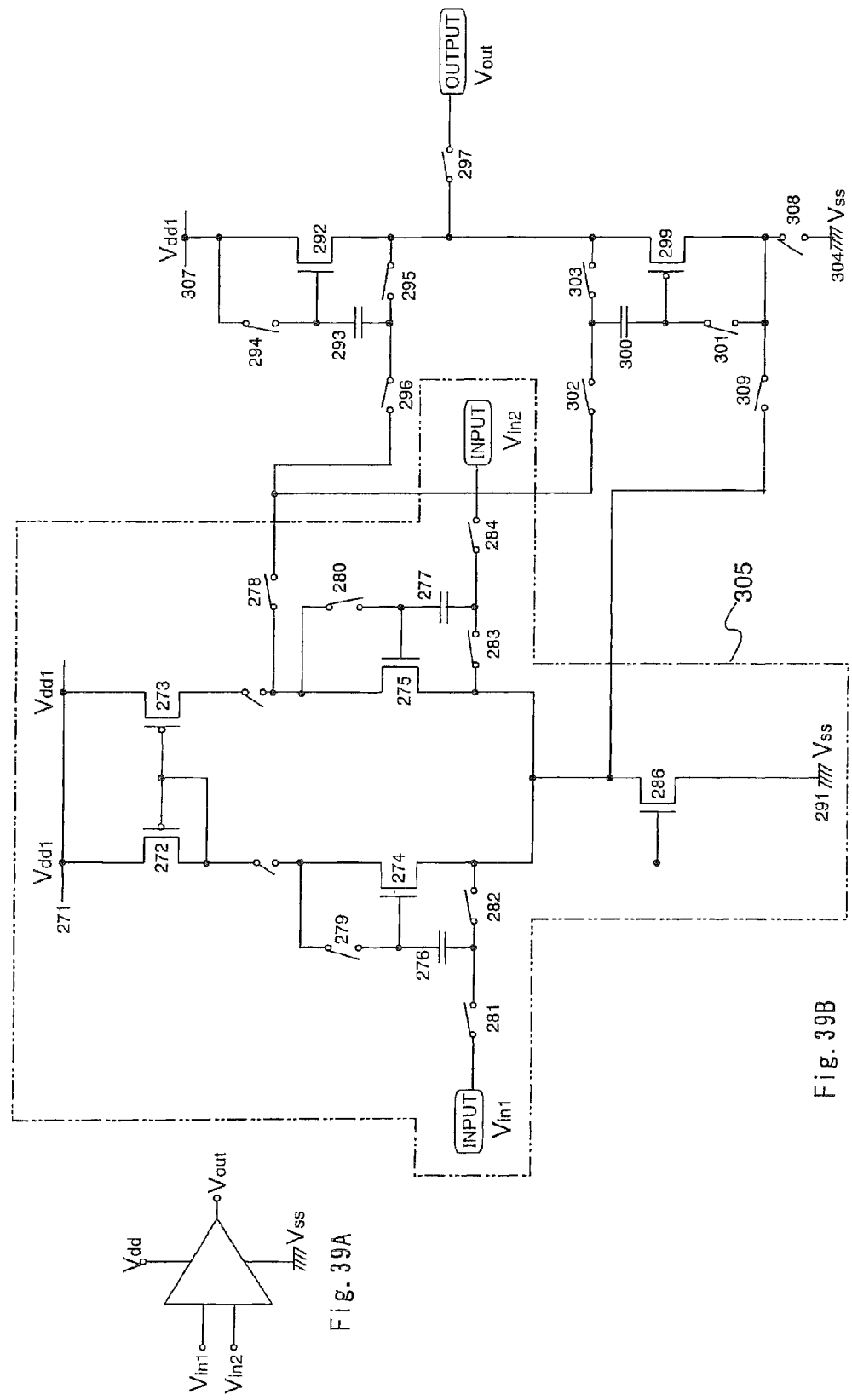
FIGS. 39A and 39B are diagrams showing an operational amplifier of the invention.

FIGS. 39A and 39B show an operational amplifier in a case that the region surrounded by the dotted line shown at 305 in FIG. 13B uses the same configuration as the differential amplifier circuit of FIG. 31. In FIGS. 39A and 39B, the source-follower circuit part is made as a push-pull circuit and hence a bias current source does not exist. Consequently, the current of a current source of the differential amplifier circuit is utilized as a current for use in a setting operation of the source-follower circuit (push-pull circuit). Namely, the transistor 286 is connectable to the push-pull circuit.

Incidentally, this embodiment can be desirably combined with Embodiment 1 or 2.

Embodiment 4

This embodiment explains the configuration and operation of a semiconductor device having a photoelectric element to which the invention is applied, by using FIGS. 14A-14C and 15.

Figure 14A:
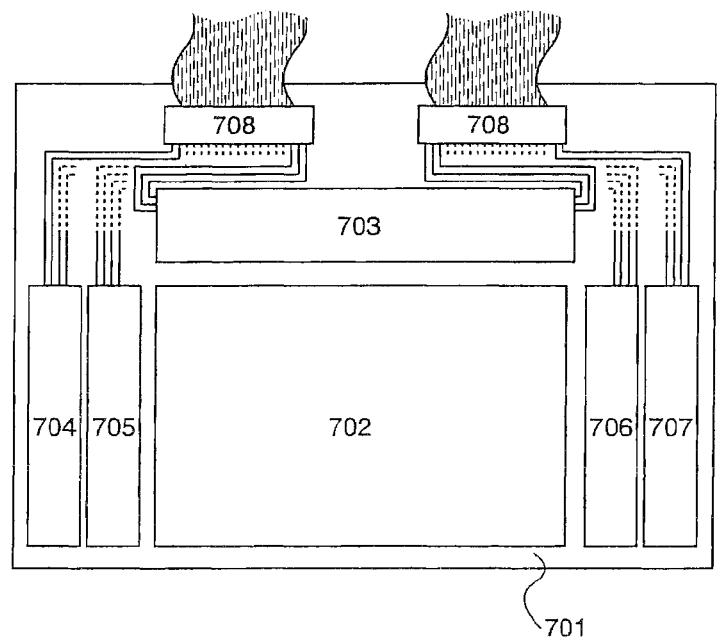
FIGS. 14A to 14C are diagrams showing a semiconductor device of the invention.

The semiconductor device shown in FIG. 14A has a pixel region 702 having a plurality of pixels arranged in a matrix faun on a substrate 701. Around the pixel region 702, there are provided a signal-line drive circuit 703 and first to fourth scanning-line drive circuits 704-707. Although the semiconductor device of FIG. 14A has the signal-line drive circuit 703 and the first to fourth scanning-line drive circuits 704-707, the invention is not limited to this, i.e. the signal-line drive circuit and scanning-line drive circuits are arbitrarily arranged in the number depending upon a pixel configuration. Also, signals are externally supplied to the signal-line drive circuit 703 and first to fourth scanning-line drive circuits 704-707 through an FPC 708. However, the invention is not limited to this but the electric circuits other than the pixel region may be use an IC to externally supply signals.

Figure 14B:
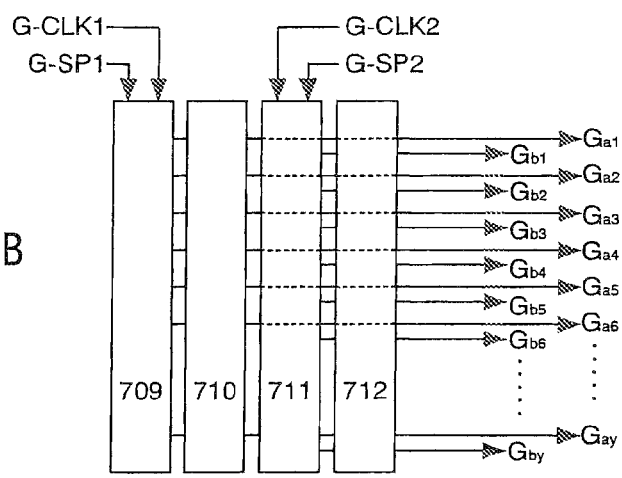

First explained is a configuration of the first scanning-line drive circuit 704 and second scanning-line drive circuit 705, by using FIG. 14B. The third scanning-line drive circuit 706 and the fourth scanning-line drive circuit 707 conform to the diagram of FIG. 14B, and hence omittedly shown.

The first scanning-line drive circuit 704 has a shift register 709 and a buffer 710. The second scanning-line drive circuit 705 has a shift register 711 and a buffer 712. Briefly explain the operation, the shift register 709, 711 sequentially outputs sampling pulses according to a clock signal (G-CLK), start pulse (SP) and clock inversion signal (G-CLKb). Thereafter, the pulse amplified by the buffer 710, 712 is inputted to scanning lines and made in a selective state row by row.

Incidentally, configuration may be made such that a level shifter is arranged between the shift register 709 and the buffer 710 or between the shift register 711 and the buffer 712. The arrangement of a level shifter circuit can increase voltage amplitude.

Figure 14C:
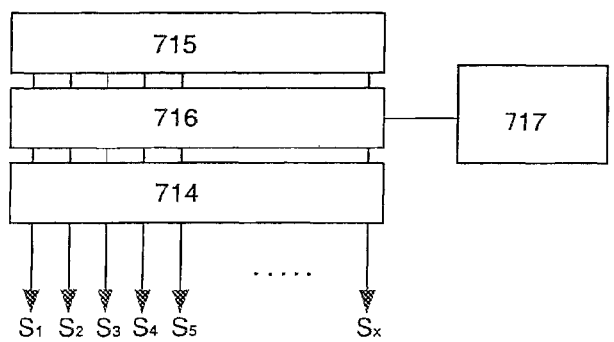

Next explained is the configuration of the signal-line drive circuit 703, by using FIG. 14C.

The signal-line drive circuit 703 has a signal-output-line drive circuit 715, a sample hold circuit 716, a bias circuit 714 and an amplifier circuit 717. The bias circuit 714, in a pair with an amplifier transistor of each pixel, forms a source-follower circuit. The sample hold circuit 716 has a function to temporarily store a signal, make an analog-digital conversion and reduce noise. The signal-output-line drive circuit 715 has a signal output function to sequentially output temporarily stored signals. The amplifier circuit 717 has a circuit to amplify a signal outputted from the sample hold circuit 716 and signal-output-line drive circuit 715. Incidentally, the amplifier circuit 717 may not be arranged where no signal amplification is required.

Figure 15:
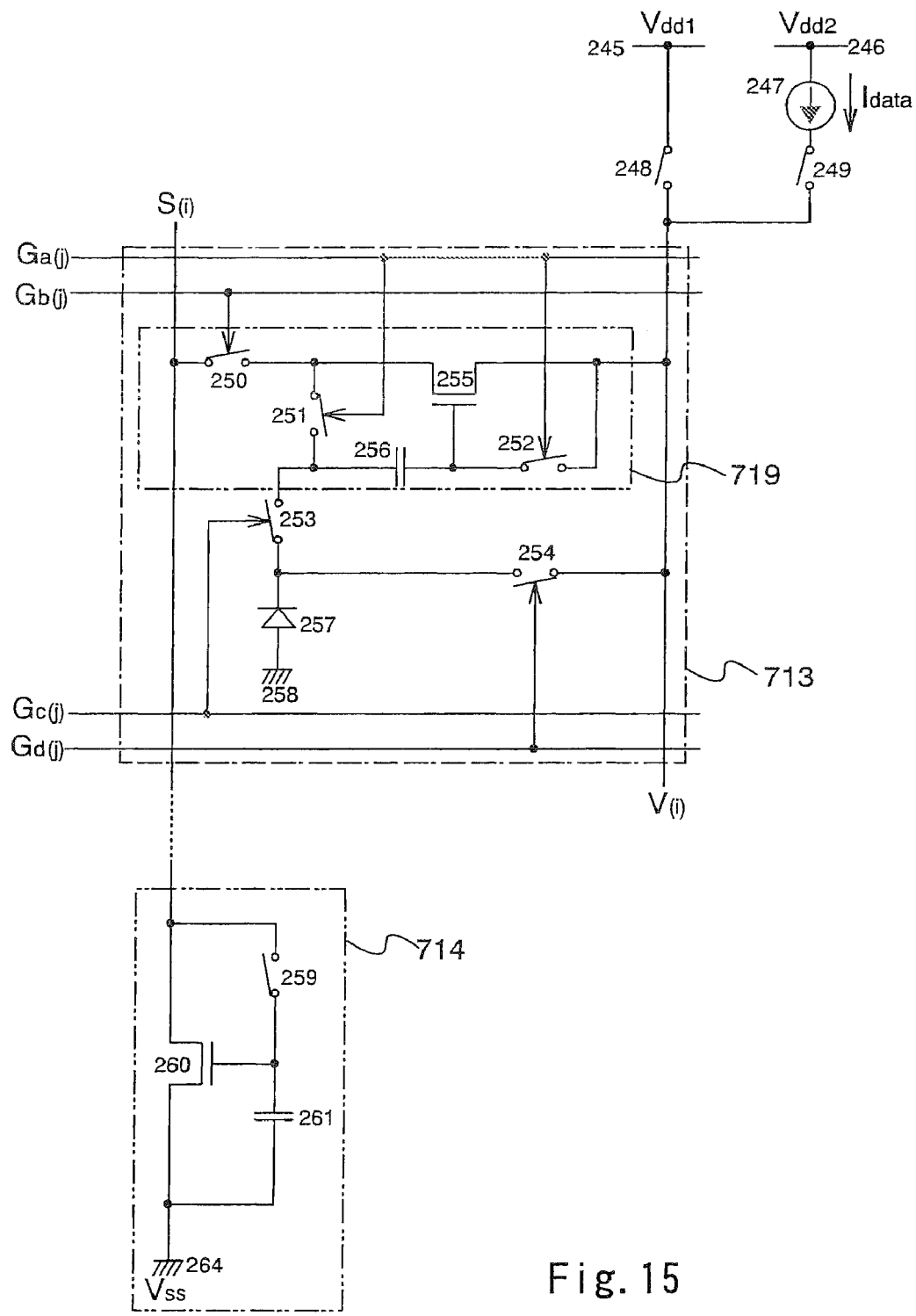
FIG. 15 is a diagram showing a pixel and bias circuit of the semiconductor device of the invention.

Explanation is made on the configuration and operation of a circuit of a pixel 713 arranged at i-th column and j-th row in the pixel region 702 and a bias circuit 714 at around the i-th column, by using FIG. 15.

First explained is the configuration of the circuit of the pixel 713 arranged at i-th column and j-th row and the bias circuit 714 at around the i-th column.

The pixel of FIG. 15 has first to fourth scanning lines Ga(j)-Gd(j), a signal line S(i) and a power line V(i), and also an n-channel transistor 255, a photoelectric converter element 257 and switches 250-254.

Although the transistor 255 was the n-channel type in this embodiment, the invention is not limited to this, i.e. it may be a p-channel type. However, because the transistor 255 and the transistor 260 form a source-follower circuit, the both transistors are preferably in the same polarity.

The switches 250-254 are semiconductor elements having switching functions, which preferably use transistors. The switches 251 and 252 are on-off controlled according to a signal inputted through the first scanning line Ga(j). The switch 250 is on-off controlled according to a signal inputted through the second scanning line Gb(j). The switch 253 is on-off controlled according to a signal inputted through the third scanning line Gc(j). The switch 254 is on-off controlled according to a signal inputted through the fourth scanning line Gd(j).

The transistor 255 has source and drain regions one of which is connected to a power line V(i) and the other is connected to a signal line S(i) through the switch 250. The transistor 255 has a gate electrode connected to one terminal of a capacitance element 256. The other terminal of the capacitance element 256 is connected to one terminal of a photoelectric converter element 257 through the switch 253. The other terminal of the photoelectric converter element 257 is connected to a power line 258. The power line 258 is applied with a ground potential $V_{ss}$. The capacitance element 256 has a role to hold a gate-to-source voltage of the transistor 255 during carrying out a setting operation.

The bias circuit 714 has a transistor 260, a capacitance element 261 and a switch 259. The transistor 260 has a source region connected to a power line 264 and a drain region connected to the signal line S(i). The power line 264 is applied with a ground potential $V_{ss}$. The transistor 260 has a gate electrode connected to one terminal of the capacitance element 261. The other terminal of the capacitance element 261 is connected to the power line 264. The capacitance element 261 has a role to hold a gate-to-source voltage of the transistor 260 during carrying out a setting operation.

247 is a reference constant-current source having a capability to flow a constant current. The reference constant-current source 247 is configured by a semiconductor element such as a transistor. In the present specification, the reference constant-current source 247 configured by a transistor will be explained in its one example in Embodiment 6. This can be made reference to conveniently.

The power line V(i) is connected with the power line 245 through a switch 248, and with the reference constant-current source 247 through a switch 249. The power line 245 is applied with a power-source potential $V_{dd1}$ while the power line 246 is applied with a power-source potential $V_{dd2}$. The power source potential $V_{dd1}$ applied to the power line 245 and the power source potential $V_{dd2}$ applied to the power line 246 may be the same or different in value. However, the power source potential $V_{dd2}$ applied to the power line 246 is required to be set at a value that the reference constant-current source 247 is allowed to normally operate as a constant-current source. For example, where the reference constant-current source 247 utilizes a saturation region of a transistor to configure the current source, there is a need to set at a value that the transistor is allowed to operate in the saturation region.

The reference constant-current source 247 may be integrally formed with a signal-line drive circuit on a substrate. Otherwise, a constant current may be inputted as a reference current externally of the substrate by using an IC or the like.

The arrangement position of the switches 248, 249 and reference constant-current source 247 is not limited to the point shown in FIG. 15. Taking the foregoing Embodiments 1-3 into consideration, arrangement may be in the different position, e.g. may be incorporated in the pixel 713.

In FIG. 15, the region surrounded by the dotted line shown at 719 and region surrounded by the dotted line shown at 714 corresponds to a source-follower circuit.

Next explained briefly is the operation of the circuit of the pixel 713 arranged at i-th column and j-th row and the bias circuit 714 at around the i-th column.

At first, the switches 249-252 of the pixel 713 and the switch 259 of the bias circuit 714 are turned into an on-state. The other switches than those are turned off. Thereupon, the signal current $I_{data}$ as set in the reference constant-current source 247 flows in a direction toward the power line 264 through the switches 249, 252, 251 and then the switch 250 and further the switch 259.

In the instant a current begins to flow, no charge is held on the capacitance elements 256, 261. Consequently, the transistors 255, 260 are off.

Then, charge is gradually built up on the capacitance elements 256, 261 to cause a potential difference at between the both electrodes of the capacitance element 256, 261. When the potential difference at between the both electrodes of the capacitance element 256, 261 reaches a threshold voltage of the transistor 255, 260, the transistors 255, 260 turn on.

Then, charge storage is continued on the capacitance element 256 such that the gate-to-source voltage of the transistor 255 becomes a voltage capable of flowing a predetermined signal current $I_{data}$. Also, charge storage is continued on the capacitance element 261 such that the gate-to-source voltage of the transistor 260 becomes a voltage capable of flowing a predetermined signal current $I_{data}$.

After the capacitance elements 256, 261 complete the charge storage into a steady state, the switches 251, 252, 259 are turned off. The switches 249, 250 are kept on. The other switches than the above are all off. At this time, the signal current $I_{data}$ set by the reference constant-current source 247 flows through the drain to source region of the transistor 255 and further the drain to source region of the transistor 260.

Subsequently, in this state, the switches 248, 250 and 253 in the pixel 713 are turned on while the other switches than those are turned off.

Thereupon, the gate electrode of the transistor 255 is inputted by a signal from the photoelectric converter element 257 through the capacitance element 256.

At this time, the gate electrode of the transistor 255 is inputted by a value having the signal of from the photoelectric converter element 257 added onto the voltage held on the capacitance element 256. Namely, the signal to be inputted to the gate electrode of the transistor 255 is a signal to be inputted to the gate of the same transistor in addition to the voltage held on the capacitance element 256. Consequently, it is possible to suppress against the affection of transistor characteristic variation.

Then, the potential on the source region of the transistor 255 becomes an output potential $V_{out}$. The output potential $V_{out}$ is outputted, as a signal having been read by the photoelectric converter element 257, onto the signal line S(i) through the switch 250.

Next, the switch 254 is turned on while the other switches than those are turned off, to initialize the photoelectric converter element 257. More specifically, the charge held by the photoelectric converter element 257 is allowed to flow toward the power line V(i) through the switch 254 such that the potential on an n-channel terminal of the photoelectric converter element 257 becomes equal to the potential on the power line 258. From then on, the above operation is repeated.

The semiconductor device having the above configuration can suppress against the affection of transistor-characteristic variation.

The invention can be desirably combined with Embodiments 1-3.

Embodiment 5

This embodiment explains an example, different from Embodiments 3 and 4, of an electric circuit to which the invention is applied, by using FIGS. 16 to 19.

Figure 16A:
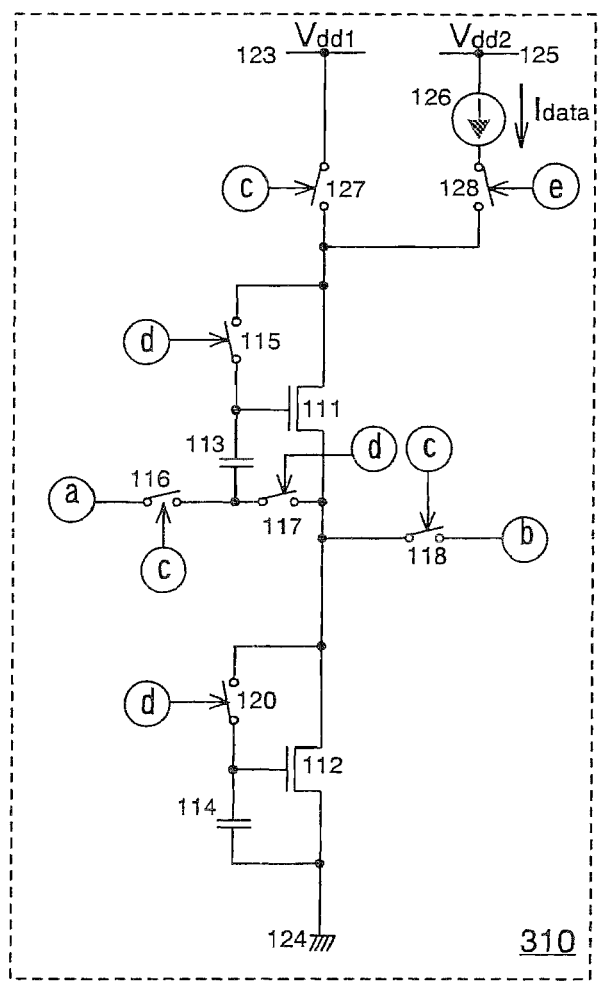
FIGS. 16A and 16B are diagrams explaining the configuration of the electric circuit of the invention.

In FIG. 16A, 310 is the source-follower circuit of FIGS. 1, 2A and 2B. The circuit configuration and operation of the source-follower circuit 310 is similar to that of FIGS. 1, 2A and 2B, and omittedly explained in this embodiment.

The operation of the source-follower circuit 310 is to be roughly divided with setting and output operations, as mentioned before. Incidentally, setting operation is an operation to hold predetermined charge on a capacitance element, which corresponds to the operation in FIGS. 1 and 2A. Meanwhile, output operation is an operation to input an input potential $V_{in}$ to take out an output potential $V_{out}$, which corresponds to the operation in FIG. 2B.

In the source-follower circuit 310, a terminal-a corresponds to the input terminal while a terminal-b corresponds to the output terminal. The switches 127, 116, 118 are controlled according to a signal inputted through a terminal-c. The switches 115, 117, 120 are controlled according to a signal inputted through a terminal-d. The switch 128 is controlled according to a signal inputted through a terminal-e.

Figure 16B:
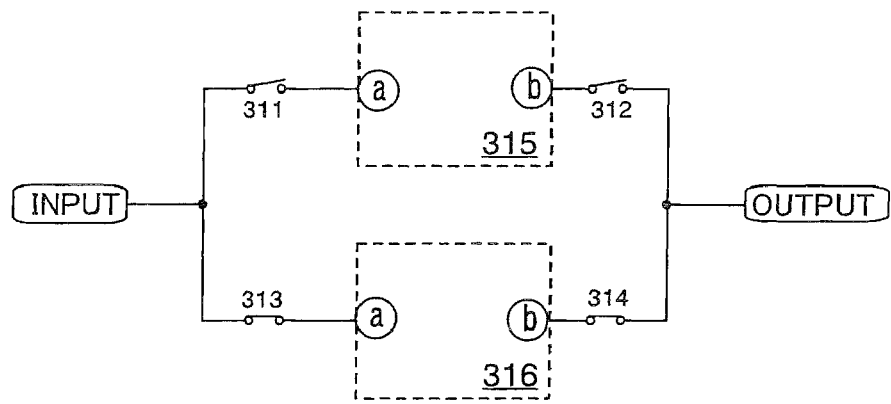

In designing an electric circuit having a source-follower circuit 310, it is preferred to arrange at least two source-follower circuits 315, 316 as shown in FIG. 16B. One of the source-follower circuits 315, 316 is preferably to carry out a setting operation while the other is to carry out an output operation. Because this can carry out two operations at the same time, there is no uselessness in operation without requiring useless time. Thus, electric circuit operation can be effected at high speed.

In the case of an arrangement of only one source-follower circuit, output operation is not effected during setting operation. This results in an occurrence of useless time.

Incidentally, setting and output operations are not effected at the same time in the source-follower circuits 315, 316. Accordingly, there is no need to arrange one current source 126 in each of the source-follower circuits 315, 316. Namely, one current source 126 can be commonly used by the source-follower circuits 315, 316.

For example, in a design using a source-follower circuit to a signal-line drive circuit, at least two source-follower circuits are preferably arranged on each signal line. In a design using a source-follower circuit to a scanning-line drive circuit, at least two source-follower circuits are preferably arranged on each scanning line. In a design using a source-follower circuit on the pixel, at least two source-follower circuits are preferably arranged on each pixel.

In FIG. 16B, 311-314 are switches. When the switches 311, 312 are on, the switches 313, 314 are off. When the switches 311, 312 are off, the switches 313, 314 are on. In this manner, of the two source-follower circuits 315, 316, one is cause to carry out a setting operation while the other is caused to carry out an output operation. Incidentally, the two source-follower circuits 315, 316 may be controlled by controlling the switches 116, 118 possessed by the source-follower circuit 310 without arranging the switches 311-314.

Although, in this embodiment, the region surrounded by the dotted line 315, 316 was assumed corresponding to the source-follower circuit, the invention is not limited to this, i.e. the differential amplifier circuit, operational amplifier or the like shown in FIGS. 10-13 or the like may be applied.

Figure 17:
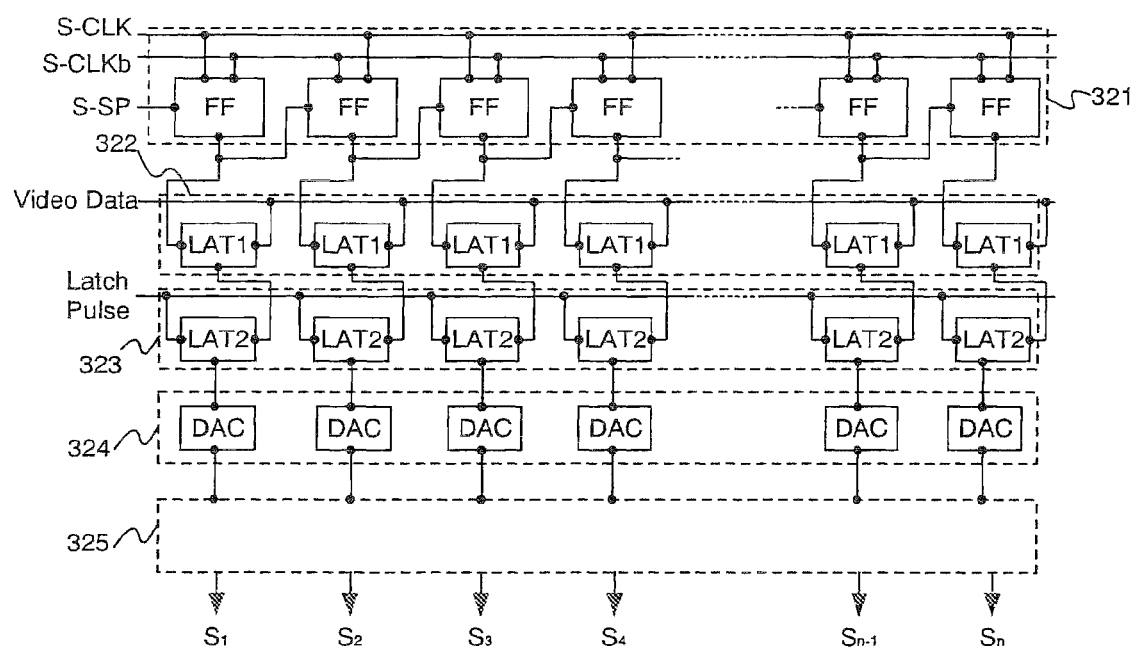
FIG. 17 is a diagram of a signal-line drive circuit of the invention.
Figure 18:
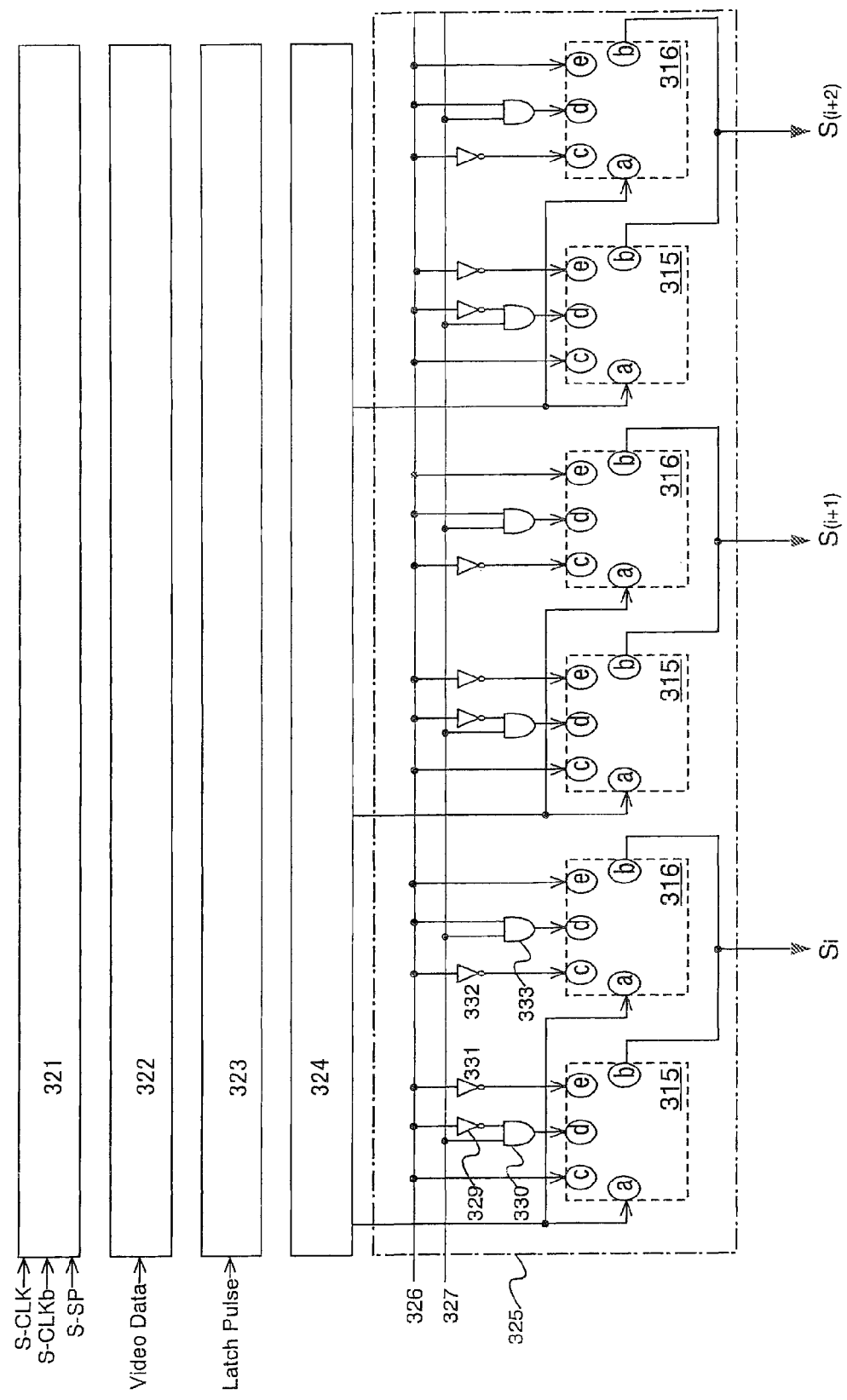
FIG. 18 is a diagram of the signal-line drive circuit of the invention.
Figure 19:
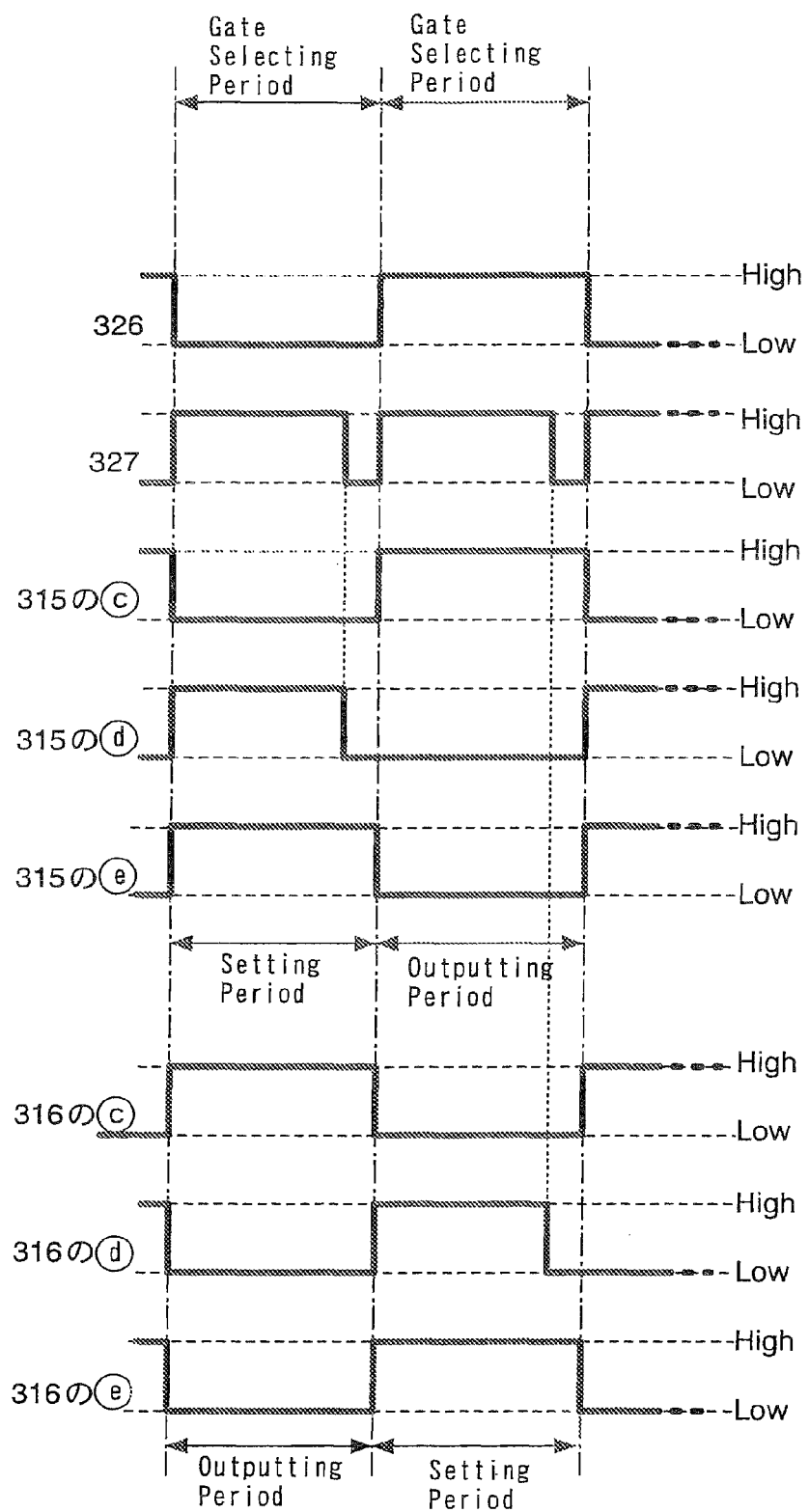
FIG. 19 is a diagram explaining the operation of the signal-line drive circuit of the invention.

This embodiment explains the configuration and operation of a signal-line drive circuit having at least two source-follower circuits arranged based on each signal lines, by using FIGS. 17 to 19.

FIG. 17 shows a signal-line drive circuit. The signal-line drive circuit has a sift register 321, a first latch circuit 322, a second latch circuit 323, a D/A converter circuit 324 and a signal amplifier circuit 325.

Incidentally, in the case that the first latch circuit 322 or second latch circuit 323 is a circuit capable of storing analog data, the D/A converter circuit 324 in many cases is to be omitted. In the case that the data to be outputted onto the signal line is binary, i.e. digital amount, the D/A converter circuit 324 in many cases is to be omitted. Meanwhile, the D/A converter circuit 324, in a certain case, incorporates therein a gamma-correction circuit. In this manner, the signal-line drive circuit is not limited to the configuration of FIG. 17.

Briefly explaining the operation, the shift register 321 is configured using a plurality of columns of flip-flop circuits (FFs) or the like, to input an input clock signal (S-CLK), a start pulse (S-SP) and a clock inversion signal (S-CLKb). Sampling pulses are to be sequentially outputted according to the timing of these signals.

The sampling pulse outputted from the shift register 321 is inputted to the first latch circuit 322. The first latch circuit 322 is inputted with a video signal, to hold the video signal on each column according to the input timing of the sampling pulse.

In the first latch circuit 322, when video-signal holding is completed to the last column, a latch pulse is inputted to the second latch circuit 323 during a horizontal blanking period. Thus, the video signals held on the first latch circuit 322 are transferred, at one time, to the second latch circuit 323. Thereafter, the video signals held on the second latch circuit 323 are inputted, simultaneously in an amount of one row, to the D/A converter circuit 324. The signal to be inputted from the D/A converter circuit 324 is inputted to the signal amplifier circuit 325.

While the video signal held on the second latch circuit 323 is being inputted to the D/A converter circuit 324, the shift register 321 again outputs a sampling pulse. From then on, the operation is repeated.

Explanation is made on the configuration of the signal amplifier circuit 325 at around i-th column to (i+2)-th column, or three, signal lines, by using FIG. 18.

The signal amplifier circuit 325 has two source-follower circuits 315, 316 on each column. Each of the source-follower circuits 315, 316 has five terminals, i.e. terminal-a to terminal-e. The terminal-a corresponds to an input terminal of the source follower circuit 315, 316 while the terminal-b corresponds to an output terminal of the source follower circuit 315, 316. Meanwhile, the switches 127, 116, 118 are controlled according to a signal inputted through the terminal-c while the switches 115, 117, 120 are controlled according to a signal inputted through the terminal-d Furthermore, the switch 128 is controlled according to a signal inputted through the terminal-e.

In the signal amplifier circuit 325 shown in FIG. 18, a logic operator is arranged between the two signal lines, i.e. a setting signal line 326 and a threshold signal line 327, and the source-follower circuit 315, 316. 329 is an inverter, 330 is an AND, 331 and 332 are inverters, and 333 is an AND. Inputted, to the terminal-c to terminal-e, is either a signal outputted from the setting signal line 327 or a signal outputted from an output terminal of the logic operator.

Next explained are the signals to be outputted from the two lines, i.e. setting signal line 326 and the threshold signal line 327, and the signals to be inputted to the switches through the terminal-c to terminal-e of the source-follower circuit 315, 316, by using FIG. 19.

Note that the switch the signal is to be inputted through the terminal-c to terminal-e is turned on when a High signal is inputted and off when a Low signal is inputted.

The signals as shown in FIG. 19 are inputted through the two signal lines, i.e. the setting signal line 326 and the threshold signal line 328. Furthermore, a signal outputted from the setting signal line 326 is inputted, as it is, to the terminal-c of the source-follower circuit 315. A signal outputted from an output terminal of the AND 330 is inputted to the terminal-d while a signal outputted from an output terminal of the inverter 331 is inputted to the terminal-e. By doing so, the source-follower circuit 315 can be controlled for any one of setting and outputting operations.

Also, a signal outputted from an output terminal of the inverter 332 is inputted to the terminal-c of the source-follower circuit 316. A signal outputted from an output terminal of the AND 333 is inputted to the terminal-d while a signal outputted from the setting signal line 326 is inputted, as it is, to the terminal-e. By doing so, the source-follower circuit 316 can be controlled for any one of setting and outputting operations.

Incidentally, in FIGS. 16A and 16B, the current source 126 is arranged in each source-follower circuit. Consequently, it is desired not to cause variation in value of the current flowing from the plurality of current sources 126 arranged in the signal-line drive circuit. For this reason, it is possible not to cause variation in current value by carrying out a setting operation to each current source 126. This technique is described in the inventions of Japanese Patent Application Nos. 2002-287997, 2002-288104, 2002-28043, 2002-287921, 2002-287948 and so on. Accordingly, by applying this technique to the present application, it is possible to correct for the characteristic variation in between the plurality of current sources 126 arranged in the signal-line drive circuit.

Description was so far made, in FIGS. 16A, 16B, 18 and 19, on the case using the source-follower circuit arranged with the current sources in addition to the native circuit as in FIG. 1. Next shown is an example in a case using a source-follower circuit as in FIG. 27 or 29.

Figure 40:
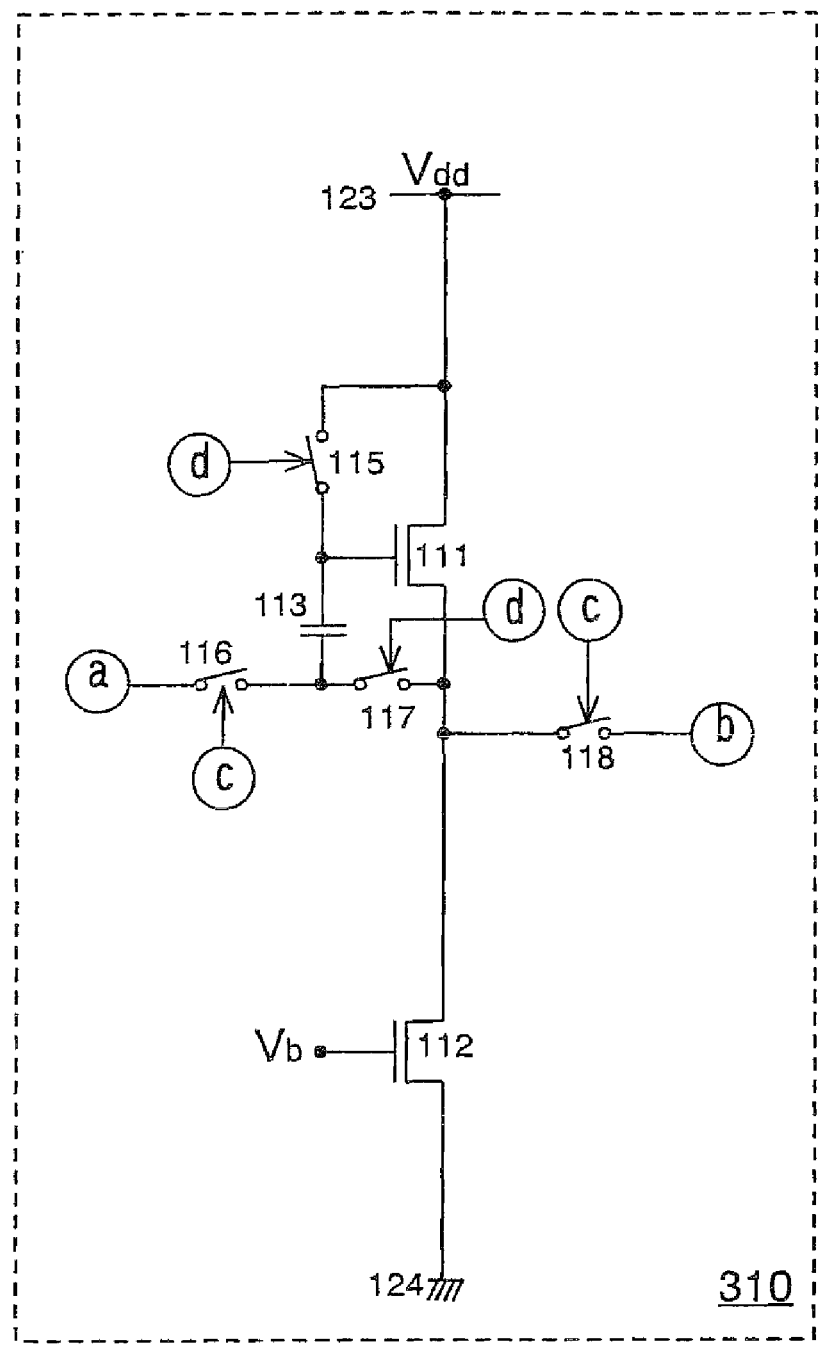
FIG. 40 is a diagram of a signal-line drive circuit of the invention.
Figure 41:
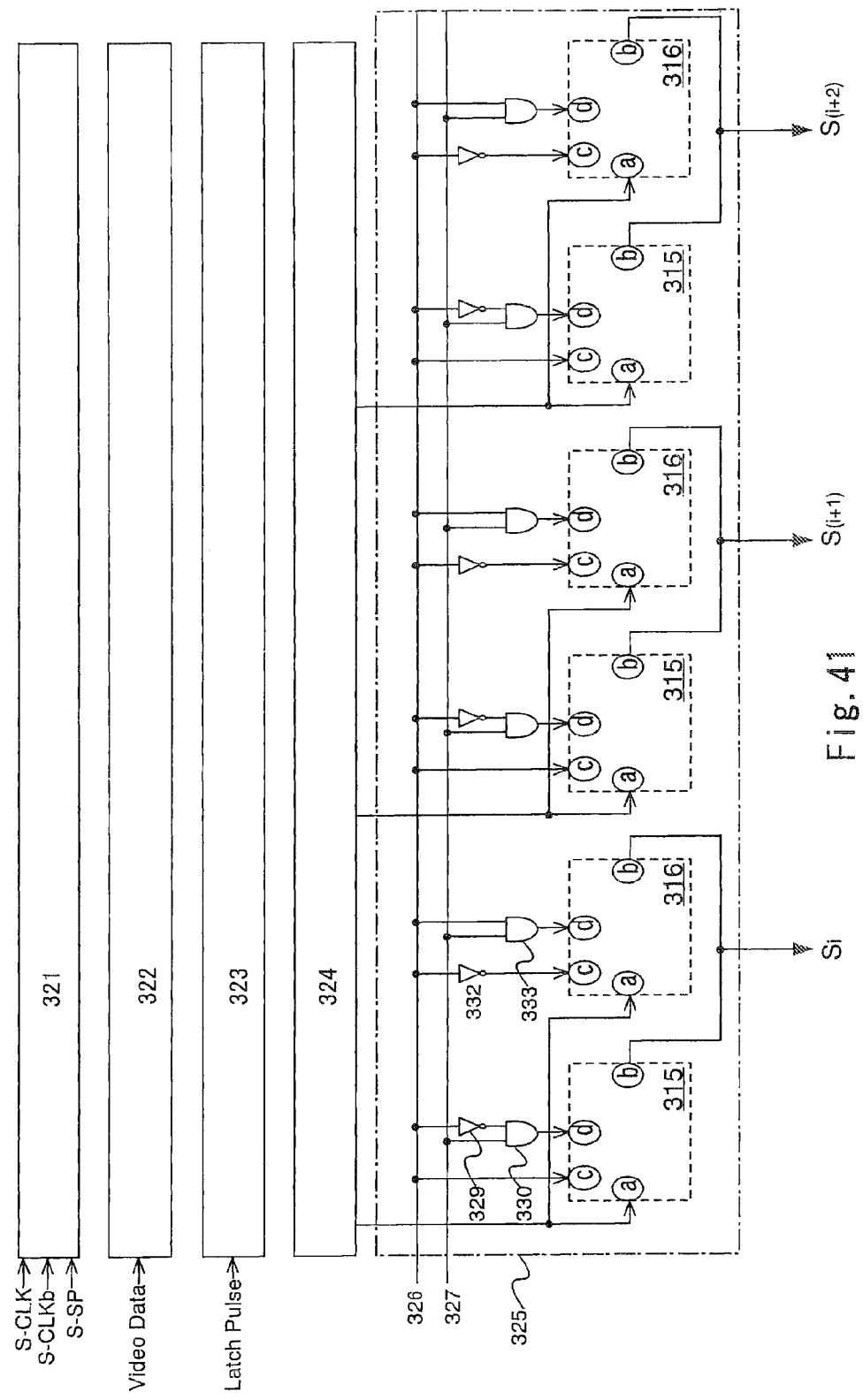
FIG. 41 is a diagram of a signal-line drive circuit of the invention.
Figure 42:
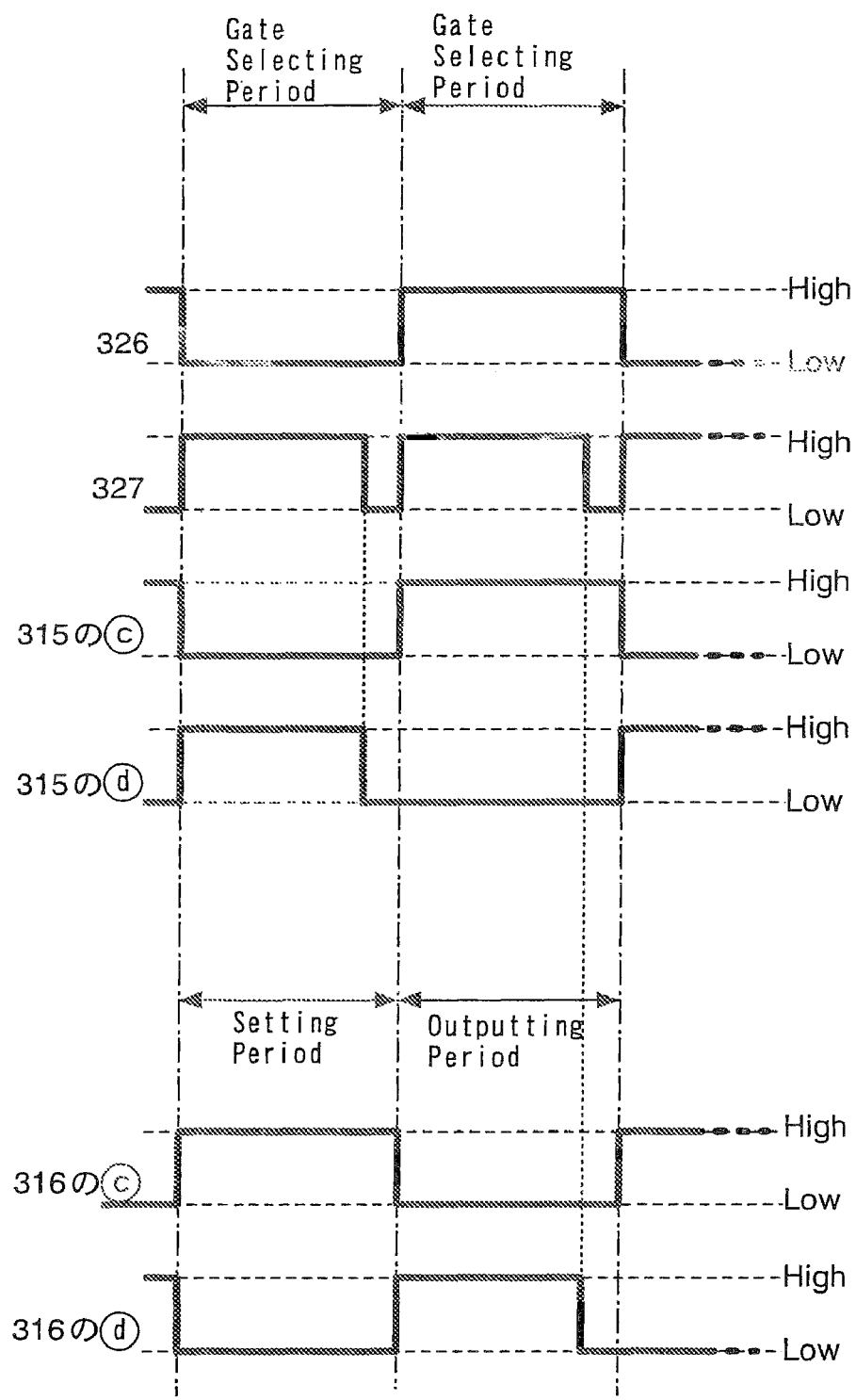
FIG. 42 is a diagram explaining the operation of the signal-line drive circuit of the invention.

There is shown, in FIG. 40, a diagram corresponding to FIG. 16A. A diagram corresponding to FIG. 18 is shown in FIG. 41, while a diagram corresponding to FIG. 19 is shown in FIG. 42. The operation or the like is similar to those so far described and hence omitted. As compared with the case of FIGS. 16, 18 and 19, the current source 126 is arranged in FIG. 16A whereas it is not arranged in FIG. 40. As a result, circuit arrangement is easy, making possible to carry out layout in a narrow area. Meanwhile, as already mentioned, FIG. 16A desirably has further an additional circuit in order not to cause variation in current value between the current sources 126. This, however, is not required in the circuit of FIG. 40. As a result, circuit arrangement is easy, making possible to carry out layout in a narrow area. In addition, drive timing is easier to provide.

Incidentally, the signal-line drive circuit, in many cases, has a plurality of pixels connected at the end of each signal line thereof. The pixel, in many cases, is to change its state depending upon a voltage inputted through the signal line. This may be an LCD or organic EL, for example. Besides these, connection is possible with a variety of elements.

This embodiment can be desirably combined with Embodiments 1-4.

Embodiment 6

The foregoing electric circuit or semiconductor device of the invention is arranged with a reference constant-current source having a capability to flow a constant current, to carry out a setting operation by the use of the reference constant-current source. The reference constant-current source is configured by a semiconductor element, such as a transistor. Accordingly, this embodiment explains the configuration of the reference constant-current source in the case of configured by a transistor and a capacitance element, by using FIGS. 20-23.

Figure 20A:
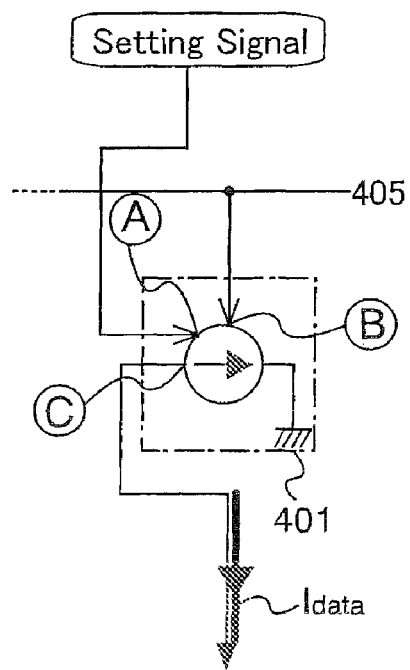
FIGS. 20A and 20B are diagrams showing a reference constant-current source.
Figure 20B:
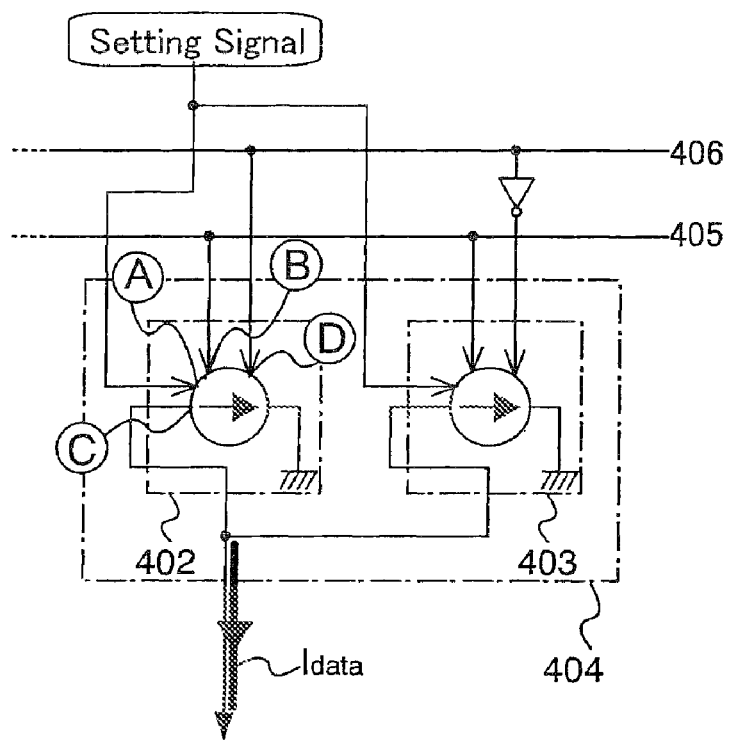

First explained is the scheme of a reference constant-current source, by using FIGS. 20A and 20B. In FIG. 20A, 401 is a reference constant-current source. The reference constant-current source 401 has a terminal-A, a terminal-B and a terminal-C. The terminal-A is inputted by a setting signal. The terminal-B is supplied by a current from a current feed line 405. Through the terminal-C, a current set by the reference constant-current source 401 is supplied to the external. Namely, the reference constant-current source 401, under control of a set signal inputted to the terminal-A, is supplied with a current at the terminal B, to supply a current through the terminal-C.

In FIG. 20B, 404 is a reference constant-current source. The reference constant-current source 404 has a plurality of reference constant-current sources. It is herein assumed that there are provided two reference constant-current sources 402, 403. The reference constant-current source 402, 403 has terminals A-D. The terminal-A is inputted by a setting signal. The terminal-B is supplied with a current from the current feed line 405. Through the terminal-C, a current set by the reference constant-current source 401 is supplied to the external. The terminal D is inputted by a control signal outputted from a control line 406. Namely, the reference constant-current source 402, 403 is under control of a setting signal inputted at the terminal-A and a control signal inputted at the terminal-D, and supplied with a current at the terminal-B to thereby supply a current at the terminal-C.

Next explained is the configuration of the reference constant-current source 401 of FIG. 20A, by using FIGS. 21A-21F and 22A-22E.

Each of the electric circuits shown in FIGS. 21A-21F corresponds to the reference constant-current source 401.

Figure 21A:
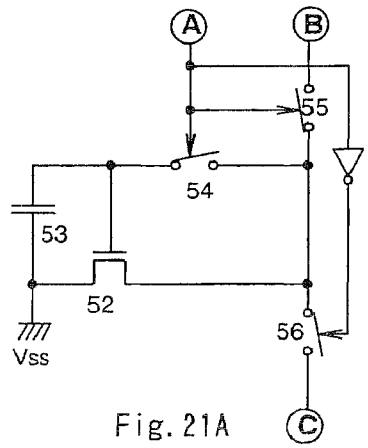
FIGS. 21A to 21F are diagrams showing a reference constant-current source.
Figure 21B:
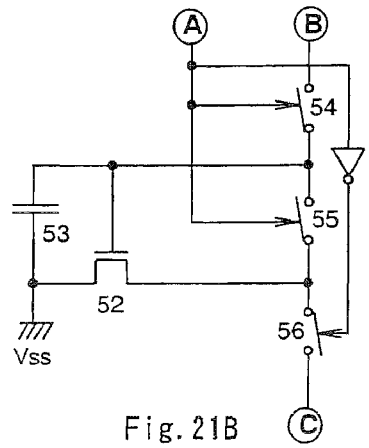

In FIGS. 21A and 21B, the electric circuit, having switches 54-56, an n-channel transistor 52 and a capacitance element 53 for holding a gate-to-source voltage of the transistor 52 during setting operation, corresponds to the reference constant-current source 401. The electric circuits of FIGS. 21A and 21B have the same circuit elements but are different in connection relationship of between the circuit elements.

Figure 21C:
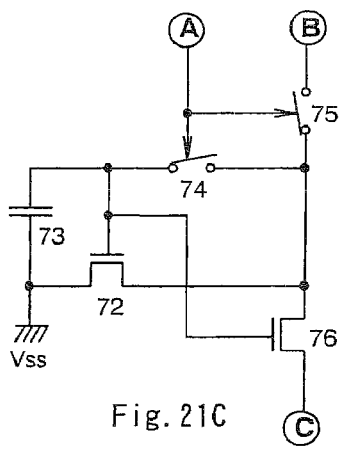

In FIG. 21C, the electric circuit, having switches 74, 75, n-channel transistors 72, 76 and a capacitance element 73 for holding a gate-to-source voltage of the transistor 72 during setting operation, corresponds to the reference constant-current source 401.

Figure 21D:
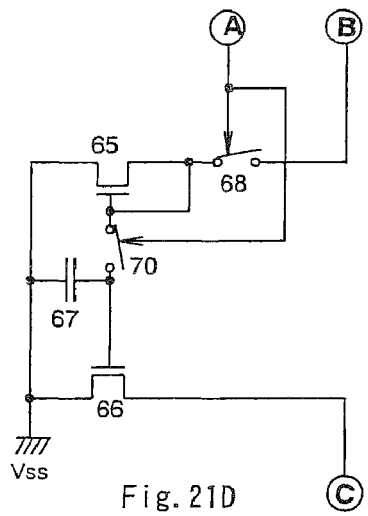
Figure 21E:
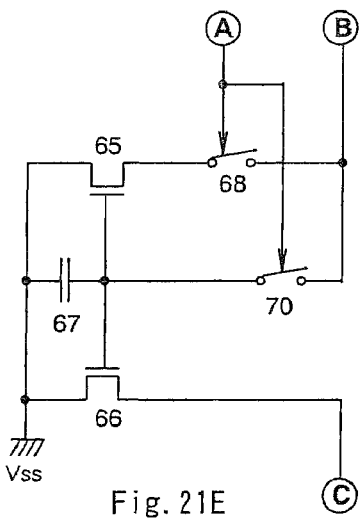
Figure 21F:
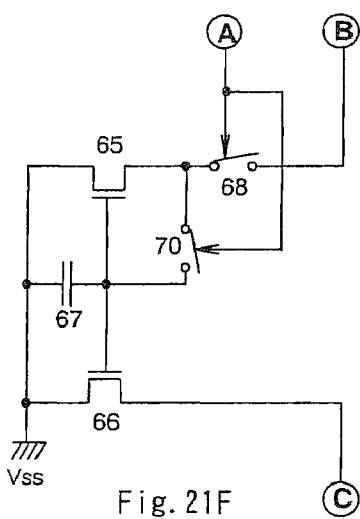
Figure 22A:
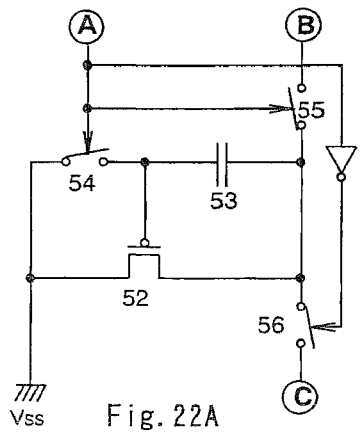
FIGS. 22A to 22E are diagrams showing a reference constant-current source.
Figure 22B:
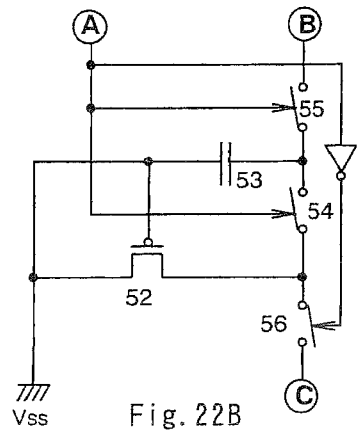
Figure 22C:
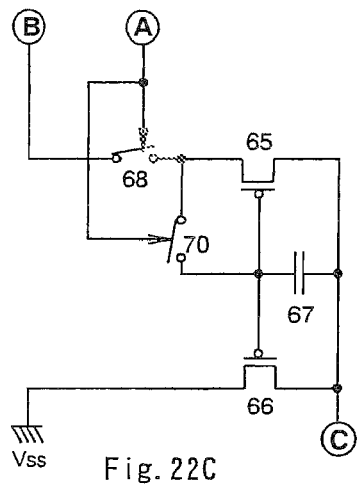
Figure 22D:
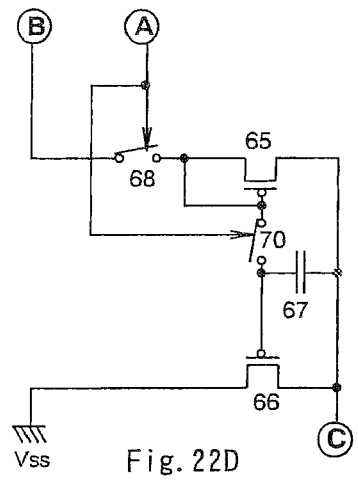
Figure 22E:
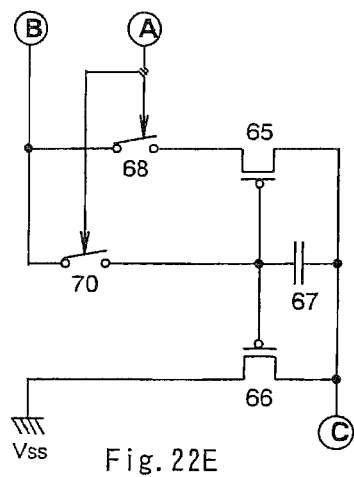

In FIGS. 21D-21F, the electric circuit, having switches 68, 70, n-channel transistors 65, 66 and a capacitance element 67 for holding a gate-to-source voltage of the transistor 65, 66 during setting operation, corresponds to the reference constant-current source 401. The electric circuits of FIGS. 21D-21F have the same circuit elements but are different in connection relationship of between the circuit elements.

Subsequently, explanation is briefly made on the operation of the reference constant-current source 401 of FIGS. 21A and 21B and the reference constant-current source 401 of FIGS. 21D-21F. The operation of the reference constant-current source 401 of FIG. 21C is similar to the operation of FIGS. 21A and 21B, and hence omittedly explained in this embodiment.

First explained is the operation of the reference constant-current source 401 of FIGS. 21A and 21B. In the electric circuit of FIGS. 21A and 21B, the switches 54, 55 are turned on according to a signal inputted through the terminal-A. At this time, the switch 56 is off. Thereupon, a current is supplied from the current feed line 405 through the terminal-B, whereby predetermined charge is held on the capacitance element 53.

Then, the switches 54, 55 are turned off. At this time, because predetermined charge is held on the capacitance element 53, the transistor 52 has a capability to flow a current in a magnitude of signal current $I_{data}$.

Then, the switches 54, 55 are kept in off state and the switch 56 is turned on. Thereupon, a predetermined current flows at the terminal-C. At this time, because the gate-to-source voltage of the transistor 52 is maintained at a predetermined gate-to-source voltage, a drain current commensurate with the signal current $I_{data}$ flows through the drain region of the transistor 52.

Incidentally, in the case of the circuit of FIGS. 21A and 21B, it is impossible to simultaneously carry out an operation to hold predetermined charge on the capacitance element 53 and an operation to flow a predetermined current. Consequently, controlled are the timing of holding predetermined charge onto the capacitance element 53 and the timing of flowing a predetermined current, by the use of the switches 54-56.

Next explained is the operation of the reference constant-current source 401 of FIGS. 21D-21F. In the electric circuit of FIGS. 21D-21F, the switches 68, 70 are turned on according to a signal inputted through the terminal-A. Thereupon, a current is supplied from the current feed line 405 through the terminal-B, to store predetermined charge on the capacitance element 67. At this time, because of connection between the gate electrode of the transistor 65 and the gate electrode of the transistor 66, the gate-to-source voltages of the transistors 65 and 66 are held by the capacitance element 67.

Next, the switches 68, 70 are turned off. At this time, because of holding predetermined charge on the capacitance element 67, the transistor 65, 66 has a capability to flow a current in a magnitude of signal current $I_{data}$. Namely, because the gate-to-source voltage of the transistor 66 is held at a predetermined gate-to-source voltage by the capacitance element 67, a drain current commensurate with the signal current $I_{data}$ flows through the drain region of the transistor 66.

Incidentally, in the case of the circuit of FIGS. 21D-21F, it is possible to simultaneously carry out an operation to hold predetermined charge on the capacitance element 67 and an operation to flow a predetermined current.

Meanwhile, in the case of the circuit of FIGS. 21D-21F, the size of the transistors 65, 66 is of importance. In the case the transistor 65 and the transistor 66 are in the same size, there is a current flowing through the terminal-C in the same value as the current to be supplied from the current feed line 405. On the other hand, where the transistor 65 and the transistor 66 are different in size, i.e. when the transistor 65 and the transistor 66 are different in the value of W (gate width)/L (gate length), there is a difference between the value of a current supplied from the current feed line 405 and the value of a current flowing through the terminal-C. The difference relies upon the W/L values of the respective transistors.

Incidentally, in the electric circuit of FIG. 21A-21F, a current is flowing from the terminal-C toward a ground potential $V_{ss}$. FIG. 22 shows a circuit configuration in a case that the transistors 52, 65, 66 have a p-channel type of polarity wherein a current is flowing from the terminal-C toward a ground potential $V_{ss}$.

Incidentally, the direction of current flow is not limited to the direction of from the terminal-C toward the ground potential $V_{ss}$ as shown in FIGS. 21A-21F and 22A-22E. In case the electric circuits of FIGS. 21A-21F has a ground potential $V_{ss}$ at the power-source potential $V_{dd}$ and further the transistors 52, 65, 66, 72 of the p-channel type, a current flows in a direction of from the power-source potential $V_{dd}$ to the terminal-C. Meanwhile, in the electric circuit of FIG. 22, in case the ground potential $V_{ss}$ is at the power-source potential $V_{dd}$ and further the transistors 52, 65, 66 are of the n-channel type, a current flows in a direction of from the power-source potential $V_{dd}$ to the terminal-C.

Figure 23A:
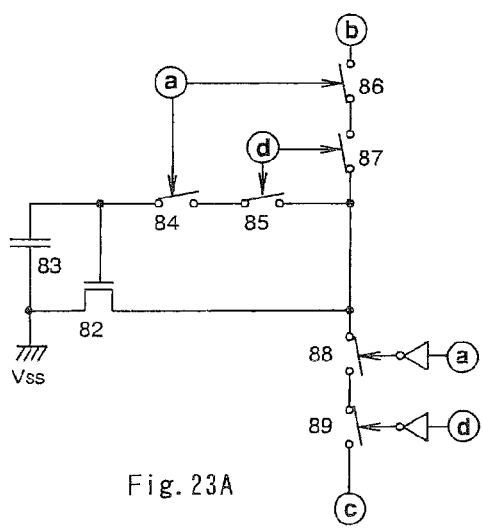
FIGS. 23A and 23B are diagrams showing a reference constant-current source.
Figure 23B:
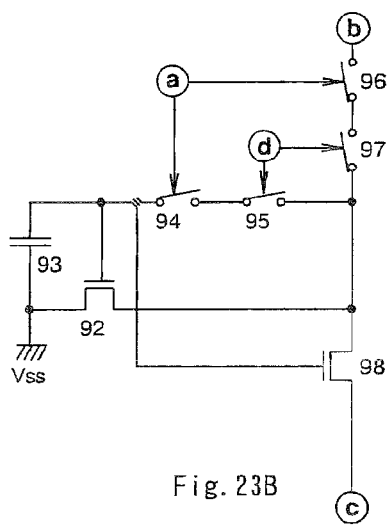

Next explained is the reference constant-current source 402, 403 of FIG. 20B, by using FIGS. 23A and 23B. In the case of the circuit of FIG. 21A or 21B, it was mentioned in the foregoing that simultaneous operations are impossible between holding predetermined charge on the capacitance element and flowing a predetermined current. Accordingly, a plurality of reference constant-current sources are preferably arranged as shown in FIG. 20B whereby one reference constant-current source is operated to hold predetermined charge onto the capacitance element while the other reference constant-current source is operated to flow a predetermined current. Namely, the reference constant-current sources 402, 403 of FIG. 20B preferably use the circuit of FIG. 21A or 21B.

In FIG. 23A, the circuit, having the switches 84-89, n-channel transistor 82 and capacitance element 83 for holding a gate-to-source voltage of the transistor during setting operation, corresponds to the reference constant-current source 402 or 403. The electric circuit of FIG. 23A is the circuit of FIG. 21A or 21B.

In FIG. 23B, the circuit, having the switches 94-97, transistors 92, 98 and capacitance element 93 for holding a gateto-source voltage of the transistor 92 during setting operation, corresponds to the reference constant-current source 402 or 403. The electric circuit of FIG. 23B is the circuit of FIG. 21C.

Incidentally, the operation of the electric circuit of FIG. 23A or 23B is similar to the operation of the electric circuit of FIG. 21A or 21B, and hence omittedly explained in this embodiment.

This embodiment can be desirably combined with Embodiment 1-5.

Embodiment 7

The electronic apparatus using the electric circuit of the invention includes a video camera, a digital camera, a goggle-type display (head-mount display), a navigation system, an audio reproducing apparatus (car audio unit, audio components, etc.), a notebook personal computer, a game apparatus, a personal digital assistant (mobile computer, cellular phone, portable game machine or electronic book), and an image reproducing apparatus having a recording medium (specifically, apparatus for reproducing a recording medium such as a Digital Versatile Disk (DVD) and having a display to display an image thereof). FIGS. 4A-4H show detailed examples of these electronic apparatus.

Figure 4A:
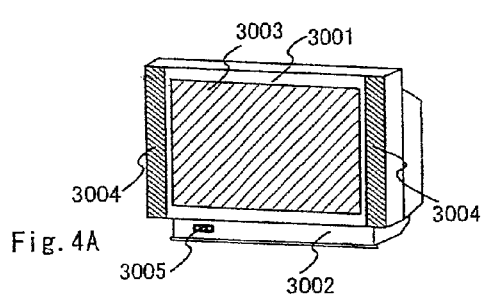
FIGS. 4A to 4H are figures of electronic apparatus to which the invention is to be applied.

FIG. 4A is a light-emitting apparatus including a housing 3001, a support base 3002, a display part 3003, a speaker part 3004 and a video-input terminal 3005. The present invention can be used in an electric circuit configuring the display part 3003. Also, the light-emitting apparatus of FIG. 4A can be completed by the invention. Because the light-emitting apparatus is of a spontaneous emission type, a backlight is not required. Thus, the display part can be made smaller in thickness than the liquid crystal display. Incidentally, the light-emitting apparatus includes a display unit for displaying all the pieces of information for personal computers, TV broadcast reception, displaying advertisement and so on.

Figure 4B:
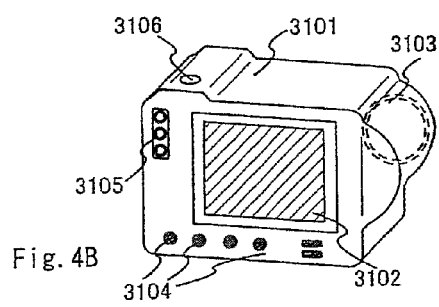

FIG. 4B is a digital still camera, including a main body 3101, a display part 3102, an image receiving part 3103, an operation key 3104, an external-connection port 3105 and a shutter 3106. The invention can be used in an electric circuit configuring the display part 3102. Also, the digital still camera of FIG. 4B is to be completed by the invention.

Figure 4C:
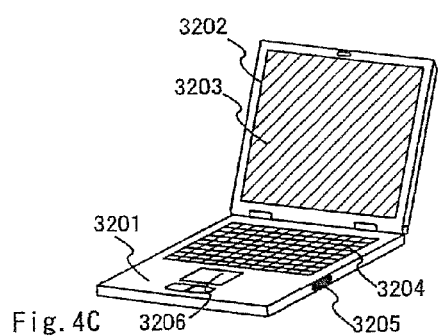

FIG. 4C is a notebook personal computer, including a main body 3201, a housing 3202, a display part 3203, a keyboard 3204, an external-connection port 3205 and a pointing mouse 3206. The invention can be used in an electric circuit configuring the display part 3203. Also, the light emitting device of FIG. 4C is to be completed by the invention.

Figure 4D:
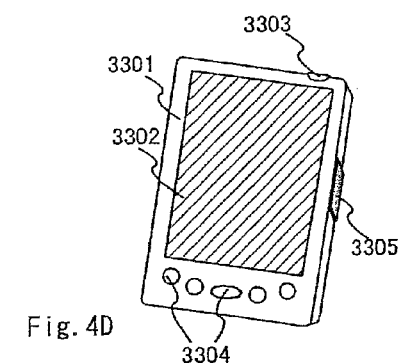

FIG. 4D is a mobile computer, including a main body 3301, a display part 3302, a switch 3303, an operation key 3304 and an infrared ray port 3305. The invention can be used in an electric circuit configuring the display part 3302. Also, the mobile computer of FIG. 4D is completed by the invention.

Figure 4E:
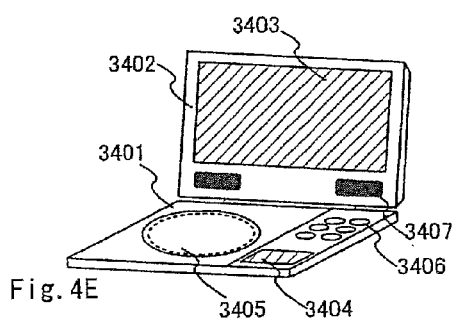

FIG. 4E is a portable image reproducing apparatus having a recording medium (specifically, DVD reproducing apparatus), including a main body 3401, a housing 3402, a display part-A 3403, a display part-B 3404, a recording-medium (DVD or the like) reading part 3405, an operation key 3406 and a speaker part 3407. The display part-A 3403 is to display, mainly, image information while the display part-B 3404 is to display, mainly, character information. The invention can be used in an electric circuit configuring the display parts A and B 3403, 3404. Incidentally, the image reproducing apparatus having a recording medium includes a home-use game apparatus. Also, the DVD reproducing apparatus of FIG. 4E is to be completed by the invention.

Figure 4F:
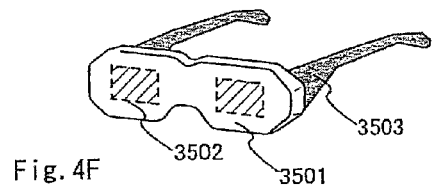

FIG. 4F is a goggle-type display (head-mount display), including a main body 3501, a display part 3502 and an arm part 3503. The invention can be used in an electric circuit configuring the display part 3502. Also, the goggle-type display of FIG. 4F is to be completed by the invention.

Figure 4G:
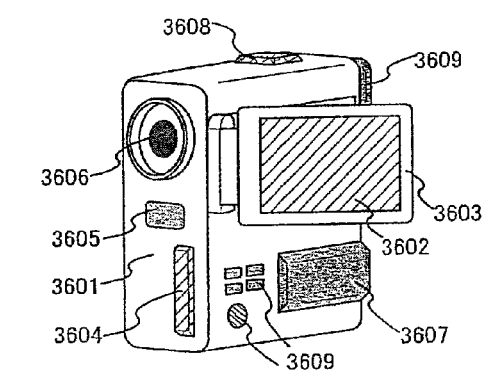

FIG. 4G is a video camera, including a main body 3601, a display part 3602, a housing 3603, an external-connection port 3604, a remote-control receiving part 3605, an image receiving part 3606, a battery 3607, a sound input part 3608, an operation key 3609, and eyepiece 3610. The invention can be used in an electric circuit configuring the display part 3602. Also, the video camera of FIG. 4G is to be completed by the invention.

Figure 4H:
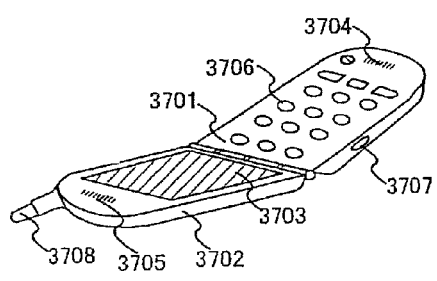
Figure 5A:
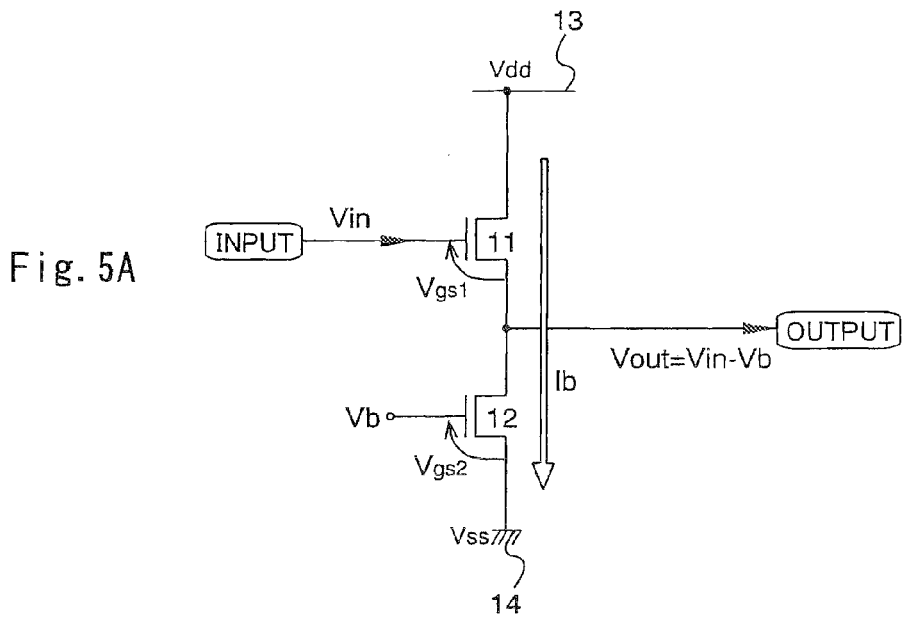
FIGS. 5A to 5C are diagrams explaining the operation of the source follower circuit.
Figure 5B:
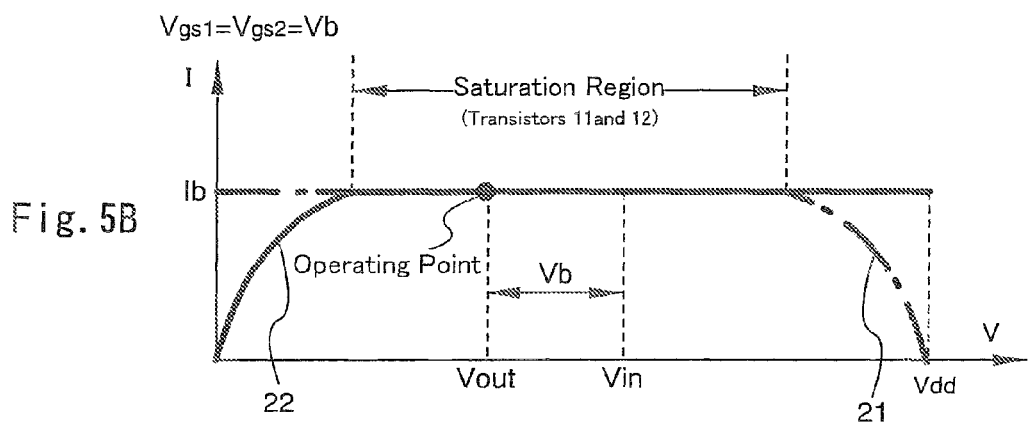
Figure 5C:
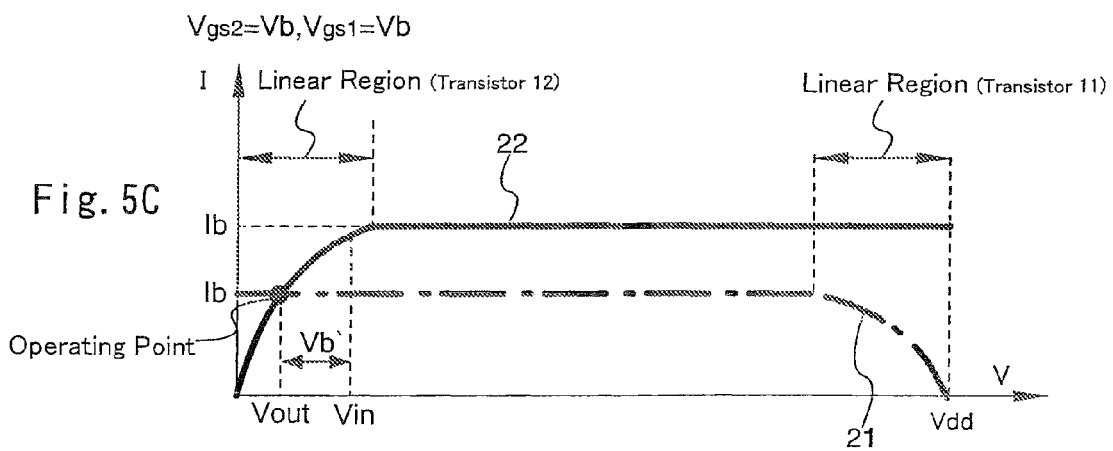
Figure 6A:
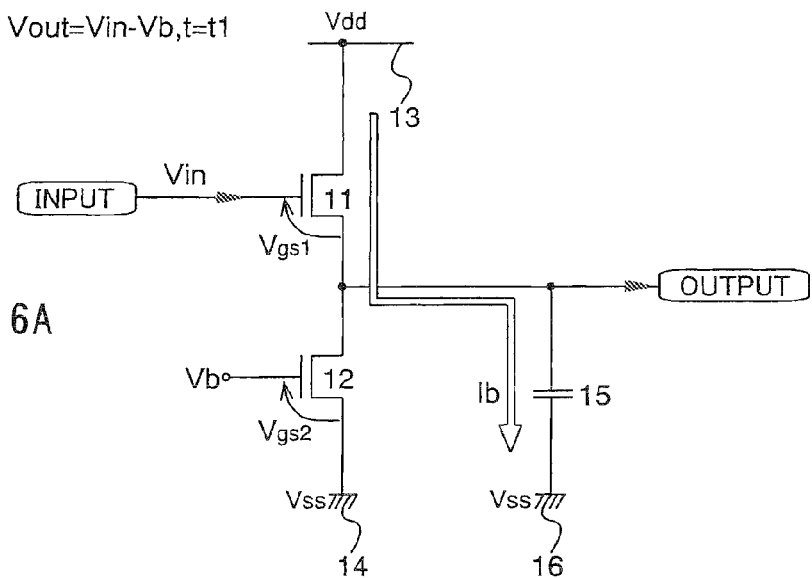
FIGS. 6A and 6B are diagrams explaining the operation of the source follower circuit.
Figure 6B:
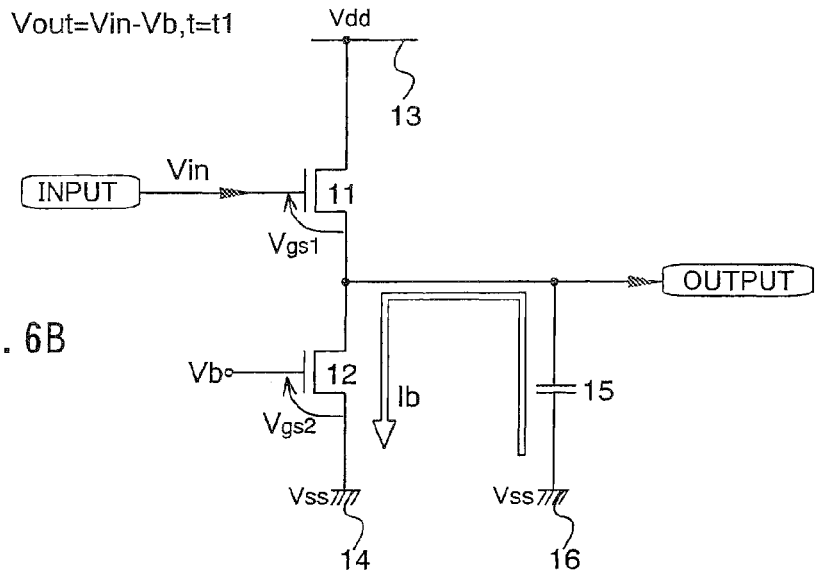

FIG. 4H is a cellular phone, including a main body 3701, a housing 3702, a display part 3703, a sound input part 3704, a sound output part 3705, an operation key 3706, an external-connection port 3707 and an antenna 3708. The invention can be used in an electric circuit configuring the display part 3703. Incidentally, the display part 3703 can suppress the cellular phone from consuming current by displaying white characters on a black background. Also, the cellular phone of FIG. 4H is to be completed by the invention.

Incidentally, if light-emitting material will increase light-emission brightness in the future, the light containing output image information can be used, by magnifying and projecting by a lens or the like, on a front or rear type projector.

Meanwhile, concerning the above electronic apparatuses, there are increasing cases to display the information distributed through an electronic communication line, such as the Internet or CATV (cable television). Particularly, there are increased occasions to display moving-image information. Because light-emitting material has a very high response speed, the light-emitting device is preferred for displaying moving images.

Meanwhile, it is desired for the light-emitting device to display information such that a light-emitting area is reduced to a possible less extent because the light-emitting area consumes power. Accordingly, in the case of using a light-emitting device in a display part, mainly for character information, of a personal digital assistant such as particularly a cellular phone or audio reproducing apparatus, it is desired to carry out driving such that character information is formed by a light-emitting part with non-emitting part provided as a background.

As described above, the present invention, having an extremely broad scope of application, can be used on an electronic apparatus in every field. Also, the electronic apparatus of the embodiment may use any configuration of the electric circuits and semiconductor devices shown in Embodiments 1-6.

In order to cause a particular transistor to flow a current same as a signal current set in the reference constant-current source, a gate-to-source voltage may be set of that transistor. In the invention, setting is possible by holding the gate-to-source voltage of the transistor due to a capacitance element connected to that transistor. By utilizing the voltage held on the capacitance element, it is possible to suppress against the affection of transistor characteristic variation.

The method of utilizing a voltage held on a capacitance element can use the method shown in the below. The voltage held on a capacitance element is held as it is, and a signal voltage (e.g. video signal voltage) is inputted to one terminal of the capacitance element. If doing so, the gate electrode of the transistor is inputted by a voltage that the voltage held on the capacitance element is added to the signal voltage. As a result, the gate electrode of the transistor is inputted by a value having the voltage held on the capacitance element added to the signal voltage. Namely, in the invention, even where characteristic variation occurs between transistors, the transistor a signal voltage is to be inputted is inputted by a value that a voltage held on each capacitance element each transistor is connected is added to the signal voltage. Accordingly, an electric circuit can be provided that is suppressed against the affection of the characteristic variation between transistors.

What is claimed is:

1. A semiconductor device comprising:
a pixel portion; and
a signal line drive circuit operationally connected to the pixel portion, the signal line drive circuit comprising:
a shift register;
a first latch circuit operationally connected to the shift register;
a second latch circuit operationally connected to the first latch circuit;
a D/A converter circuit operationally connected to the second latch circuit; and
a signal amplifier circuit operationally connected to the D/A converter circuit, the signal amplifier circuit comprising:
a first transistor;
a second transistor;
a first capacitor;
a second capacitor;
a first switch;
a second switch;
a third switch;
a fourth switch;
a fifth switch; and
a sixth switch,
wherein a gate of the first transistor is electrically connected to one terminal of the first capacitor and one terminal of the sixth switch,
wherein the other terminal of the first capacitor is electrically connected to one terminal of the first switch and one terminal of the second switch,
wherein the other terminal of the second switch is electrically connected to one of a source and a drain of the first transistor, one of a source and a drain of the second transistor, one terminal of the third switch, and one terminal of the fourth switch,
wherein the other of the source and the drain of the first transistor is electrically connected to one terminal of the fifth switch,
wherein the other terminal of the fourth switch is electrically connected to a gate of the second transistor and one terminal of the second capacitor,
wherein the other terminal of the second capacitor is electrically connected to the other of the source and the drain of the second transistor,
wherein the one of the source and the drain of the first transistor is electrically connected to a first line through the second transistor,
wherein the other of the source and the drain of the first transistor is electrically connected to a second line through the fifth switch, and
wherein the other terminal of the first switch is electrically connected to an input terminal,
wherein the other terminal of the third switch is electrically connected to an output terminal.

2. The semiconductor device according to claim 1,
wherein the other terminal of the sixth switch is electrically connected to the other of the source and the drain of the first transistor.

3. The semiconductor device according to claim 1, further comprising a seventh switch,
wherein one terminal of the seventh switch is electrically connected to the other of the source and the drain of the first transistor.

4. The semiconductor device according to claim 1, further comprising a third line electrically connected to the other of the source and the drain of the first transistor.

5. The semiconductor device according to claim 1, further comprising a current source electrically connected to the other of the source and the drain of the first transistor.

6. The semiconductor device according to claim 1, further comprising:
a seventh switch; and
a third line,
wherein one terminal of the seventh switch is electrically connected to the other of the source and the drain of the first transistor, and
wherein the other terminal of the seventh switch is electrically connected to the third line.

7. The semiconductor device according to claim 1, further comprising:
a seventh switch; and
a current source,
wherein one terminal of the seventh switch is electrically connected to the other of the source and the drain of the first transistor, and
wherein the other terminal of the seventh switch is electrically connected to the current source.

8. The semiconductor device according to claim 1, further comprising:
a current source; and
a third line,
wherein one terminal of the current source is electrically connected to the other of the source and the drain of the first transistor, and
wherein the other terminal of the current source is electrically connected to the third line.

9. The semiconductor device according to claim 1, further comprising:
a seventh switch;
a current source; and
a third line,
wherein one terminal of the seventh switch is electrically connected to the other of the source and the drain of the first transistor,
wherein the other terminal of the seventh switch is electrically connected to one terminal of the current source, and
wherein the other terminal of the current source is electrically connected to the third line.

10. An electronic apparatus using the semiconductor device according to claim 1.

11. A semiconductor device comprising:
a pixel portion; and
a signal line drive circuit operationally connected to the pixel portion, the signal line drive circuit comprising:
a shift register;
a first latch circuit operationally connected to the shift register;
a second latch circuit operationally connected to the first latch circuit;
a D/A converter circuit operationally connected to the second latch circuit; and
a signal amplifier circuit operationally connected to the D/A converter circuit, the signal amplifier circuit comprising:

a first thin film transistor;
a second thin film transistor;
a first capacitor;
a second capacitor;
a first switch;
a second switch;
a third switch;
a fourth switch;
a fifth switch; and
a sixth switch,
wherein a gate of the first thin film transistor is electrically connected to one terminal of the first capacitor and one terminal of the sixth switch,
wherein the other terminal of the first capacitor is electrically connected to one terminal of the first switch and one terminal of the second switch,
wherein the other terminal of the second switch is electrically connected to one of a source and a drain of the first thin film transistor, one of a source and a drain of the second thin film transistor, one terminal of the third switch, and one terminal of the fourth switch,
wherein the other of the source and the drain of the first thin film transistor is electrically connected to one terminal of the fifth switch,
wherein the other terminal of the fourth switch is electrically connected to a gate of the second thin film transistor and one terminal of the second capacitor,
wherein the other terminal of the second capacitor is electrically connected to the other of the source and the drain of the second thin film transistor,
wherein the one of the source and the drain of the first thin film transistor is electrically connected to a first line through the second thin film transistor,
wherein the other of the source and the drain of the first thin film transistor is electrically connected to a second line through the fifth switch,
wherein the other terminal of the first switch is electrically connected to an input terminal,
wherein the other terminal of the third switch is electrically connected to an output terminal, and
wherein the first switch, the second switch, the third switch, the fourth switch, the fifth switch, and the sixth switch are each a thin film transistor.

12. The semiconductor device according to claim 11, wherein the other terminal of the sixth switch is electrically connected to the other of the source and the drain of the first thin film transistor.

13. The semiconductor device according to claim 11, further comprising a seventh switch,
wherein one terminal of the seventh switch is electrically connected to the other of the source and the drain of the first thin film transistor, and
wherein the seventh switch is a thin film transistor.

14. The semiconductor device according to claim 11, further comprising a third line electrically connected to the other of the source and the drain of the first thin film transistor.

15. The semiconductor device according to claim 11, further comprising a current source electrically connected to the other of the source and the drain of the first thin film transistor.

16. The semiconductor device according to claim 11, further comprising:
a seventh switch; and
a third line,
wherein one terminal of the seventh switch is electrically connected to the other of the source and the drain of the first thin film transistor,
wherein the other terminal of the seventh switch is electrically connected to the third line, and
wherein the seventh switch is a thin film transistor.

17. The semiconductor device according to claim 11, further comprising:
a seventh switch; and
a current source,
wherein one terminal of the seventh switch is electrically connected to the other of the source and the drain of the first thin film transistor,
wherein the other terminal of the seventh switch is electrically connected to the current source, and
wherein the seventh switch is a thin film transistor.

18. The semiconductor device according to claim 11, further comprising:
a current source; and
a third line,
wherein one terminal of the current source is electrically connected to the other of the source and the drain of the first thin film transistor, and
wherein the other terminal of the current source is electrically connected to the third line.

19. The semiconductor device according to claim 11, further comprising:
a seventh switch;
a current source; and
a third line,
wherein one terminal of the seventh switch is electrically connected to the other of the source and the drain of the first thin film transistor,
wherein the other terminal of the seventh switch is electrically connected to one terminal of the current source,
wherein the other terminal of the current source is electrically connected to the third line, and
wherein the seventh switch is a thin film transistor.

20. An electronic apparatus using the semiconductor device according to claim 11.

* * * * *